(12) United States Patent
Kwon et al.

(10) Patent No.: US 10,366,653 B2
(45) Date of Patent: Jul. 30, 2019

(54) ORGANIC LIGHT-EMITTING DEVICE AND METHOD OF OPERATING THE SAME

(71) Applicants: SAMSUNG ELECTRONICS CO., LTD., Suwon-si, Gyeonggi-do (KR); UNIVERSITY OF UTAH RESEARCH FOUNDATION, Salt Lake City, UT (US)

(72) Inventors: Ohyun Kwon, Seoul (KR); Youngjae Park, Suwon-si (KR); Hyun Koo, Seongnam-si (KR); Byoungki Choi, Hwaseong-si (KR); Zeev Valentine Vardeny, Salt Lake City, UT (US); Chuang Zhang, Salt Lake City, UT (US); Dali Sun, Salt Lake City, UT (US); Zhiyong Pang, Salt Lake City, UT (US)

(73) Assignees: SAMSUNG ELECTRONICS CO., LTD., Gyeonggi-Do (KR); UNIVERSITY OF UTAH RESEARCH FOUNDATION, Salt Lake City, UT (US)

(*) Notice: Subject to any disclaimer, the term of this patent is extended or adjusted under 35 U.S.C. 154(b) by 294 days.

(21) Appl. No.: 15/450,505

(22) Filed: Mar. 6, 2017

(65) Prior Publication Data

US 2018/0114484 A1 Apr. 26, 2018

Related U.S. Application Data

(60) Provisional application No. 62/410,643, filed on Oct. 20, 2016.

(51) Int. Cl.
*G09G 5/00* (2006.01)
*G09G 3/3233* (2016.01)
(Continued)

(52) U.S. Cl.
CPC .......... *G09G 3/3233* (2013.01); *C09K 11/025* (2013.01); *C09K 11/06* (2013.01);
(Continued)

(58) Field of Classification Search
CPC ............. H01L 51/0038; H01L 51/5012; H01L 51/5092; H01L 51/52; H01L 51/5203;
(Continued)

(56) References Cited

U.S. PATENT DOCUMENTS

2008/0152952 A1* 6/2008 Santos .................. B82Y 25/00
428/811.1
2013/0299786 A1 11/2013 Shi et al.
(Continued)

FOREIGN PATENT DOCUMENTS

KR 10-2013-0000218 A 1/2013
KR 10-1647309 B1 8/2016
WO 2014-008429 A2 1/2014

OTHER PUBLICATIONS

Dail Sun et al. "Room-temperature magnetically modulated electroluminescence from hybrid organic/inorganic spintronics devices", Applied Physics Letter 103, 042411 (2013).
(Continued)

*Primary Examiner* — Insa Sadio
(74) *Attorney, Agent, or Firm* — Cantor Colburn LLP

(57) ABSTRACT

An organic light-emitting device including a magnetoresistive element including a first magnetic layer, a second magnetic layer, and a separation layer disposed between the first magnetic layer and the second magnetic layer, an organic light-emitting element electrically connected to the magnetoresistive element, wherein the organic light-emitting element comprises a first electrode, a second electrode, and an organic light-emission layer disposed between the first electrode and the second electrode, a magnetic field
(Continued)

applying unit configured to apply a magnetic field to at least the magnetoresistive element, and optionally, to the organic light-emitting element, a power source configured to supply a current between the magnetoresistive element and the organic light-emitting element, and a current source configured to apply a current between both terminals of the organic light-emitting element, wherein light-emission characteristics of the organic light-emitting device are changed depending on a direction and intensity of a current passing through the magnetoresistive element due to the power source and a direction and intensity of a current passing through the organic light-emitting element due to the power source and the current source.

22 Claims, 24 Drawing Sheets
(4 of 24 Drawing Sheet(s) Filed in Color)

(51) Int. Cl.
| | |
|---|---|
| *C09K 11/02* | (2006.01) |
| *C09K 11/06* | (2006.01) |
| *H01L 27/32* | (2006.01) |
| *H01L 43/08* | (2006.01) |
| *H01L 51/50* | (2006.01) |
| *H01L 51/56* | (2006.01) |
| *G09G 3/3208* | (2016.01) |
| *H01L 51/00* | (2006.01) |

(52) U.S. Cl.
CPC ....... *G09G 3/3208* (2013.01); *H01L 27/3225* (2013.01); *H01L 43/08* (2013.01); *H01L 51/5036* (2013.01); *H01L 51/5056* (2013.01); *H01L 51/5072* (2013.01); *H01L 51/56* (2013.01); *C09K 2211/1011* (2013.01); *C09K 2211/1051* (2013.01); *G09G 2320/0646* (2013.01); *G09G 2320/0666* (2013.01); *G09G 2330/021* (2013.01); *H01L 51/006* (2013.01); *H01L 51/008* (2013.01); *H01L 51/0054* (2013.01); *H01L 51/0056* (2013.01); *H01L 51/0058* (2013.01); *H01L 51/0059* (2013.01); *H01L 51/0067* (2013.01); *H01L 51/0071* (2013.01); *H01L 51/0072* (2013.01); *H01L 51/5012* (2013.01)

(58) Field of Classification Search
CPC . H01L 51/5206; H01L 51/5221; H01L 51/56; H01L 43/08; H01L 43/10; H01L 43/12; B82Y 10/00; B82Y 25/00; G01R 33/091; G11B 2005/3996; G11B 5/29; G11B 5/31; G11B 5/3906; G11C 11/16; H01F 10/005; H01F 10/1936; H01F 10/3213; H01F 10/3254; H01F 10/3268; H01F 10/3281; Y10T 428/1107
See application file for complete search history.

(56) References Cited

U.S. PATENT DOCUMENTS

2014/0368555 A1* 12/2014 Namkung ........... H01L 51/5221
 345/690
2015/0162557 A1 6/2015 Vardeny et al.

OTHER PUBLICATIONS

Zhiyong Pang et al. "Hybrid Spintronics Organic Light-Emitting Diodes Based on Exciplex Donor-Acceptor Chromophores; Interplay between Intrinsic and Extrinsic Magneto-electroluminescence", ACS Photon (date of publication is unknown).
Zhiyong Pang et al. "Manipulation of Emission Colors Based on Intrinsic and Extrinsic Magneto-Electroluminescence from Exciplex Organic Light-EmittingDiodes", ACS Photonics 2017, 4, 1899-1905.

* cited by examiner

ORGANIC LIGHT-EMITTING DEVICE AND METHOD OF OPERATING THE SAME

CROSS-REFERENCE TO RELATED APPLICATION

This application claims priority to U.S. Provisional Application No. 62/410,643, filed on Oct. 20, 2016, in the United States Patent and Trademark Office, and all the benefits accruing therefrom under 35 U.S.C. § 119, the content of which is incorporated herein in its entirety by reference.

BACKGROUND

1. Field

The present disclosure relates to light-emitting devices and methods of operating the same, and more particularly, to organic light-emitting devices and methods of operating the same.

2. Description of the Related Art

Organic light-emitting devices are self-emission devices that may produce full-color images, which also have wide viewing angles, high contrast ratios, short response times, and excellent driving voltage and brightness characteristics, compared to the devices in the art.

An example of such organic light-emitting devices may include an anode, a cathode, and an emission layer (organic material-containing emission layer) disposed between the anode and the cathode. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. Carriers, such as holes and electrons, may be recombined in the emission layer to produce excitons. These excitons may change their states from an excited state to a ground state, thereby generating light.

Various types of organic light emitting devices are known. However, there still remains a need in OLEDs having low driving voltage, high efficiency, high brightness, and long lifespan.

SUMMARY

Provided are organic light-emitting devices/apparatuses having a structure in which a magnetoresistive element is connected to an organic light-emitting element.

Provided are organic light-emitting devices/apparatuses having a structure in which a plurality of organic light-emitting elements are connected to one magnetoresistive element.

Provided are organic light-emitting devices/apparatuses capable of readily tuning light-emission characteristics.

Provided are organic light-emitting devices/apparatuses capable of changing a light-emission color depending on intensity of a magnetic field applied thereto.

Provided are methods of operating the organic light-emitting device/apparatuses.

Additional aspects will be set forth in part in the description which follows and, in part, will be apparent from the description, or may be learned by practice of the presented embodiments.

According to an aspect of an embodiment, an organic light-emitting device includes:

a magnetoresistive element including a first magnetic layer, a second magnetic layer, and a separation layer disposed between the first magnetic layer and the second magnetic layer;

an organic light-emitting element electrically connected to the magnetoresistive element, wherein the organic light-emitting element including a first electrode, a second electrode, and an organic light-emission layer disposed between the first electrode and the second electrode;

a magnetic field applying unit configured to apply a magnetic field to the magnetoresistive element, and optionally, to the organic light-emitting element;

a power source configured to supply a current between the magnetoresistive element and the organic light-emitting element; and a current source configured to apply a current between the first electrode and the second electrode of the organic light-emitting element, wherein light-emission characteristics of the organic light-emitting device are changed depending on a direction and intensity of a current passing through the magnetoresistive element due to the power source and a direction and intensity of a current passing through the organic light-emitting element due to the power source and the current source.

The magnetoresistive element may be a magnetic tunneling junction element.

The organic light-emitting element may be an exciplex-based organic light emitting diode element.

The organic light-emission layer may include a delayed fluorescence material.

The organic light-emission layer may include a host and a dopant, and an absolute value of a difference between a singlet ($S_1$) energy of the host and a triplet ($T_1$) energy of the host may be about 0.3 electron volts or less.

The host may include a hole transport compound and an electron transport compound.

The dopant may be a fluorescent dopant, and the singlet ($S_1$) energy of the dopant may be lower than the singlet ($S_1$) energy of the host.

The direction of the current passing through the magnetoresistive element and the direction of the current passing through the organic light-emitting element may have an in-phase relationship.

The direction of the current passing through the magnetoresistive element and the direction of the current passing through the organic light-emitting element may have an anti-phase relationship.

The organic light-emitting device may be configured to present light-emission characteristics by using both intrinsic magneto-electroluminescence generated in the organic light-emitting element by a magnetic field applied to the organic light-emitting element and extrinsic magneto-electroluminescence generated in the organic light-emitting element by a magnetic field applied to the magnetoresistive element.

According to an aspect of another embodiment, an organic light-emitting device includes:

a magnetoresistive element;

a first organic light-emitting element electrically connected to the magnetoresistive element, wherein the first organic light-emitting element includes a first organic light-emission layer;

a second organic light-emitting element electrically connected to the magnetoresistive element, wherein the second organic light-emitting element includes a second organic light-emission layer;

a magnetic field applying unit configured to apply a magnetic field to the magnetoresistive element, and optionally, to the first and second organic light-emitting elements; and a power source configured to supply a current between the magnetoresistive element and the first and second organic light-emitting elements.

The organic light-emitting device may further include at least one selected from a first current source configured to apply a current between both terminals of the first organic light-emitting element and a second current source configured to apply a current between both terminals of the second organic light-emitting element.

A direction of a current passing through one of the first and second organic light-emitting elements and a direction of a current passing through the magnetoresistive element may have an in-phase relationship, and a direction of a current passing through the other of the first and second organic light-emitting elements and the direction of the current passing through the magnetoresistive element may have an anti-phase relationship.

The organic light-emitting device may be configured to change a light-emission color depending on intensity of the magnetic field applied to the organic light-emitting device by the magnetic field applying unit.

At least one of the first and second organic light-emitting elements may be an exciplex-based OLED element.

At least one selected from the first and second organic light-emission layers may include a host and a dopant, and an absolute value of a difference between a singlet ($S_1$) energy of the host and a triplet ($T_1$) energy of the host may be about 0.3 electron volts or less.

The host may include a hole transport compound and an electron transport compound.

The dopant may be a fluorescent dopant, and the singlet ($S_1$) energy of the dopant may be lower than the singlet ($S_1$) energy of the host.

The first organic light-emission layer may include a first dopant, the second organic light-emission layer may include a second dopant different from the first dopant, and the first organic light-emission layer and the second organic light-emission layer may have different light-emission characteristics.

The magnetoresistive element may be a magnetic tunneling junction element.

The magnetoresistive element and the first and second organic light-emitting elements may constitute one unit device portion, and a plurality of unit device portions corresponding to the unit device portion may form an array.

According to an aspect of another embodiment, an organic light-emitting device includes:

a magnetoresistive element;

a first light-emitting element and a second organic light-emitting element, each of which is connected to the magnetoresistive element;

a magnetic field applying unit configured to apply a magnetic field to the magnetoresistive element, and optionally, to the first and second organic light-emitting elements;

a power source configured to apply electrical energy between the magnetoresistive element and the first and second organic light-emitting elements;

a first current source configured to apply a current to the first organic light-emitting element; and a second current source configured to apply a current to the second organic light-emitting element, wherein a light-emission color of the organic light-emitting device is changed depending on intensity of the magnetic field generated by the magnetic field applying unit.

BRIEF DESCRIPTION OF THE DRAWINGS

The present patent application contains at least one drawing executed in color. Copies of this patent application with color drawing(s) will be provided by the Office upon request and payment of the necessary fee.

These and/or other aspects will become apparent and more readily appreciated from the following description of the embodiments, taken in conjunction with the accompanying drawings in which.

DETAILED DESCRIPTION

Figure 1:
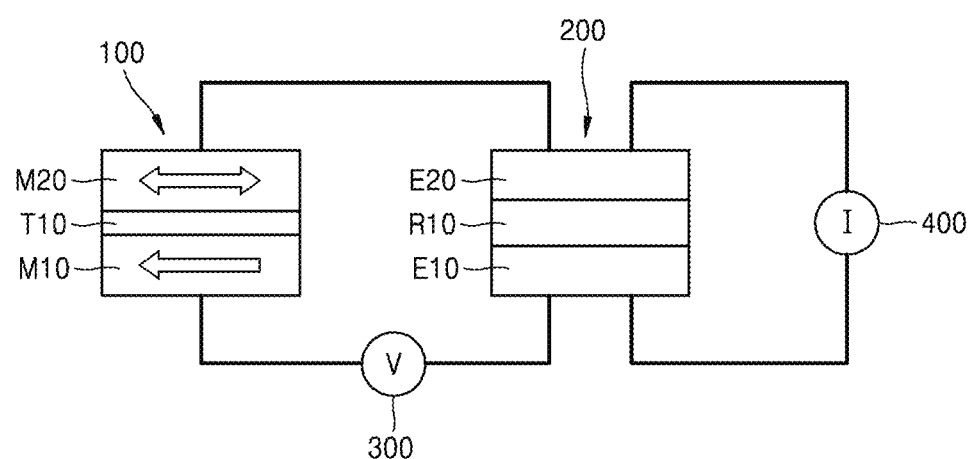
FIG. 1 is a schematic cross-sectional view of an organic light-emitting device according to an embodiment.

Various exemplary embodiments will now be described more fully with reference to the accompanying drawings in which exemplary embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region disposed between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Hereinafter, organic light-emitting devices and methods of operating the same according to embodiments will be described in detail with reference to the accompanying drawings. Widths and thicknesses of layers or regions illustrated in the drawings may be exaggerated for convenience of explanation. Throughout the descriptions, like reference numerals are used to refer to like elements.

FIG. 1 is a schematic cross-sectional view of an organic light-emitting device according to an embodiment.

Referring to FIG. 1, the organic light-emitting device according to the present embodiment may include a magnetoresistive element 100 and an organic light-emitting element 200 connected thereto. Also, the organic light-emitting device may further include a power source (or a power source unit) 300 configured to apply electrical energy between the magnetoresistive element 100 and the organic light-emitting element 200, and a current source 400 configured to apply a current to the organic light-emitting element 200. Although not illustrated, the organic light-emitting device may further include a magnetic field applying unit configured to apply a magnetic field to the magnetoresistive element 100, and optionally, to the organic light-emitting element 200.

The magnetoresistive element 100 may include a first magnetic layer M10, a second magnetic layer M20, and a separation layer T10 disposed between the first magnetic layer M10 and the second magnetic layer M20. The first magnetic layer M10 and the second magnetic layer M20 may each include a ferromagnetic material. The ferromagnetic material may include at least one selected from Co, Fe, and Ni and may further include other elements, for example, B, Cr, Pt, Pd, or the like. One of the first magnetic layer M10 and the second magnetic layer M2, for example, the first magnetic layer M10, may be a magnetization pinned layer, whose magnetization direction is pinned, and the other, for example, the second magnetic layer M20, may be a magnetization free layer, whose magnetization direction is changeable. In some embodiments, both the first magnetic layer M10 and the second magnetic layer M20 may be magnetization free layers. The separation layer T10 may include an insulating material. For example, the separation layer T10 may include insulating oxide, such as Mg oxide and Al oxide. A thickness of the separation layer T10 may be about 10 nanometers (nm) or less, for example, about 5 nm or less. The separation layer T10 may also be referred to as a tunnel layer or a barrier layer. The magnetoresistive element 100 may be a magnetic tunneling junction (MTJ) element. General structures and materials of the MTJ element may be applied to the magnetoresistive element 100. In the magnetoresistive element 100, when the magnetization direction of the first magnetic layer M10 is parallel to the magnetization direction of the second magnetic layer M20, the magnetoresistive element 100 has a low electric resistance. When the magnetization direction of the first magnetic layer M10 is anti-parallel to the magnetization direction of the second magnetic layer M20, the magnetoresistive element 100 has a high electric resistance. The magnetoresistive element 100 may be an inorganic-based element.

The organic light-emitting element 200 may be a type of organic light-emitting diode (OLED) element. The organic light-emitting element 200 may include a first electrode E10, a second electrode E20, and an organic material layer R10 disposed between the first electrode E10 and the second electrode E20. The organic material layer R10 may include an organic material having good light-emission characteristics. Therefore, it can be said that the organic material layer R10 includes an organic light-emission layer. The organic material layer R10 itself may be referred to as an organic light-emission layer. For example, the organic material layer R10 may be an exciplex-based light-emission layer (active layer). The organic material layer R10 may include a thermally activated delayed fluorescence (TADF) material. The organic material layer R10 will be described later in more detail.

The first electrode E10 may be a cathode. When the first electrode E10 is a cathode, the first electrode E10 may include a material with a relatively low work function to facilitate electron injection through the first electrode E10. The first electrode E10 may include a metal, an alloy, an electrically conductive compound, or a combination thereof. For example, the first electrode E10 may include at least one selected from Al, Ca, Li, Mg, Al—Li, Mg—In, and Mg—Ag. The first electrode E10 may have a single-layered structure or a multi-layered structure. The first electrode E10 may be a reflective electrode, a transflective electrode, or a transmissive electrode. For manufacturing a front-emission light-emitting device, the first electrode E10 may be formed by using a transparent electrode material, such as indium tin oxide (ITO) or indium zinc oxide (IZO).

The second electrode E20 may be an anode. When the second electrode E20 is an anode, the second electrode E20 may include a material with a relatively high work function to facilitate hole injection through the second electrode E20. The second electrode E20 may be a transmissive electrode. In this embodiment, the second electrode E20 may include at least one selected from ITO, IZO, Sn oxide, Zn oxide, and In oxide. However, in some embodiments, the second electrode E20 may be a reflective electrode or a transflective electrode. Therefore, the second electrode E20 may include various metals, alloys, electrically conductive compounds, or any combination thereof.

Electrons may be injected into the organic material layer R10 through the first electrode E10 and holes may be injected into the organic material layer R10 through the second electrode E20. Electrons and holes injected into the organic material layer R10 recombine to produce light in the organic material layer R10. When the first electrode E10 is a reflective electrode and the second electrode E20 is a transmissive (transparent) electrode, light produced from the organic material layer R10 may be emitted toward the second electrode E20. However, light may be emitted toward the first electrode E10 or toward both the first electrode E10 and the second electrode E20, depending on materials of the first and second electrodes E10 and E20. The organic light-emitting element 200 may be an organic-based element containing an organic material. Although not illustrated, the organic light-emitting device may further include an electron transport layer (ETL) disposed between the first electrode E10 and the organic material layer R10 and a hole transport layer (HTL) disposed between the second electrode E20 and the organic material layer R10. Also, the organic light-emitting device may further include an electron injection layer (EIL) disposed between the first electrode E10 and the organic material layer R10 and a hole injection layer (HIL) disposed between the second electrode E20 and the organic material layer R10. In some embodiments, the positions of the first electrode E10 and the second electrode E20 may be reversed.

The power source 300 may be connected between the magnetoresistive element 100 and the organic light-emitting element 200. The power source 300 may be, for example, a voltage source. A predetermined voltage may be applied between the magnetoresistive element 100 and the organic light-emitting element 200 through the power source 300. Due to the voltage, a current may flow between the magnetoresistive element 100 and the organic light-emitting element. The current source 400 may be connected between the first electrode E10 and the second electrode E20 of the organic light-emitting element 200. The current source 400 may apply a current between the first electrode E10 and the second electrode E20. Electrical energy may be applied to the magnetoresistive element 100 and the organic light-emitting element 200 by using the power source 300 and the current source 400 while (or after) a magnetic field is applied to the magnetoresistive element 100 or both the magnetoresistive element 100 and the organic light-emitting element 200 by using the magnetic field applying unit (not illustrated) described above.

Light-emission characteristics of the organic light-emitting device may be changed depending on a direction and intensity of a current passing through the magnetoresistive element 100 due to the power source 300 and a direction and intensity of a current passing through the organic light-emitting element 200 due to the power source 300 and the current source 400. Also, light-emission characteristics of the organic light-emitting device may be changed depending on a direction and intensity of a magnetic field generated by the magnetic field applying unit (not illustrated). This will be described in more detail with reference to FIGS. 7 to 12.

The organic light-emitting device according to the present embodiment is configured by connecting the magnetoresistive element 100 and the organic light-emitting element 200. In this respect, the organic light-emitting device may be referred to as a hybrid spintronic organic light-emitting device (HS-OLED). Also, the organic light-emitting element 200 may be an exciplex-based OLED element (XOLED element). In this embodiment, the organic light-emitting device according to the present embodiment may be referred to as a hybrid spintronic XOLED (HS-XOLED).

Hereinafter, materials of the organic material layer R10 included in the organic light-emitting element 200 of FIG. 1 will be described in more detail.

The organic material layer R10 may include a light-emission layer (i.e., light-emitting layer). The light-emission layer (hereinafter, referred to as an emission layer) may include a host and a dopant. In the emission layer, an amount of the host may be greater than that of the dopant.

An absolute value of a difference between the singlet ($S_1$) energy of the host and the triplet ($T_1$) energy of the host is 0.3 electron volts (eV) or less, for example, 0.2 eV or less. In some embodiments, the absolute value of a difference between the singlet ($S_1$) energy of the host and the triplet ($T_1$) energy of the host may be 0.1 eV or less. While not wishing to be bound by theory, it is understood that within these conditions, up-conversion from a triplet state to a singlet state may effectively occur, thereby enabling emission of high efficiency-delayed fluorescence. Accordingly, the host may be a material that is capable of emitting delayed fluorescence. In this regard, the emission layer may include a thermally activated delayed fluorescence (TADF) material.

The host may include a combination of a hole transport compound and an electron transport compound (for example, a mixture consisting of a hole transport compound and one or more electron transport compounds), or may consist of a single compound. Here, the hole transport compound may be referred to as a donor (electron donor), and the electron transport compound may be referred to as an acceptor (electron acceptor).

When the host includes a mixture of a hole transport compound and an electron transport compound, the hole transport compound and the electron transport compound may form an exciplex. The exciplex is an excited state complex formed between the hole transport compound and the electron transport compound.

In some embodiments, an absolute value of a difference between the singlet ($S_1$) energy of the exciplex and triplet ($T_1$) energy of the exciplex may be 0.3 eV or less, for example, 0.2 eV or less. In some embodiments, the absolute value of a difference between the singlet ($S_1$) energy of the exciplex and the triplet ($T_1$) energy of the exciplex may be 0.1 eV or less. While not wishing to be bound by theory, it is understood that within these conditions, up-conversion from a triplet state to a singlet state may effectively occur, thereby enabling emission of high efficiency-delayed fluorescence. Accordingly, the exciplex may be a material that is capable of emitting delayed fluorescence.

The hole transport compound may be a compound represented by at least one of Formulae 1 to 5:

Formula 1
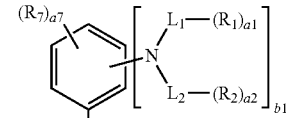

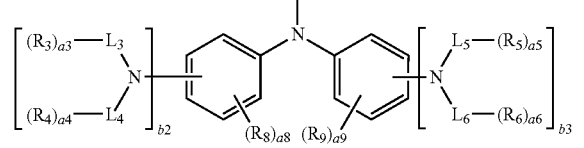

Formula 2
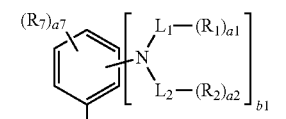

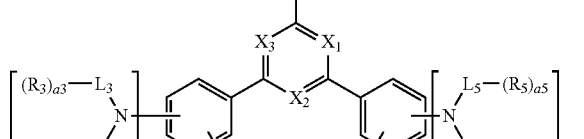

Formula 3
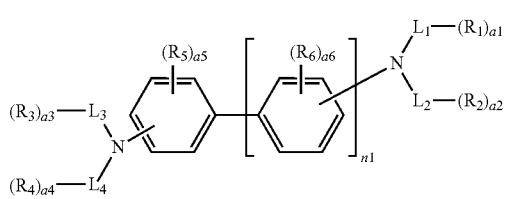

Formula 4

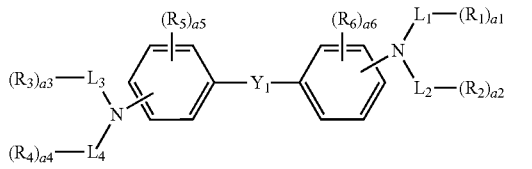

Formula 5

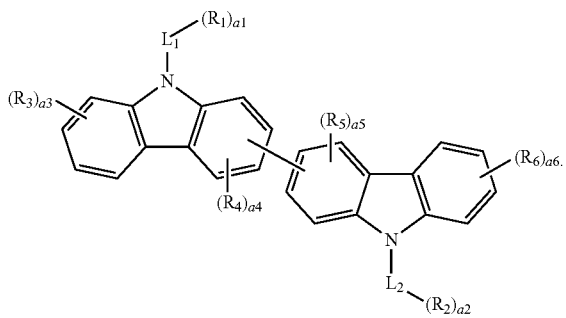

In Formulae 1 to 5, $L_1$ to $L_6$ and $Y_1$ may each independently be a substituted or unsubstituted $C_5$-$C_{60}$ carbocyclic group, $X_1$ may be N or $C(R_{21})$, $X_2$ may be N or $C(R_{22})$, $X_3$ may be N or $C(R_{23})$, and at least one of $X_1$ to $X_3$ may be N, $R_1$ to $R_9$ and $R_{21}$ to $R_{23}$ may each independently be selected from hydrogen, deuterium, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, and —$N(Q_1)(Q_2)$, wherein $Q_1$ and $Q_2$ may each independently be selected from hydrogen, deuterium, a substituted or unsubstituted $C_1$-$C_{60}$ alkyl group, a substituted or unsubstituted $C_1$-$C_{60}$ alkoxy group, and a substituted or unsubstituted $C_6$-$C_{60}$ aryl group, and $R_1$ and $R_2$ may optionally be chemically linked, i.e., bind to each other and form a saturated or unsaturated ring, $R_3$ and $R_4$ may optionally bind to each other and form a saturated or unsaturated ring, and $R_5$ and $R_6$ may optionally bind to each other and form a saturated or unsaturated ring.

a1 to a9 may each independently be an integer of 0 to 5, b1 to b3 may each independently be 1 or 2, and n1 may be 0 or 1.

In some embodiments, $L_1$ to $L_6$ and $Y_1$ may each independently be selected from:

a cyclopentane group, a cyclohexane group, a cyclohexene group, a benzene group, a naphthalene group, an anthracene group, and a fluorene group; and a cyclopentane group, a cyclohexane group, a cyclohexene group, a benzene group, a naphthalene group, an anthracene group, and a fluorene group, each substituted with at least one substituent independently selected from deuterium, a $C_1$-$C_{10}$ alkyl group, a $C_1$-$C_{10}$ alkoxy group, and a phenyl group.

In some embodiments, in Formula 2, $X_1$ to $X_3$ may all be N, or $X_1$ may be $C(R_{21})$, and $X_2$ and $X_3$ may be N, but embodiments are not limited thereto.

In some embodiments, $R_1$ to $R_9$ and $R_{21}$ to $R_{23}$ may each independently be selected from hydrogen, deuterium, a $C_1$-$C_{10}$ alkyl group, a $C_1$-$C_{10}$ alkoxy group, a phenyl group, and —$N(Q_1)(Q_2)$, wherein $Q_1$ and $Q_2$ may each independently be selected from hydrogen, deuterium, a $C_1$-$C_{10}$ alkyl group, a $C_1$-$C_{10}$ alkoxy group, and a phenyl group.

In some embodiments, a1 to a9 may each independently be 0, 1, or 2.

For example, the hole transport compound may be at least one of TCTA, CBP, NPB, MeO-TPD, or Compounds 1 to 32, but is not limited thereto:

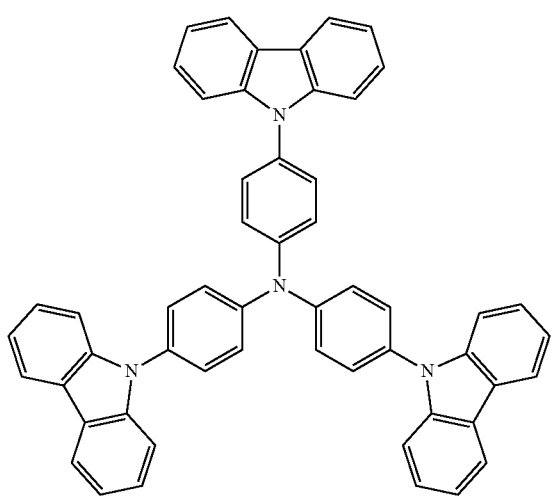

TCTA

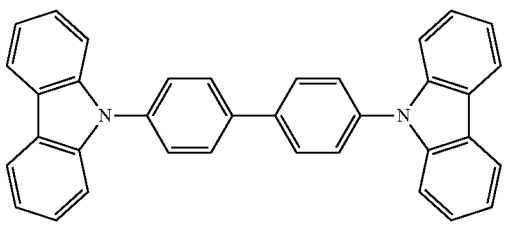

CBP

-continued
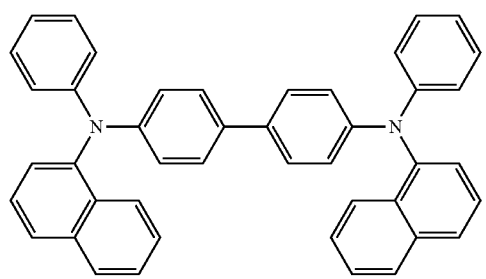
NPB
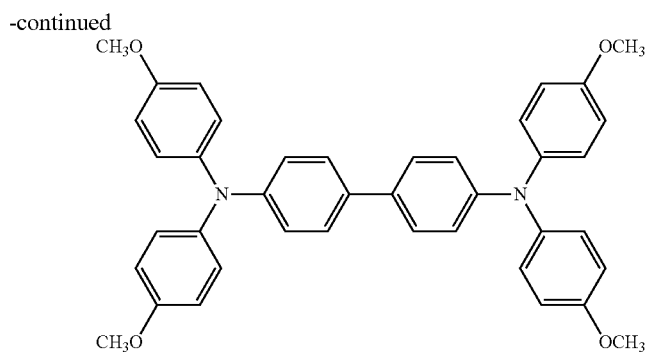
MeO-TPD
1
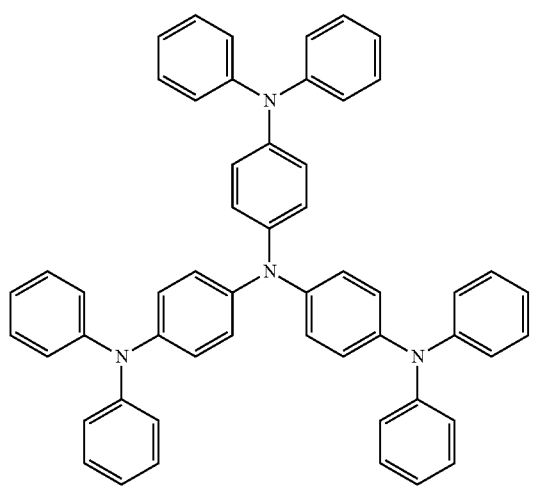
2
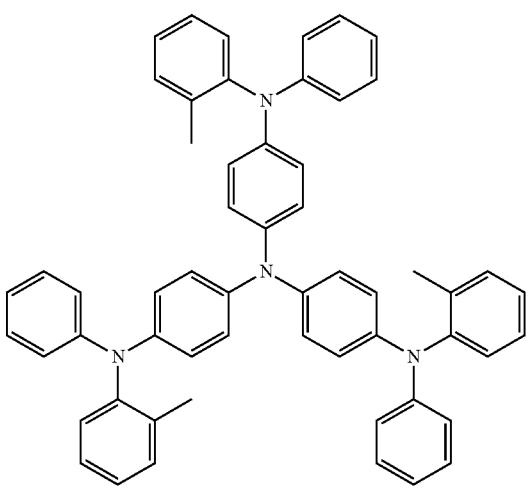
3
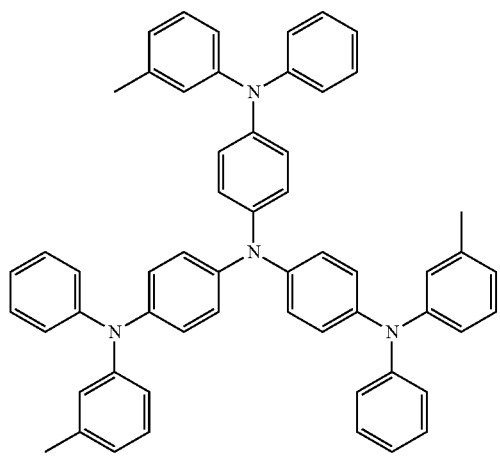
4
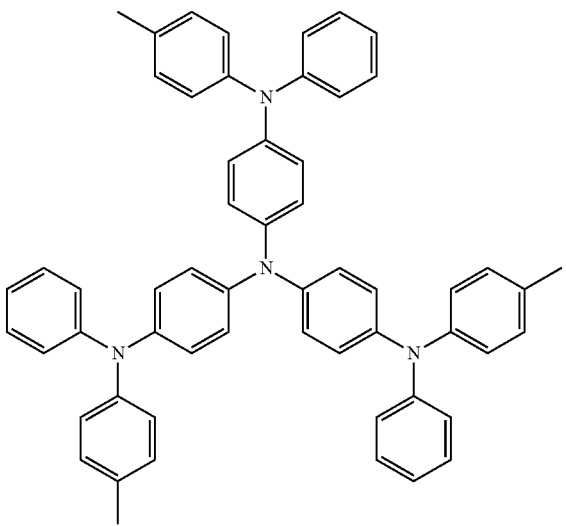

-continued
5
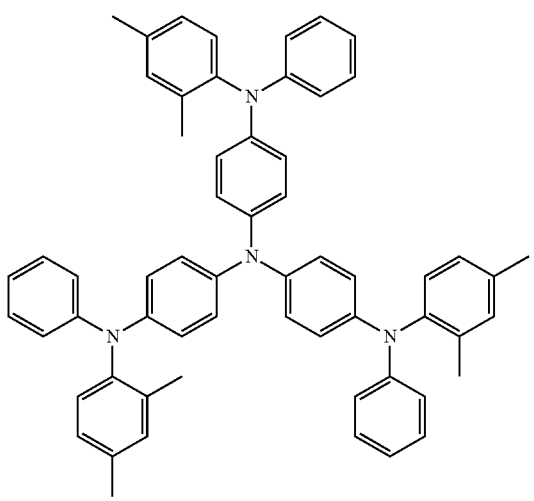
6
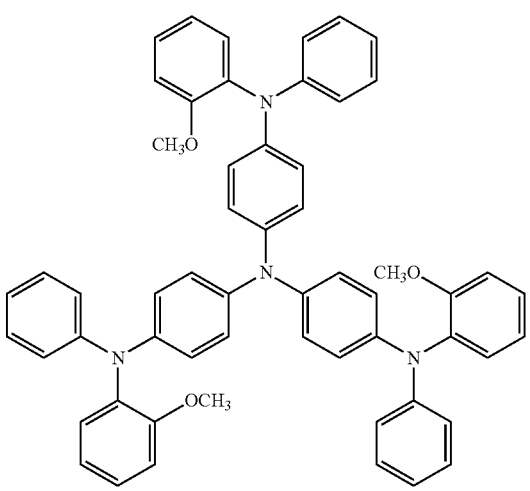
7
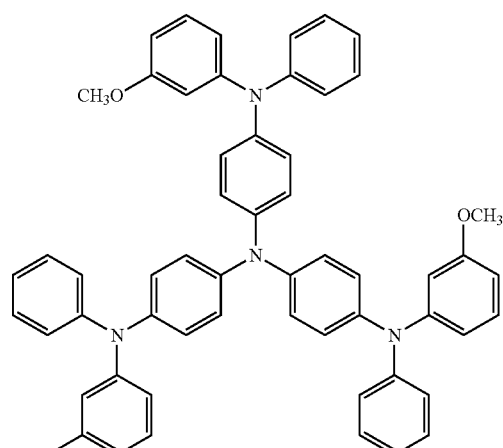
8
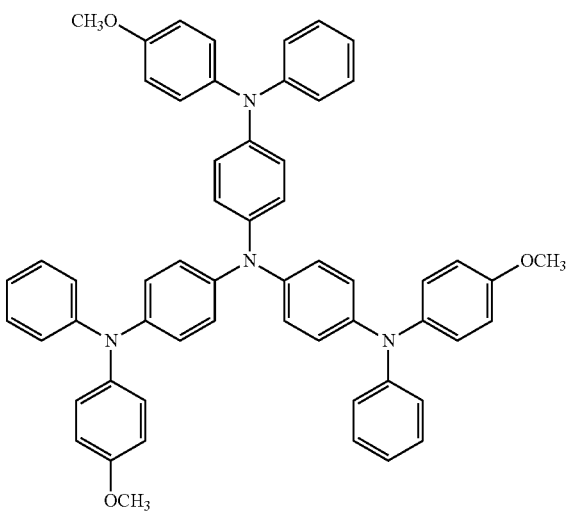
9
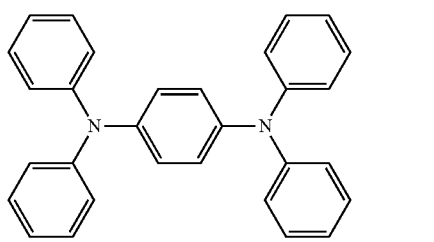
10
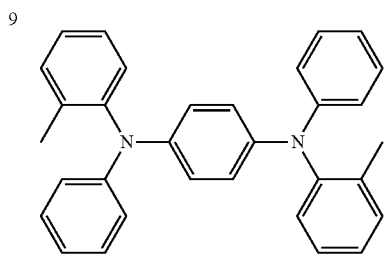
11
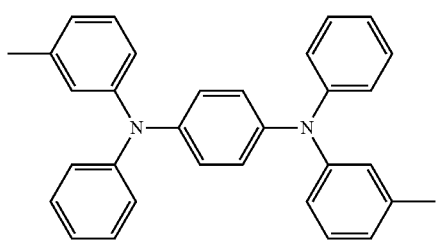
12
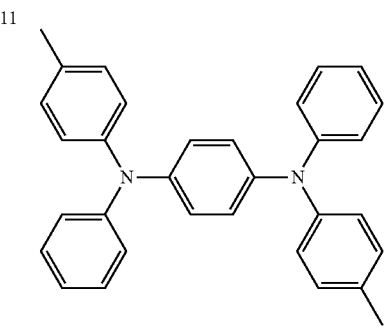

-continued
13
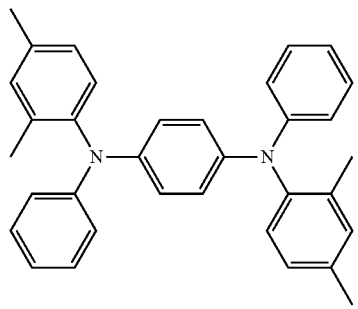
14
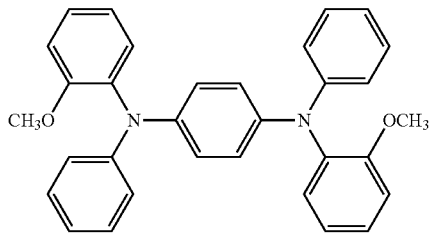
15
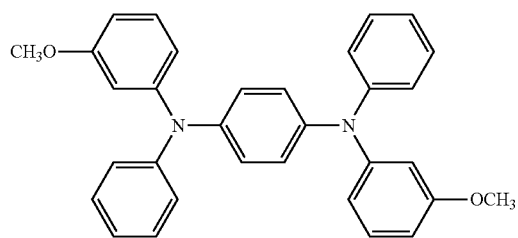
16
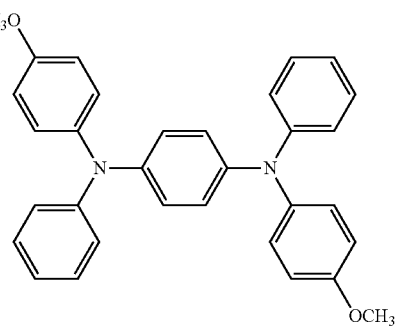
17
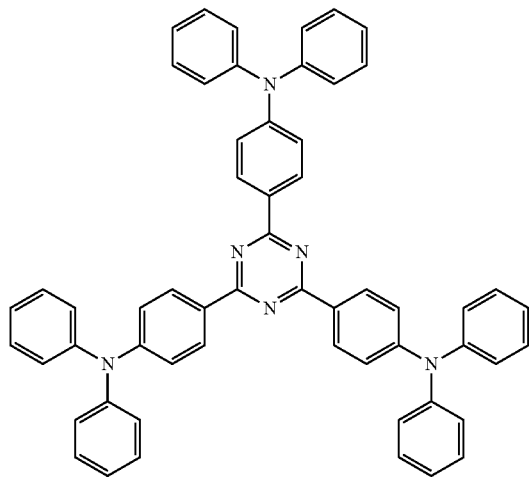
18
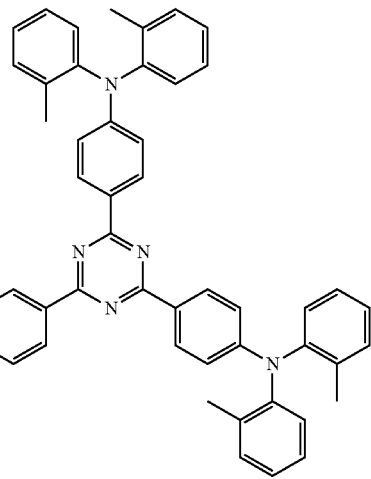
19
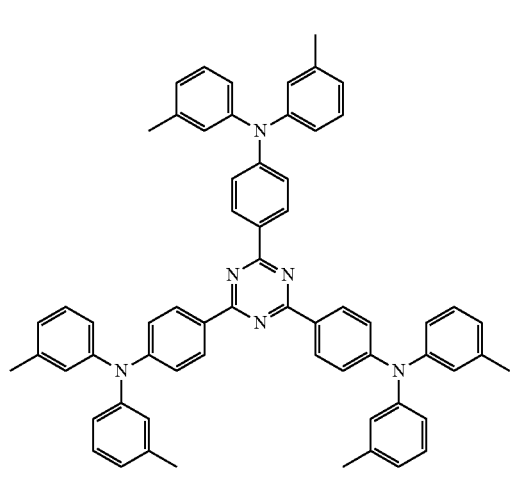
20
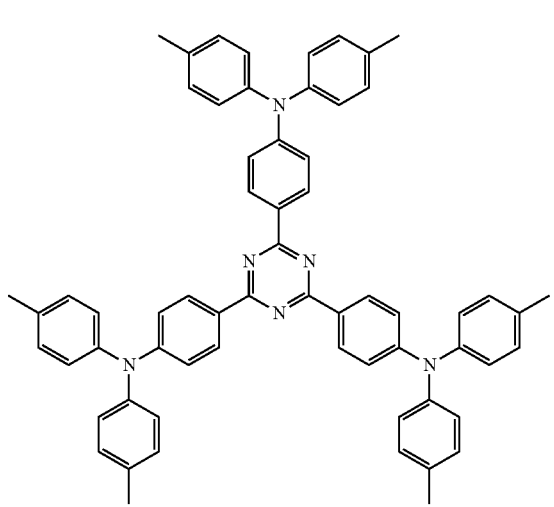

-continued
21
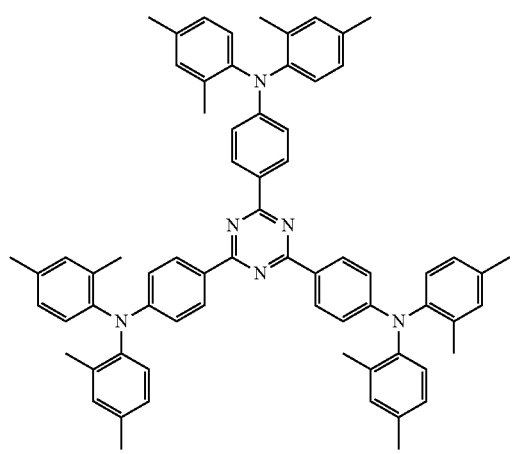
22
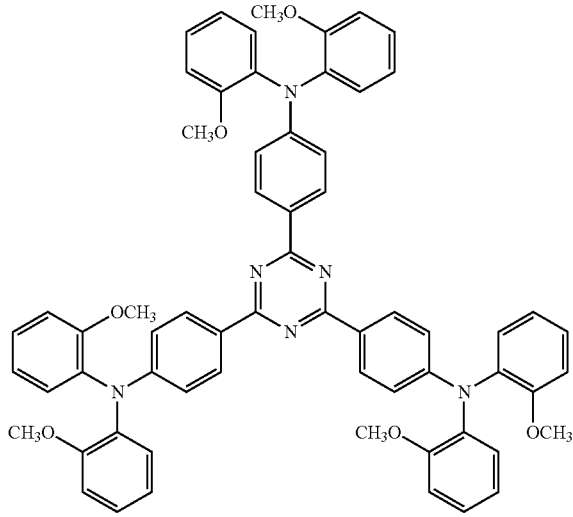
23
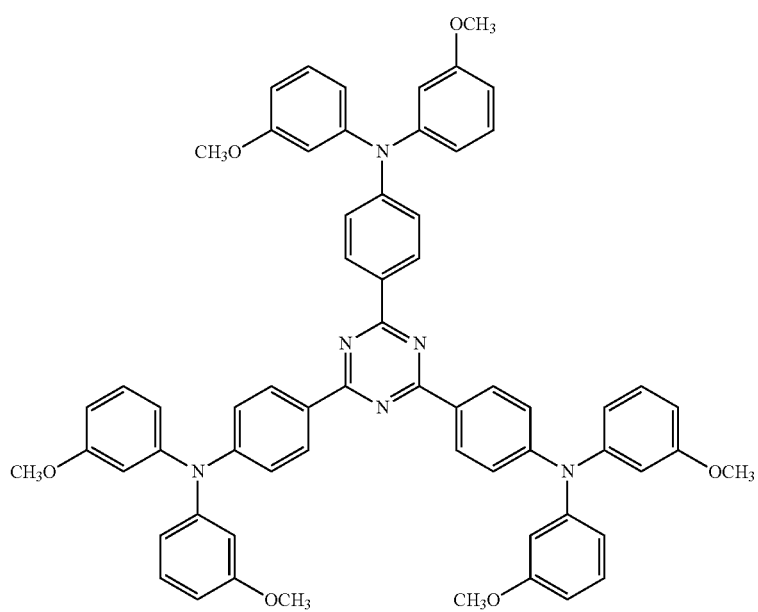

-continued
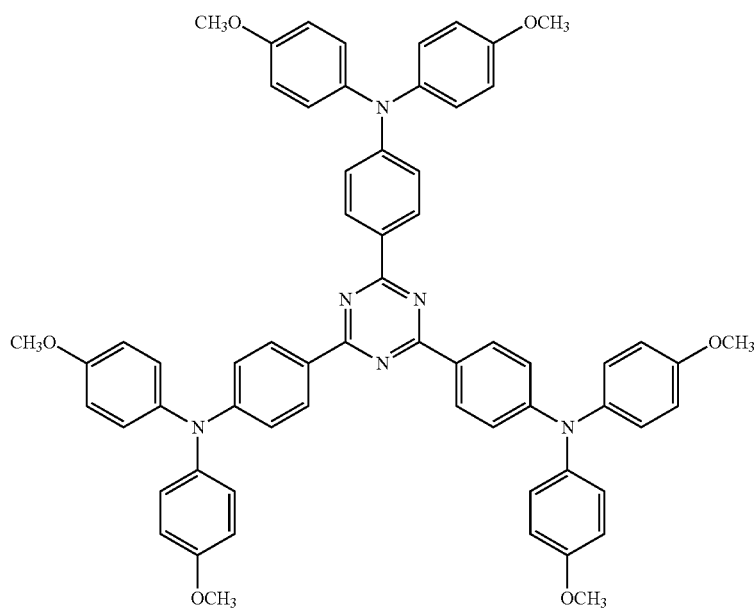
24
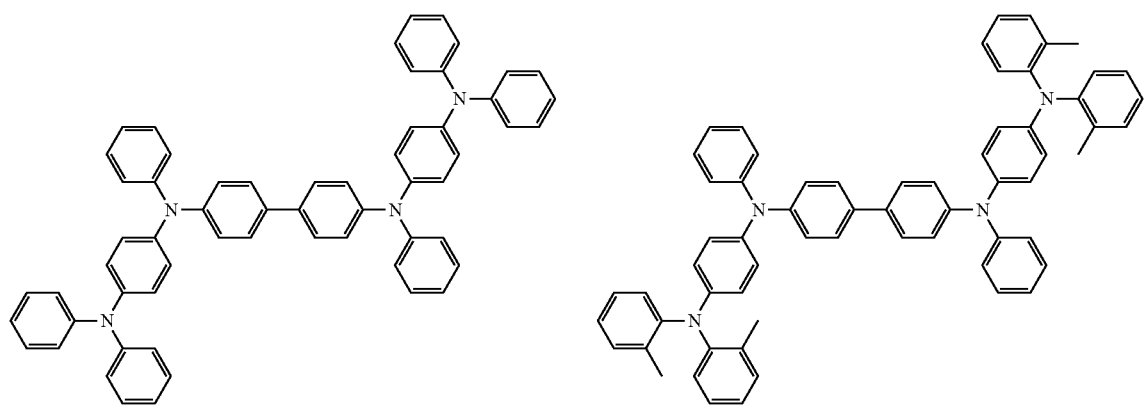
25    26
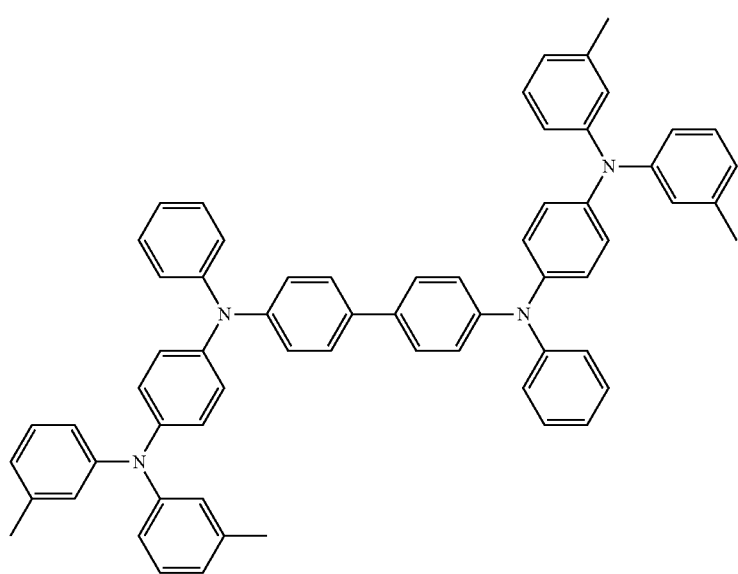
27

-continued
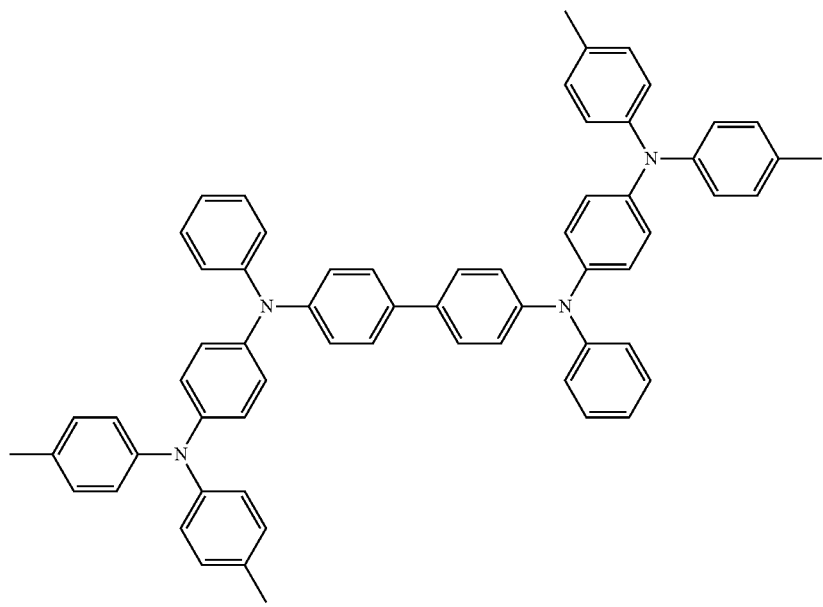
28
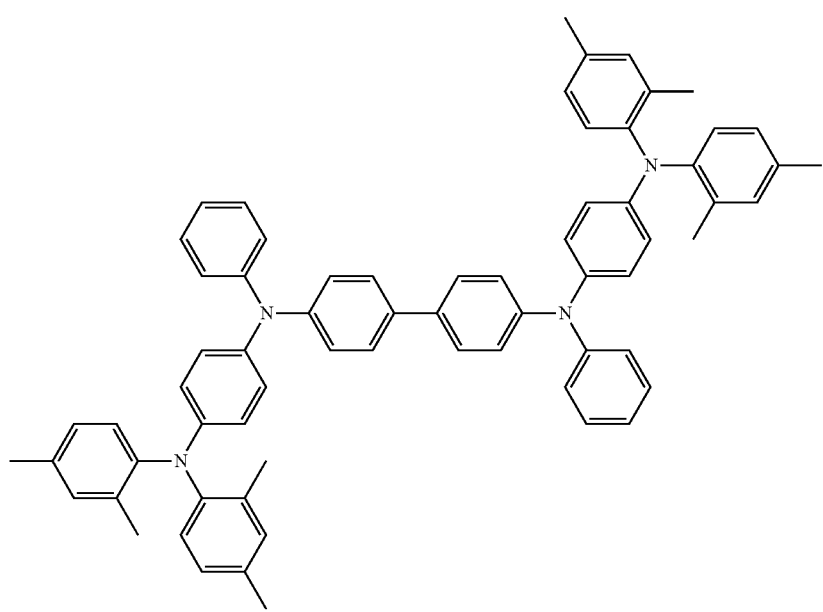
29

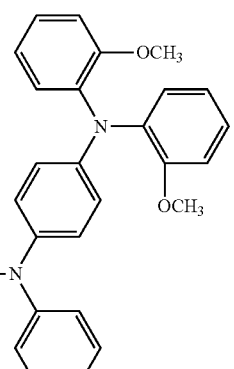
30
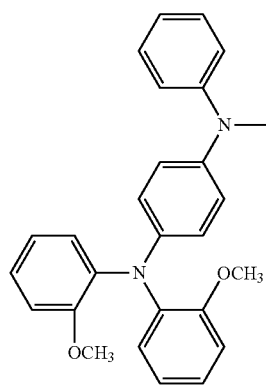
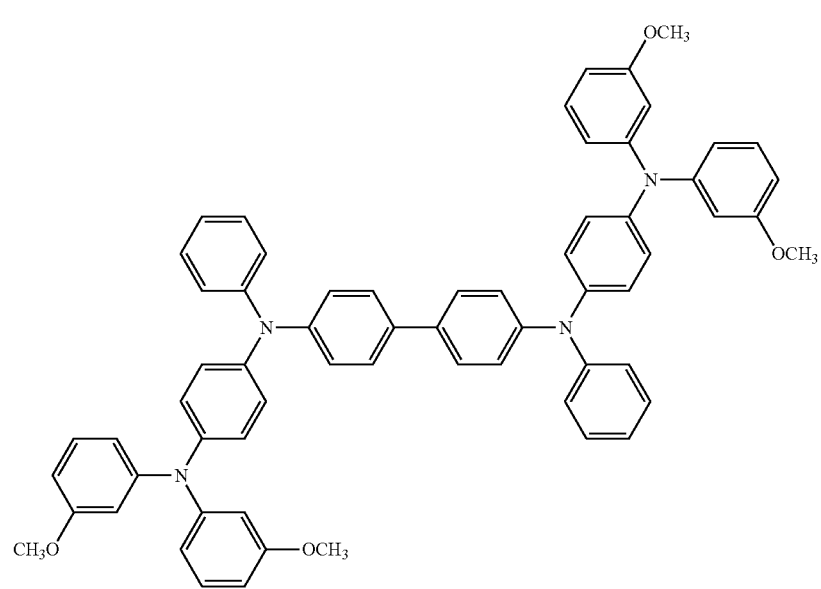
31

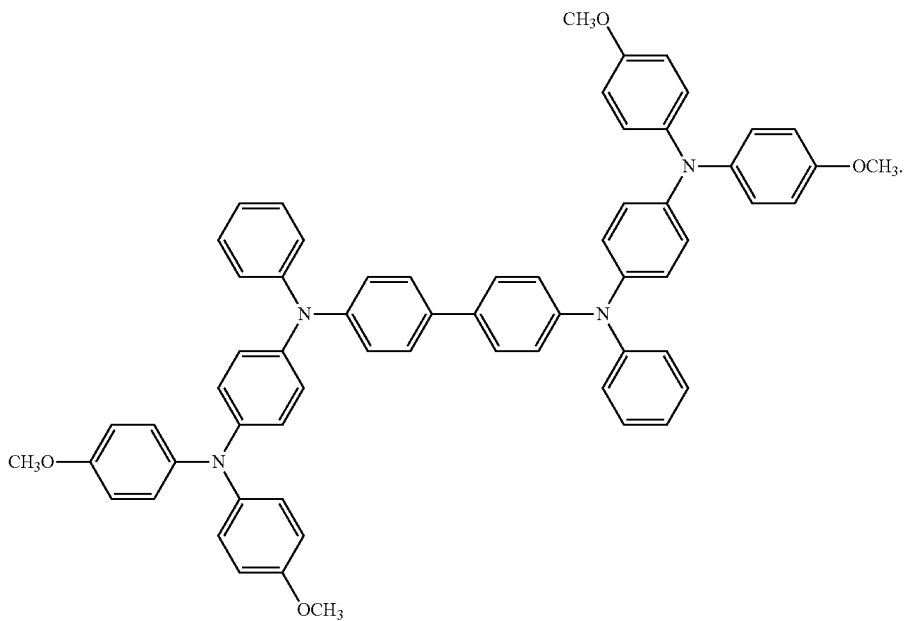

The electron transport compound may be a compound represented by one of Formulae 11 to 15:

Formula 11

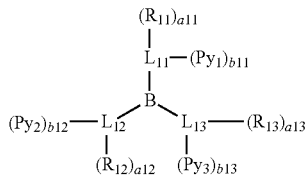

Formula 12

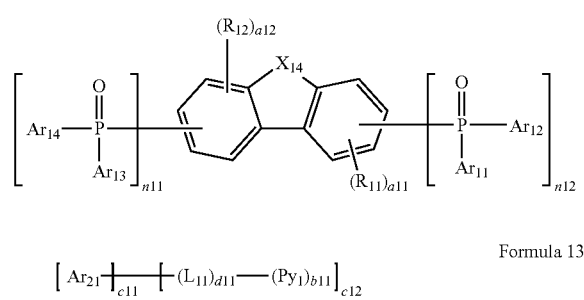

Formula 13

$$[Ar_{21}]_{c11}[(L_{11})_{d11}—(Py_1)_{b11}]_{c12}$$

Formula 14

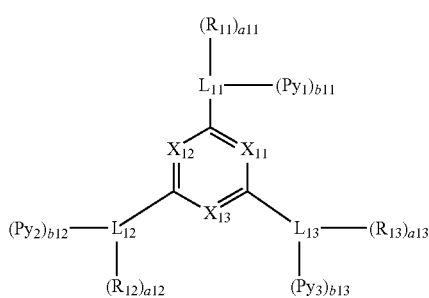

Formula 15

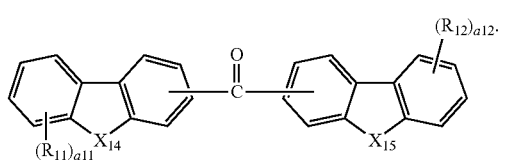

In Formulae 11 to 15, $L_{11}$ to $L_{13}$ and $Ar_{21}$ may each independently be a substituted or unsubstituted $C_5$-$C_{60}$ carbocyclic group or a $C_1$-$C_{60}$ heterocyclic group, c11 may be an integer of 1 to 3, and when c11 is 2 or more, two or more groups $Ar_{21}$ may be condensed, i.e., fused with each other or may bind to each other via a single bond, d11 may be 0, 1, or 2, $X_{11}$ may be N or $C(R_{31})$, $X_{12}$ may be N or $C(R_{32})$, $X_{13}$ may be N or $C(R_{33})$, and at least one of $X_{11}$ to $X_{13}$ may be N, $X_{14}$ may be S, S(=O)$_2$, or $C(R_{34})(R_{35})$, $X_{15}$ may be S, S(=O)$_2$, or $C(R_{36})(R_{37})$, $R_{11}$ to $R_{13}$ and $R_{31}$ to $R_{33}$ may each independently be selected from hydrogen, deuterium, a substituted or unsubstituted $C_1$-$C_{60}$ alkyl group, a substituted or unsubstituted $C_1$-$C_{60}$ alkoxy group, and a substituted or unsubstituted $C_6$-$C_{60}$ aryl group, $R_{34}$ to $R_{37}$ may each independently be selected from a substituted or unsubstituted $C_1$-$C_{60}$ alkyl group and a substituted or unsubstituted $C_6$-$C_{60}$ aryl group, $R_{34}$ and $R_{35}$ may optionally bind to each other and form a saturated or unsaturated ring, and $R_{36}$ and $R_{37}$ may optionally bind to each other and form a saturated or unsaturated ring, a11 to a13 may each independently be an integer of 0 to 5, $Py_1$ to $Py_3$ may each independently be selected from:

a pyridinyl group, a pyrimidinyl group, a pyrazinyl group, a pyridazinyl group, a triazinyl group, a benzoimidazolyl group, a quinolinyl group, an isoquinolinyl group, a quinazolinyl group, a quinoxalinyl group, an imidazopyridinyl group, and an imidazopyrimidinyl group; and a pyridinyl group, a pyrimidinyl group, a pyrazinyl group, a pyridazinyl group, a triazinyl group, a benzoimidazolyl group, a quinolinyl group, an isoquinolinyl group, a quinazolinyl group, a quinoxalinyl group, an imidazopyridinyl group, and an imidazopyrimidinyl group, each substituted with at least one substituent independently selected from deuterium, a $C_1$-$C_{10}$ alkyl group, a $C_1$-$C_{10}$ alkoxy group, a phenyl group, a biphenyl group, and a terphenyl group, b11 may be 1, 2, or 3, b12 and b13 may each independently be 0, 1, 2, or 3, $Ar_{11}$ to $Ar_{14}$ may each independently be selected from a substituted or unsubstituted $C_6$-$C_{60}$ aryl group, n11 and n12 may each independently be 0, 1, 2, or 3, and the sum of n11 and n12 may be 1 or greater, and c12 may be an integer of 1 to 6.

In some embodiments, $L_{11}$ to $L_{13}$ and $Ar_{21}$ may each independently be selected from:

a cyclopentane group, a cyclopentadiene group, a benzene group, a naphthalene group, an anthracene group, an indene group, a fluorene group, a phenanthrene group, a pyridine group, a pyrimidine group, a pyrazine group, a pyridazine group, a triazine group, a benzoimidazole group, a quinoline group, an isoquinoline group, a quinazoline group, a quinoxaline group, an imidazopyridine group, and an imidazopyrimidine group; and a cyclopentane group, a cyclopentadiene group, a benzene group, a naphthalene group, an anthracene group, an indene group, a fluorene group, a phenanthrene group, a pyridine group, a pyrimidine group, a pyrazine group, a pyridazine group, a triazine group, a benzoimidazole group, a quinoline group, an isoquinoline group, a quinazoline group, a quinoxaline group, an imidazopyridine group, and an imidazopyrimidine group, each substituted with at least one substituent independently selected from deuterium, a $C_1$-$C_{10}$ alkyl group, a $C_1$-$C_{10}$ alkoxy group, and a phenyl group.

In some embodiments, $X_{11}$ to $X_{13}$ in Formula 14 may all be N.

In some embodiments, $R_{11}$ to $R_{13}$ and $R_{31}$ to $R_{33}$ may each independently be selected from hydrogen, deuterium, a $C_1$-$C_{10}$ alkyl group, and a $C_1$-$C_{10}$ alkoxy group.

In some embodiments, $R_{34}$ to $R_{37}$ may each independently be selected from:

a phenyl group and a naphthyl group; and a phenyl group and a naphthyl group, each substituted with at least one selected from deuterium, a $C_1$-$C_{10}$ alkyl group, and a $C_1$-$C_{10}$ alkoxy group, $R_{34}$ and $R_{35}$ may bind to each other via a single bond, and $R_{36}$ and $R_{37}$ may bind to each other via a single bond.

In some embodiments, a11 to a13 may each independently be 0, 1, or 2.

In some embodiments, $Py_1$ to $Py_3$ may each independently be selected from:

a pyridinyl group, a pyrimidinyl group, a triazinyl group, and a benzoimidazolyl group; and a pyridinyl group, a pyrimidinyl group, a triazinyl group, and a benzoimidazolyl group, each substituted with at least one substituent independently selected from deuterium, a $C_1$-$C_{10}$ alkyl group, a $C_1$-$C_{10}$ alkoxy group, a phenyl group, a biphenyl group, and a terphenyl group.

In some embodiments, b11 may be 1 or 2, and b12 and b13 may each independently be 0, 1, or 2.

In some embodiments, $Ar_{11}$ to $Ar_{14}$ may each independently be selected from:

a phenyl group, a naphthyl group, an anthracenyl group, and a fluorenyl group; and a phenyl group, a naphthyl group, an anthracenyl group, and a fluorenyl group, each substituted with at least one substituent independently selected from deuterium, a $C_1$-$C_{10}$ alkyl group, and a $C_1$-$C_{10}$ alkoxy group.

In some embodiments, in Formula 12, n11 may be 0 or 1, and n12 may be 1.

In some embodiments, in Formula 13, c11 may be 1, and c12 may be 1, 2, or 3.

For example, the electron transport compound may be at least one of B3PYMPM, TPBi, 3TPYMB, BmPyPB, BSFM, or any one of Compounds 101 to 120, but is not limited thereto:

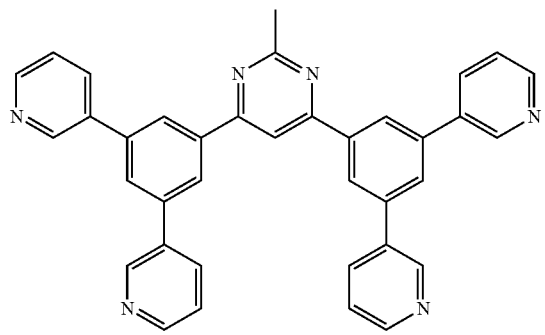

B3PYMPM

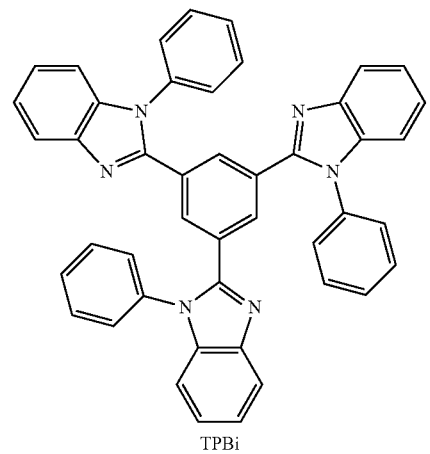

TPBi

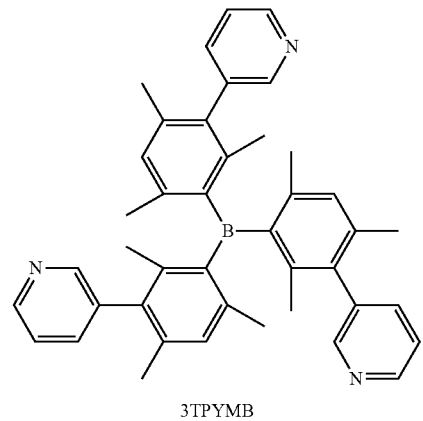

3TPYMB

31
-continued
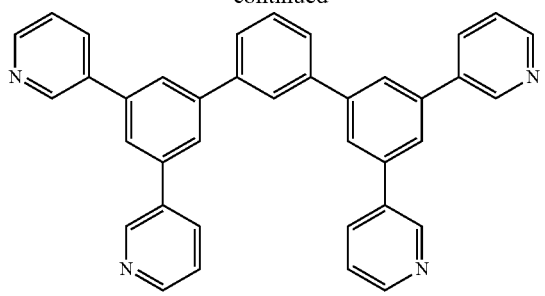
BmPyPB
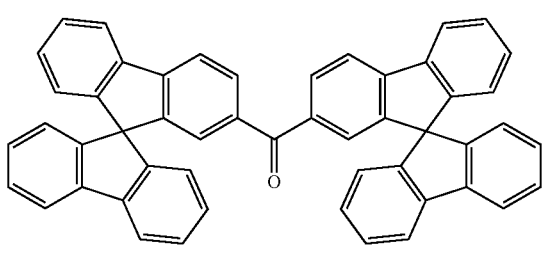
BSFM
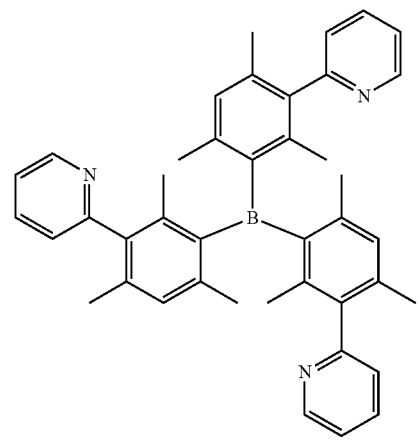
101
102
32
-continued
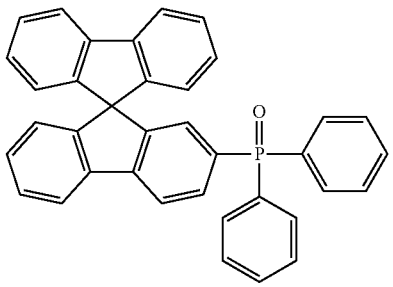
103
104
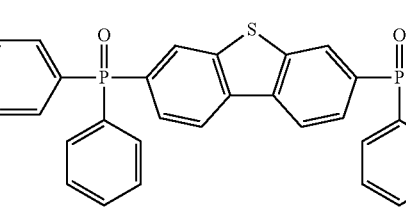
105
106
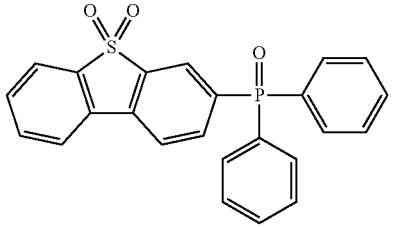
107
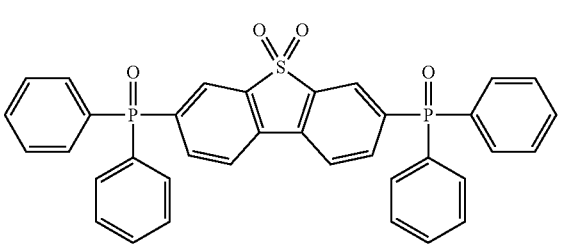
108

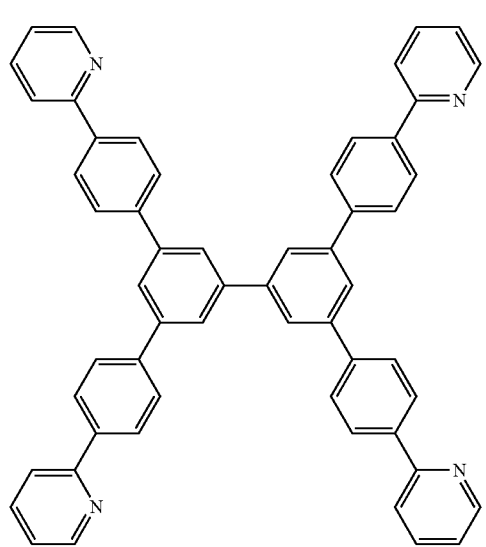
109
110
111
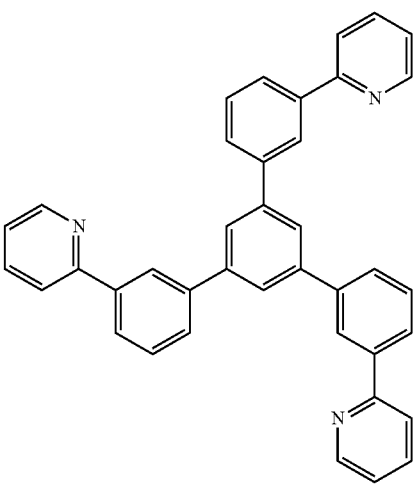
112
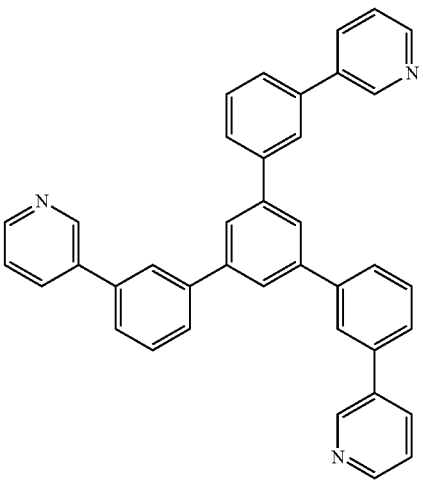
113
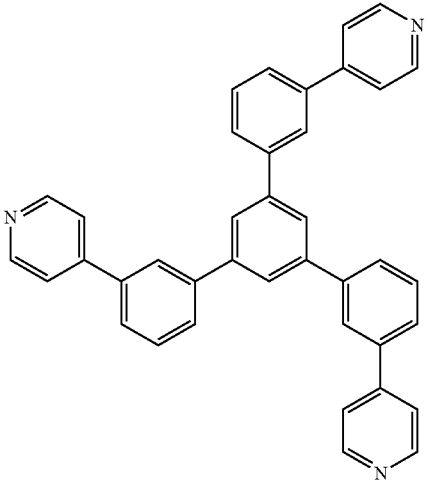
114

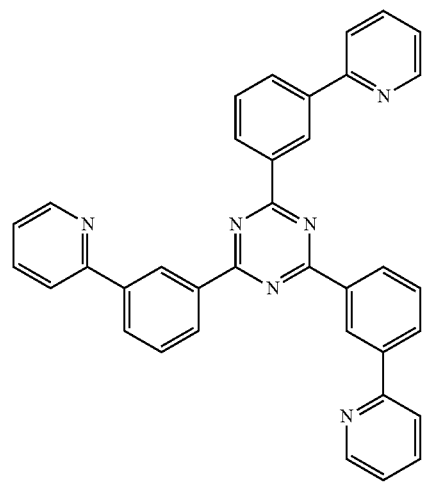
115
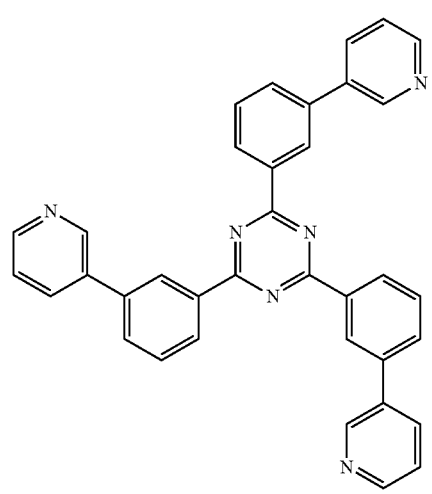
116
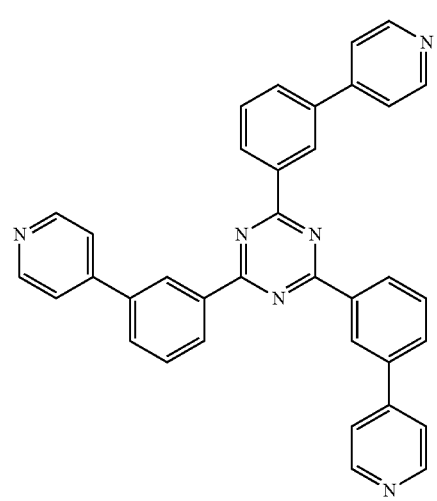
117
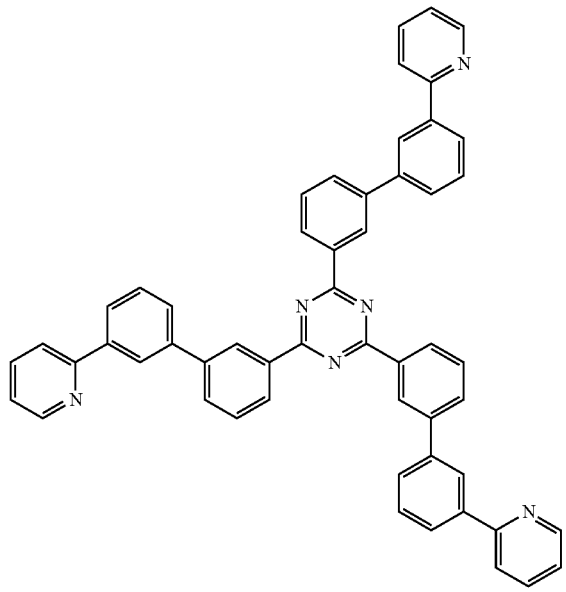
118
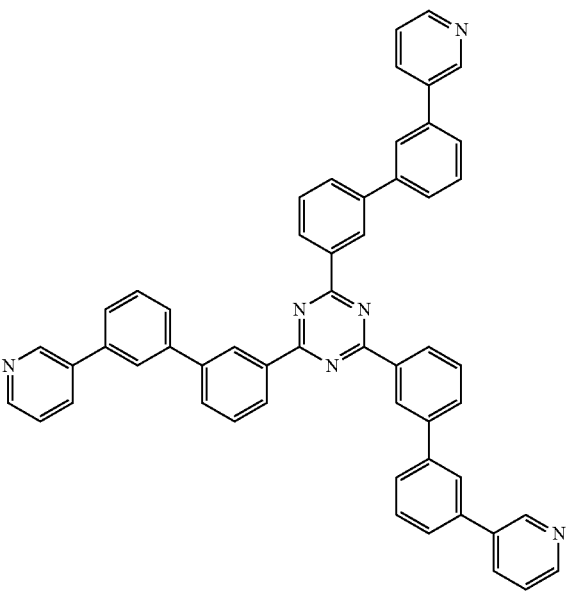
119

-continued

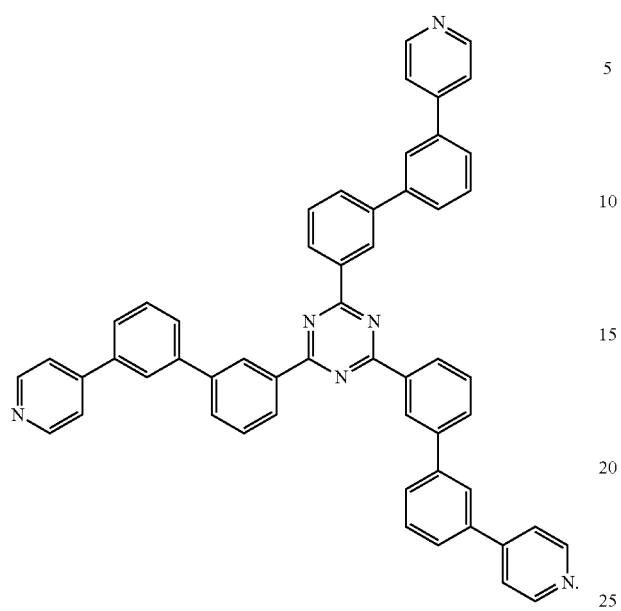

When the host consists of a single compound, the host may be an indenocarbazole compound, an indolocarbazole compound, a benzofurocarbazole compound, or a benzothiophenocarbazole compound.

For example, the host may be an indenocarbazole compound, an indolocarbazole compound, a benzofurocarbazole compound, or a benzothiophenocarbazole compound, each substituted with at least one substituent independently selected from deuterium, a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a triazinyl group, a diphenylpyridinyl group, a diphenylpyrimidinyl group, and a diphenyltriazinyl group.

The dopant in the emission layer may be a fluorescent dopant.

For example, in the emission layer, a singlet ($S_1$) energy of the fluorescent dopant may be lower than a singlet ($S_1$) energy of the fluorescent host. Accordingly, energy of excitons generated by the fluorescent host may rapidly transfer to the fluorescent dopant by Forster energy transfer, and substantially, emission occurs only in the fluorescent dopant in the emission layer of the organic light-emitting device, thereby embodying a fluorescent dopant-based fluorescent emission spectrum with excellent color purity. In addition, fluorescent emission having relatively short excitons lifespan may occur, and accordingly, an efficiency-conversion phenomenon under high luminance (also called a roll-off phenomenon), which may occur due to an interaction between a plurality of excitons (an interaction between excitons) or an interaction between an excitons and a charge (hole or electron) (an interaction between an excitons and a polaron), is suppressed to produce an organic light-emitting device with high efficiency.

The fluorescent dopant may be a condensed polycyclic compound or a styryl compound.

For example, the fluorescent dopant may include a naphthalene core, a fluorene core, a spiro-bifluorene core, a benzofluorene core, a dibenzofluorene core, a phenanthrene core, an anthracene core, a fluoranthene core, a triphenylene core, a pyrene core, a chrysene core, a naphthacene core, a picene core, a perylene core, a pentaphene core, an indenoanthracene core, a tetracene core, a bisanthracene core, a core represented by one of Formulae 501-1 to 501-18, or any combination thereof, but is not limited thereto:

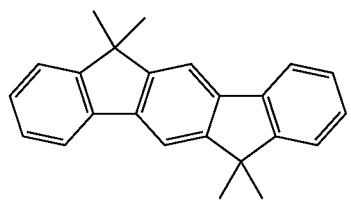

Formula 501-1

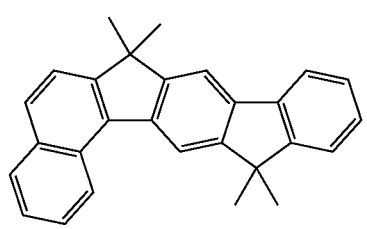

Formula 501-2

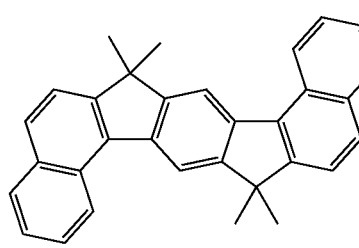

Formula 501-3

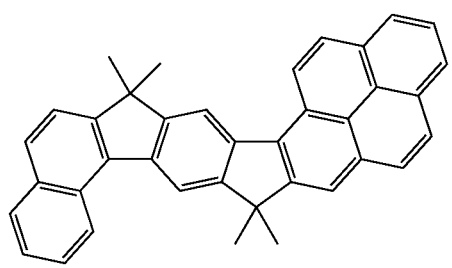

Formula 501-4

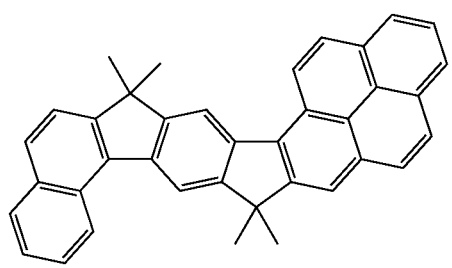

Formula 501-5

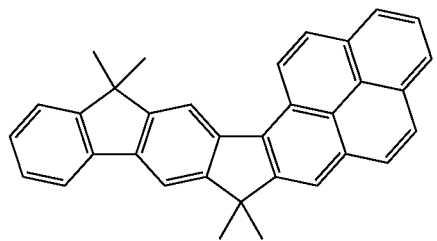

Formula 501-6

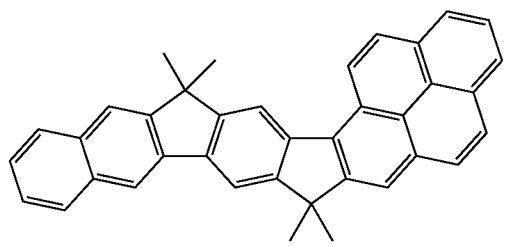

Formula 501-7
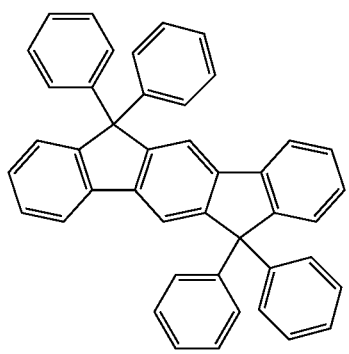
Formula 501-8
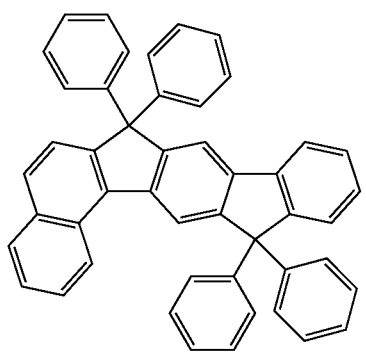
Formula 501-9
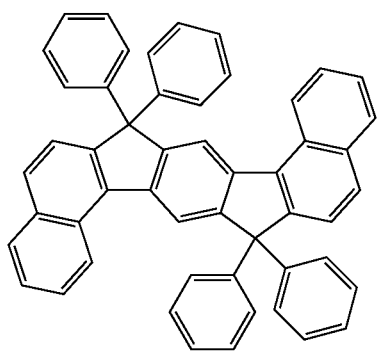
Formula 501-10
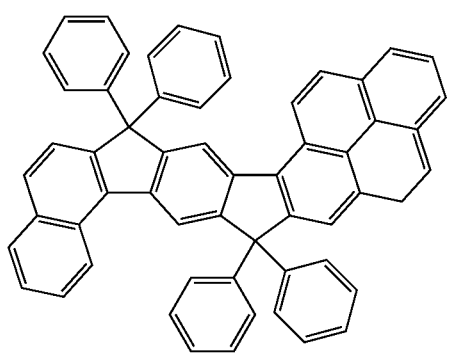
Formula 501-11
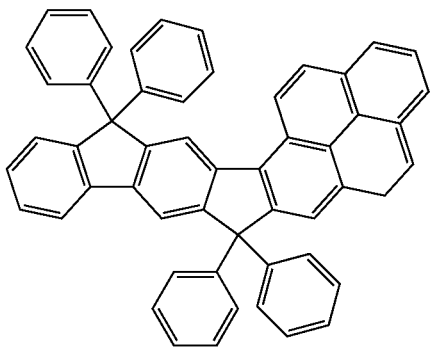
Formula 501-12
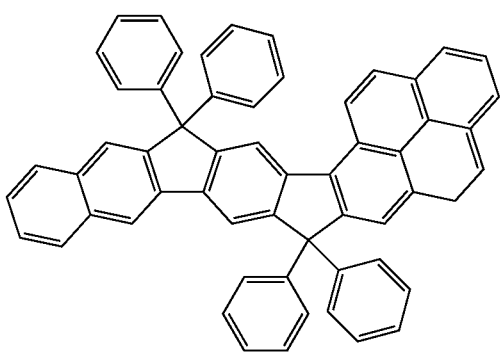
Formula 501-13
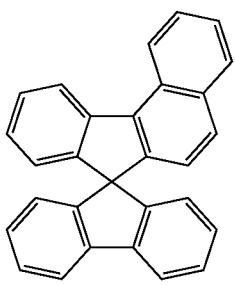
Formula 501-14
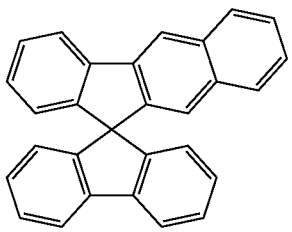
Formula 501-15
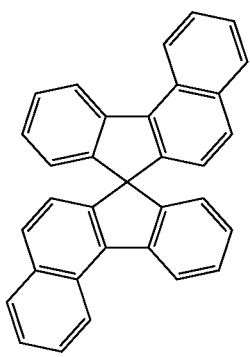

-continued

Formula 501-16

Formula 501-17

Formula 501-18

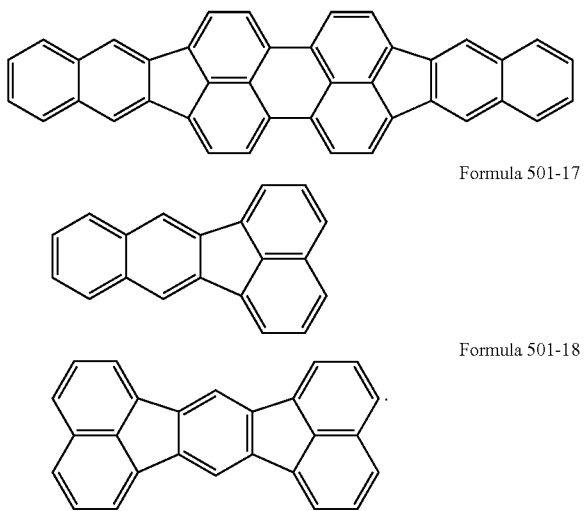

Alternatively, the fluorescent dopant may be a styryl-amine compound or a styryl-carbazole compound, but is not limited thereto.

In some embodiments, the fluorescent dopant may be selected from compounds represented by Formula 501:

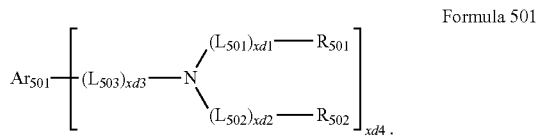

Formula 501

In Formula 501, $Ar_{501}$ may be selected from:

a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, and a group represented by one of Formulae 501-1 to 501-18; and a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, and a group represented by one of Formulae 501-1 to 501-18, each substituted with at least one substituent independently selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{501}$)($Q_{502}$)($Q_{503}$) (wherein $Q_{501}$ to $Q_{503}$ may each independently be selected from hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group), $L_{501}$ to $L_{503}$ may each independently be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $R_{501}$ and $R_{502}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one substituent independently selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, xd1 to xd3 may each independently be selected from 0, 1, 2, and 3, and xd4 may be selected from 0, 1, 2, 3, 4, 5, and 6.

For example, in Formula 501, $Ar_{501}$ may be selected from:

a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, and groups represented by Formulae 501-1 to 501-18; and a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, and groups represented by Formulae 501-1 to 501-18, each substituted with at least one substituent independently selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a dibenzofuranyl group, a dibenzothiophenyl group, a carbazolyl group, a pyridinyl group, a pyrimidinyl group, a triazinyl group, a quinolinyl group, an isoquinolinyl group, and —Si($Q_{501}$)($Q_{502}$)($Q_{503}$) (wherein $Q_{501}$ to $Q_{503}$ may each independently be selected from hydrogen, a $C_1$-$C_{20}$ alkyl group, a $C_1$-$C_{20}$ alkoxy group, a phenyl group, a biphenyl group, a terphenyl group, and a naphthyl group), $L_{501}$ to $L_{503}$ may have the same definition as the description of $L_{11}$ provided herein, xd1 to xd3 may each independently be selected from 0, 1, and 2, and xd4 may be selected from 0, 1, 2, and 3, but embodiments are not limited thereto.

The fluorescent dopant may include, for example, at least one of Compounds FD(1) to FD(14), Compounds FD1 to FD13, or any combination thereof:

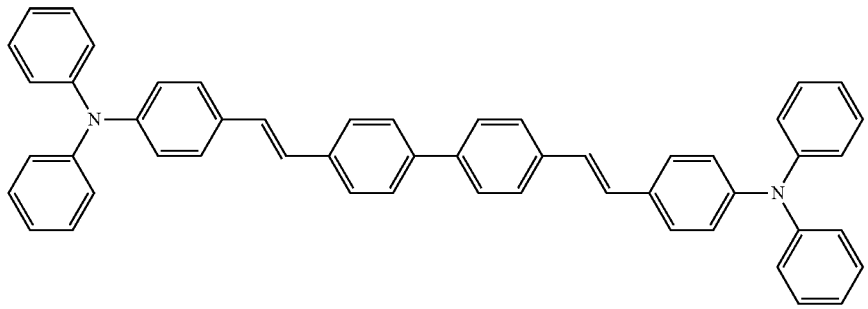

Compound FD(1)

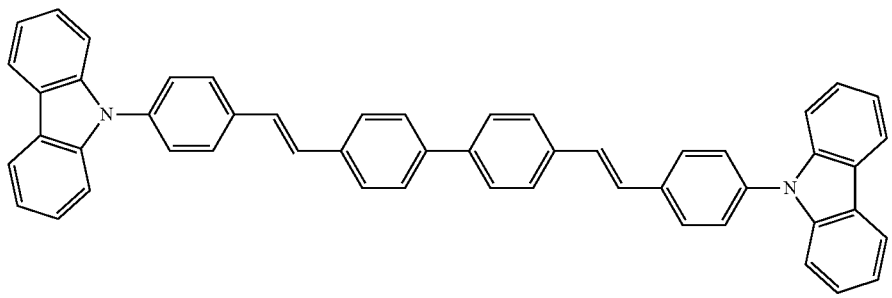

Compound FD(2)

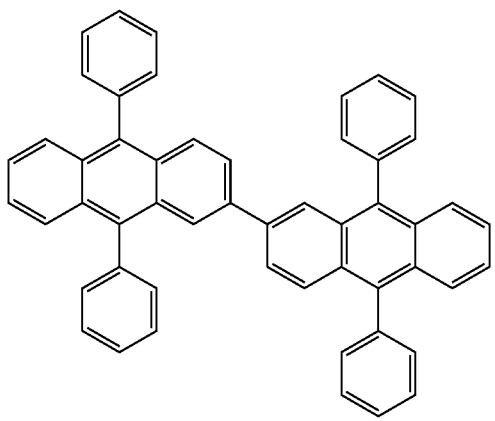

Compound FD(3)    Compound FD(4)

-continued
Compound FD(5)
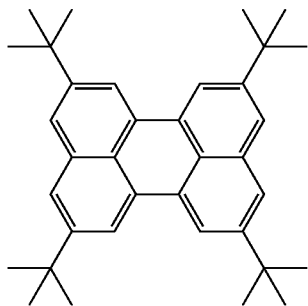
Compound FD(6)
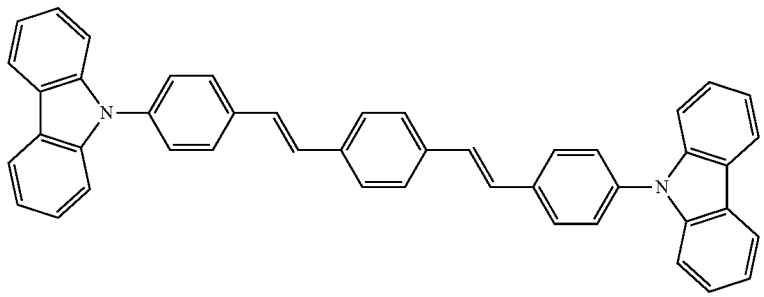
Compound FD(7)
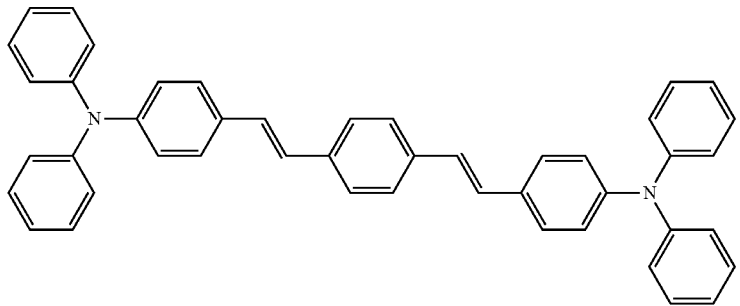
Compound FD(8)
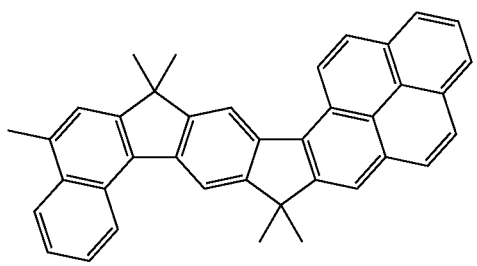
Compound FD(9)
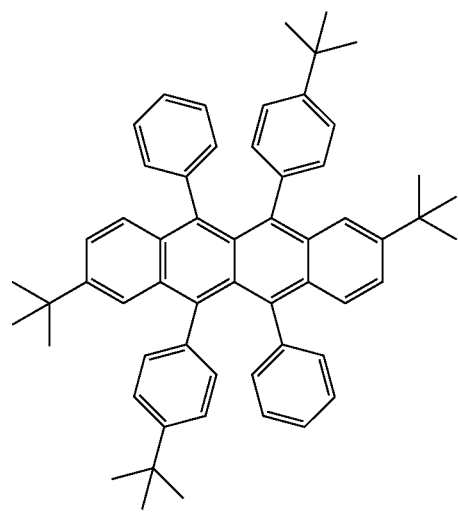

-continued
Compound FD(10)
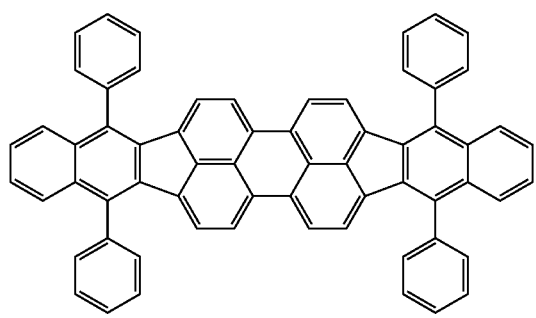
Compound FD(11)
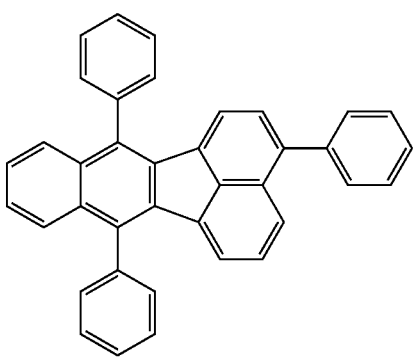
Compound FD(12)
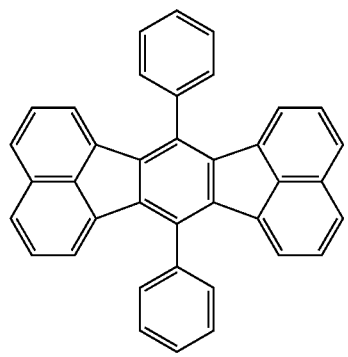
Compound FD(13)
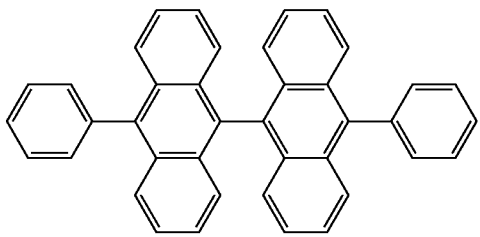
Compound FD(14)
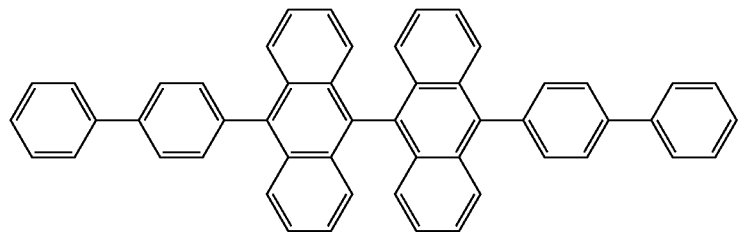
FD1
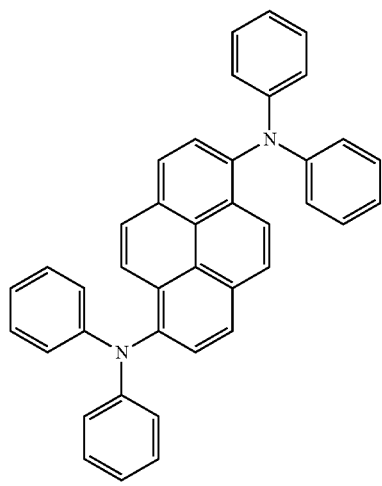
FD2
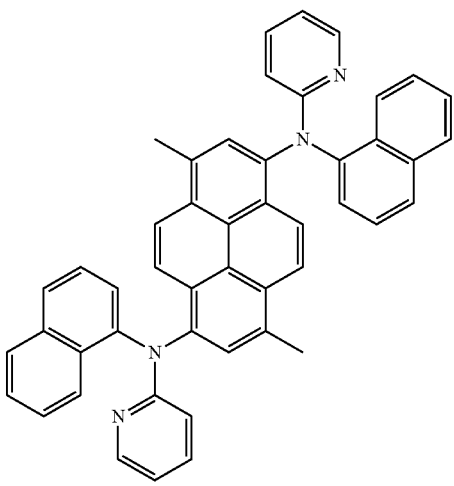

-continued
FD3
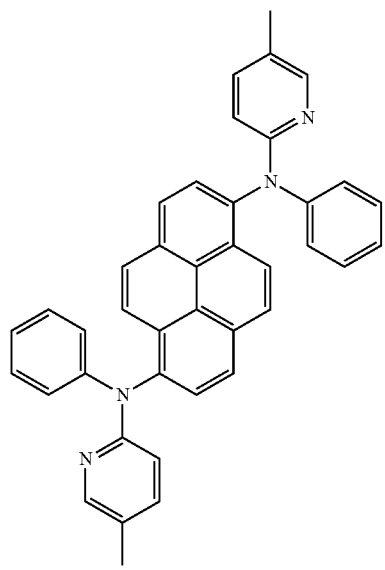
FD4
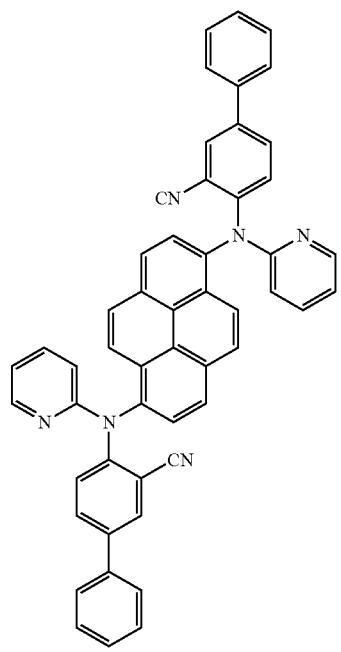
FD5
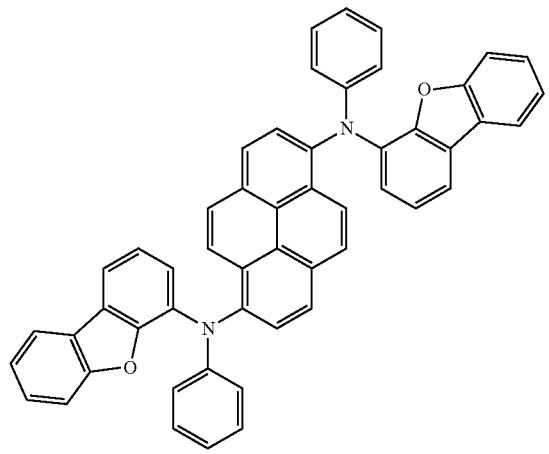
FD6
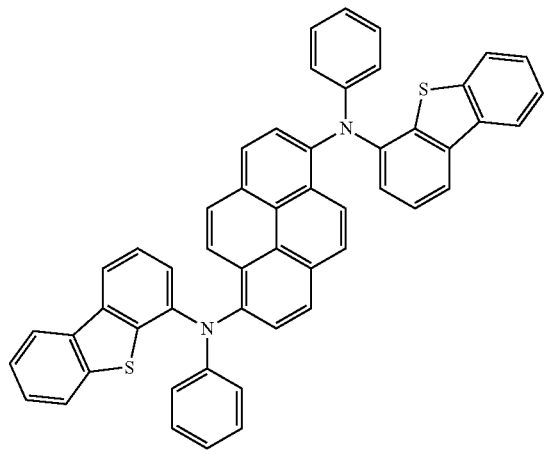
FD7
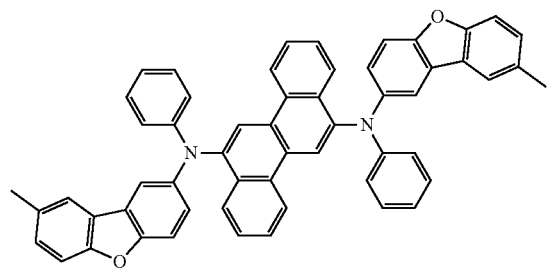
FD8
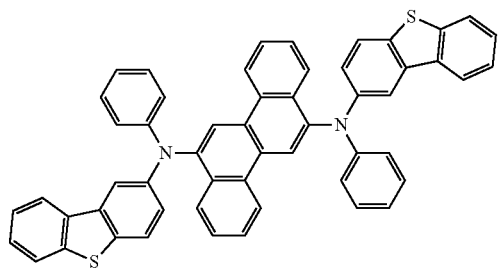

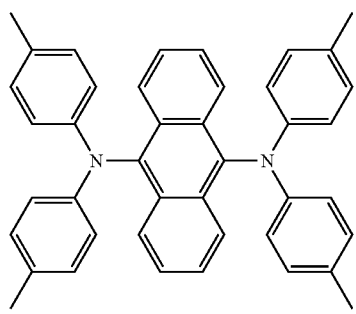

FD9

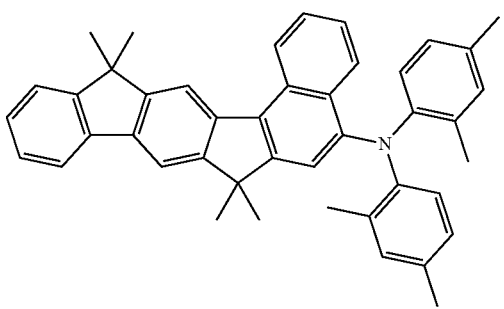

FD10

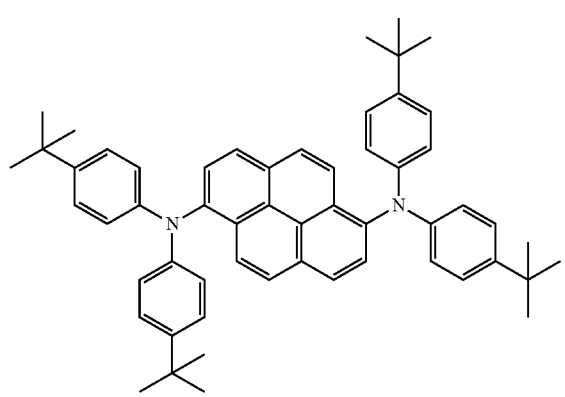

FD11

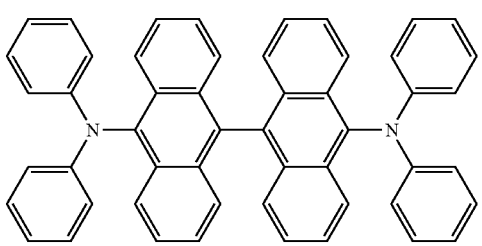

FD12

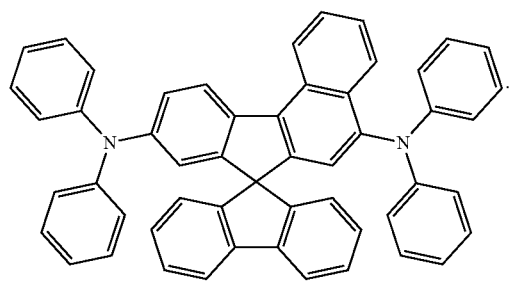

FD13

The above Compound FD(10) is tetraphenyl-dibenzoperiflanthene (i.e., DBP). The above FD9 is 9,10-bis[N,N-di-(p-tolyl)-amino]anthracene (i.e., TTPA).

In some embodiments, the dopant in the emission layer may be a phosphorescent dopant.

The phosphorescent dopant may be selected from dopants that emit light based on a phosphorescent emission mechanism.

The phosphorescent dopant may be selected from a red phosphorescent dopant, a green phosphorescent dopant, and a blue phosphorescent dopant.

In some embodiments, the phosphorescent dopant may be a green phosphorescent dopant or a blue phosphorescent dopant, but is not limited thereto.

For example, the phosphorescent dopant may include an organometallic compound represented by Formula 81:

$$M(L_{81})_{n81}(L_{82})_{n82}$$

Formula 81

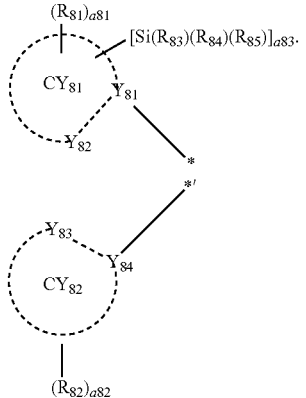

Formula 81A

In Formulae 81 and 81A,

M may be selected from iridium (Ir), platinum (Pt), osmium (Os), titanium (Ti), zirconium (Zr), hafnium (Hf), europium (Eu), terbium (Tb), thulium (Tm), and rhodium (Rh), $L_{81}$ is a ligand represented by Formula 81A, n81 is an integer of 1 to 3, and when n81 is 2 or more, two or more groups $L_{81}$ may be identical to or different from each other, $L_{82}$ is an organic ligand, n82 is an integer of 0 to 4, and when n82 is 2 or more, two or more groups $L_{82}$ may be identical to or different from each other, $Y_{81}$ to $Y_{84}$ may each independently be carbon (C) or nitrogen (N), $Y_{81}$ and $Y_{82}$ may bind to each other via a single bond or a double bond, and $Y_{83}$ and $Y_{84}$ may be linked to each other via a single bond or a double bond, $CY_{81}$ and $CY_{82}$ may each independently be selected from a $C_5$-$C_{30}$ carbocyclic group and a $C_1$-$C_{30}$ heterocarbocyclic group, $CY_{81}$ and $CY_{82}$ may optionally additionally bind to each other via an organic linking group, $R_{81}$ to $R_{85}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si(Q$_{81}$)(Q$_{82}$)(Q$_{83}$), —N(Q$_{84}$)(Q$_{85}$), —B(Q$_{86}$)(Q$_{87}$), and —P(=Q) (Q$_{88}$) (Q$_{89}$), a81 to a83 may each independently be an integer of 0 to 5, when a81 is 2 or more, two or more groups $R_{81}$ may be identical to or different from each other, when a82 is 2 or more, two or more groups $R_{82}$ may be identical to or different from each other, when a81 is 2 or more, neighboring groups $R_{81}$ may optionally bind to each other and form a saturated or unsaturated ring, when a82 is 2 or more, neighboring groups $R_{82}$ may optionally bind to each other and form a saturated or unsaturated ring, and *' in Formula 81A each indicate a binding site to M in Formula 81, and at least one of substituents of the substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si(Q$_{91}$)(Q$_{92}$)(Q$_{93}$), wherein $Q_{81}$ to $Q_{89}$ and $Q_{91}$ to $Q_{93}$ may each independently be selected from hydrogen, deuterium, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In some embodiments, in Formula 81A, a83 may be 1 or 2, and $R_{83}$ to $R_{85}$ may each independently be selected from: —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, but embodiments are not limited thereto.

In some embodiments, in Formula 81A, $Y_{81}$ may be nitrogen, $Y_{82}$ and $Y_{83}$ may be carbon, $Y_{84}$ may be nitrogen or carbon, and $CY_{81}$ and $CY_{82}$ may each independently be selected from a cyclopentadiene ring, a benzene ring, a heptalene ring, an indene ring, a naphthalene ring, an azulene ring, a heptalene ring, an indacene ring, an acenaphthylene ring, a fluorene ring, a spiro-bifluorene ring, a benzofluorene ring, a dibenzofluorene ring, a phenalene ring, a phenanthrene ring, an anthracene ring, a fluoranthene ring, a triphenylene ring, a pyrene ring, a chrysene ring, a naphthacene ring, a picene ring, a perylene ring, a pentacene ring, a hexacene ring, a pentaphene ring, a rubicene ring, a coronene ring, an ovalene ring, a pyrrole ring, an isoindole ring, an indole ring, an indazole ring, a pyrazole ring, an imidazole ring, a triazole ring, an oxazole ring, an isoxazole ring, an oxadiazole ring, a thiazole ring, an isothiazole ring, a thiadiazole ring, a purine ring, a furan ring, a thiophene ring, a pyridine ring, a pyrimidine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzoimidazole ring, a benzofuran ring, a benzothiophene ring, an isobenzothiazole ring, a benzoxazole ring, an isobenzoxazole ring, a benzocarbazole ring, a dibenzocarbazole ring, an imidazopyridine ring, an imidazopyrimidine ring, a dibenzofuran ring, a dibenzothiophene ring, a dibenzothiophene sulfone ring, a carbazole ring, a dibenzosilole ring, and a 2,3-dihydro-1H-imidazole ring.

In some embodiments, in Formula 81A, $Y_{81}$ may be nitrogen, $Y_{82}$ to $Y_{84}$ may be carbon, $CY_{81}$ may be selected from five-membered heterocycles each including two nitrogen atoms as ring-forming atoms, and $CY_{82}$ may be selected from a benzene ring, a naphthalene ring, a fluorene ring, a dibenzofuran ring, and a dibenzothiophene ring, but embodiments are not limited thereto.

In some embodiments, in Formula 81A, $Y_{81}$ may be nitrogen, $Y_{82}$ to $Y_{84}$ may be carbon, $CY_{81}$ may be an imidazole or a 2,3-dihydro-1H-imidazole, and $CY_{82}$ may be selected from a benzene ring, a naphthalene ring, a fluorene ring, a dibenzofuran ring, and a dibenzothiophene ring, but embodiments are not limited thereto.

In some embodiments, in Formula 81A, $Y_{81}$ may be nitrogen, $Y_{82}$ to $Y_{84}$ may be carbon, $CY_{81}$ may be selected from a pyrrole ring, a pyrazole ring, an imidazole ring, a triazole ring, an oxazole ring, an isoxazole ring, an oxadiazole ring, a thiazole ring, an isothiazole ring, a thiadiazole, a pyridine ring, a pyrimidine ring, a quinoline ring, an isoquinoline ring, a benzoquinoline ring, a phthalazine ring, a naphthyridine ring, a quinoxaline ring, a quinazoline ring, a cinnoline ring, a benzoimidazole ring, an isobenzothiazole ring, a benzoxazole ring, and an isobenzoxazole ring, and $CY_{82}$ may be selected from a cyclopentadiene ring, a benzene ring, a naphthalene ring, a fluorene ring, a benzofluorene ring, a dibenzofluorene ring, a phenanthrene ring, an anthracene ring, a triphenylene ring, a pyrene ring, a chrysene ring, a perylene ring, a benzofuran ring, a benzothiophene ring, a benzocarbazole ring, a dibenzocarbazole ring, a dibenzofuran ring, a dibenzothiophene ring, a dibenzothiophene sulfone ring, a carbazole ring, and a dibenzosilole ring.

In some embodiments, $R_{81}$ and $R_{82}$ in Formula 81A may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl g-oup, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —B(Q$_{86}$)(Q$_{87}$) and —P(═O)(Q$_{88}$)(Q$_{89}$), wherein $Q_{86}$ to $Q_{89}$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a C$_1$-C$_{10}$ alkyl group, and a phenyl group.

In some embodiments, $R_{81}$ and $R_{82}$ in Formula 81A may each independently be selected from:

hydrogen, deuterium, —F, a cyano group, a nitro group, —SF$_5$, a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a methyl group, an ethyl group, an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, each substituted with at least one selected from deuterium, —F, —CD$_3$, —CD$_2$H, —CDH$_2$, —CF$_3$, —CF$_2$H, —CFH$_2$, a cyano group, a nitro group, a C$_1$-C$_{10}$ alkyl group, a C$_1$-C$_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group; and —B(Q$_{86}$)(Q$_{87}$) and —P(=O)(Q$_{88}$)(Q$_{89}$), wherein $Q_{86}$ to $Q_{89}$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an r-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an r-pentyl group, an iso-pentyl group, a sec-pentyl group, a tert-pentyl group, a phenyl group, and a naphthyl group, each substituted with at least one selected from deuterium, a C$_1$-C$_{10}$ alkyl group, and a phenyl group.

In some embodiments, $R_{81}$ and $R_{82}$ in Formula 81A may each independently be selected from hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, a group represented by one of Formulae 9-1 to 9-19, and a group represented by one of Formulae 10-1 to 10-30, but embodiments are not limited thereto:

Formula 9-1

Formula 9-2

Formula 9-3

Formula 9-4

Formula 9-5

Formula 9-6

Formula 9-7

Formula 9-8

Formula 9-9

Formula 9-10

Formula 9-11

Formula 9-12

Formula 9-13
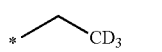
Formula 9-14
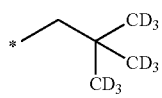
Formula 9-15
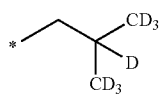
Formula 9-16
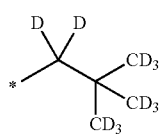
Formula 9-17
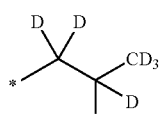
Formula 9-18
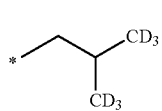
Formula 9-19
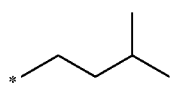
Formula 10-1
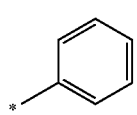
Formula 10-2
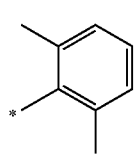
Formula 10-3
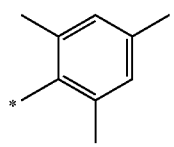
Formula 10-4
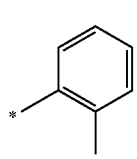
Formula 10-5
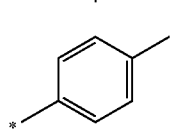
Formula 10-6
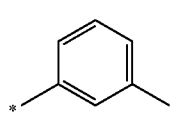
Formula 10-7
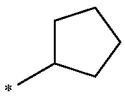
Formula 10-8
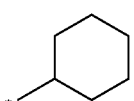
Formula 10-9
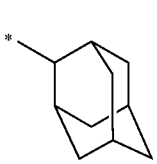
Formula 10-10
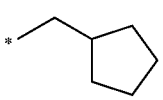
Formula 10-11
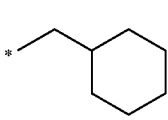
Formula 10-12
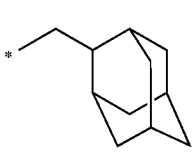
Formula 10-13
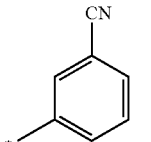
Formula 10-14
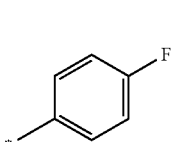
Formula 10-15
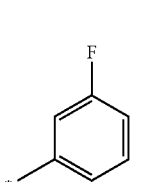
Formula 10-16
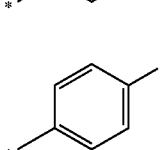
Formula 10-17
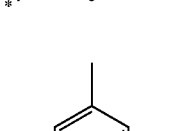
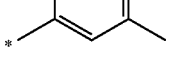

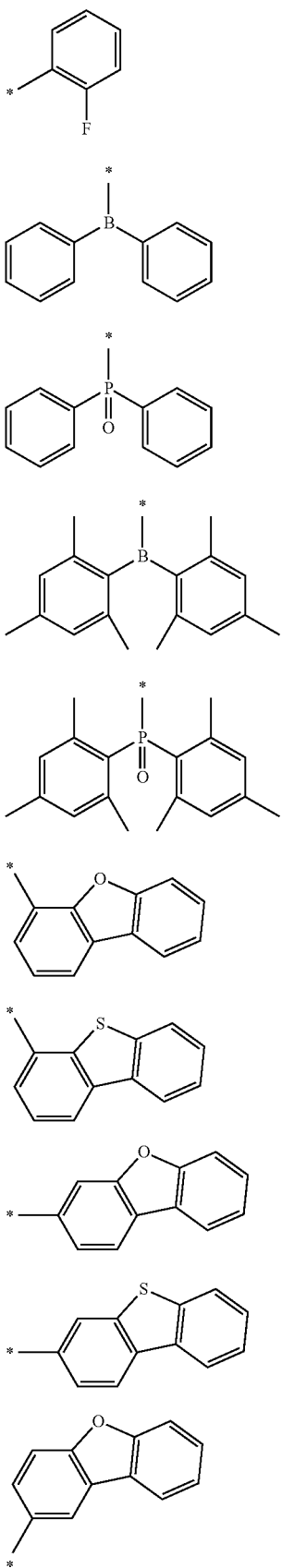

Formula 10-18

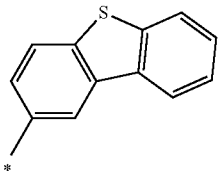
Formula 10-28

Formula 10-19

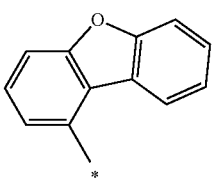
Formula 10-29

Formula 10-20

Formula 10-21

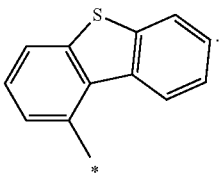
Formula 10-30

Formula 10-22

The '*' in Formulae 9-1 to 9-17 and 10-1 to 10-30 indicates a binding site to a neighboring atom.

In some embodiments, at least one selected from $R_{81}$ in the number of a81 and $R_{82}$ in the number of a82 in Formula 81A may be a cyano group.

Formula 10-23

In some embodiments, at least one of $R_{82}$ in the number of a82 in Formula 81A may be a cyano group.

Formula 10-24

In some embodiments, at least one selected from $R_{81}$ in the number of a81 and $R_{82}$ in the number of a82 in Formula 81A may be deuterium. In some embodiments, $L_{82}$ in Formula 81 may be selected from ligands represented by Formulae 3-1(1) to 3-1(60), 3-1(61) to 3-1(69), 3-1(71) to 3-1(79), 3-1(81) to 3-1(88), 3-1(91) to 3-1(98), and 3-1(101) to 3-1(114):

Formula 10-25

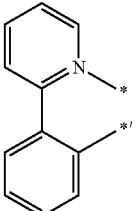
Formula 3-1(1)

Formula 10-26

Formula 10-27

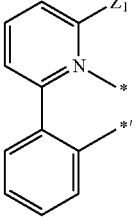
Formula 3-1(2)

-continued
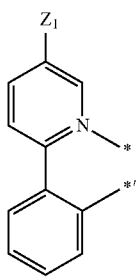
Formula 3-1(3)
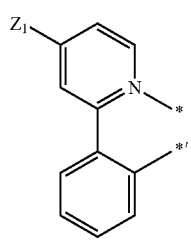
Formula 3-1(4)
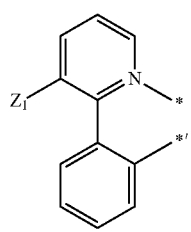
Formula 3-1(5)
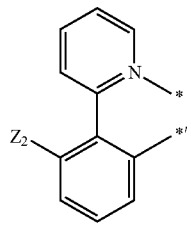
Formula 3-1(6)
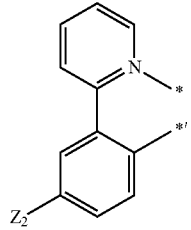
Formula 3-1(7)
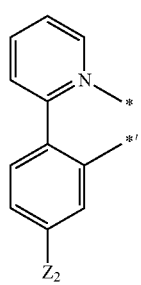
Formula 3-1(8)
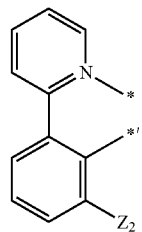
Formula 3-1(9)
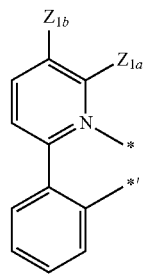
Formula 3-1(10)
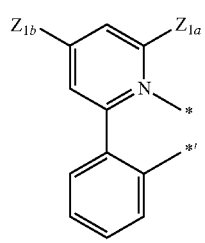
Formula 3-1(11)
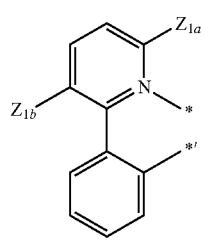
Formula 3-1(12)
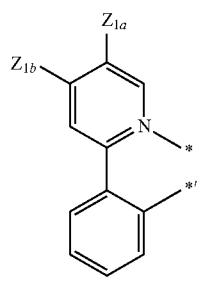
Formula 3-1(13)
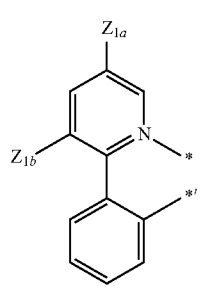
Formula 3-1(14)

Formula 3-1(15)
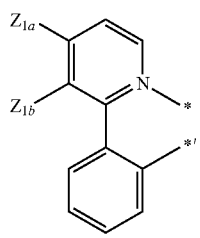
Formula 3-1(16)
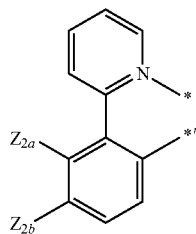
Formula 3-1(17)
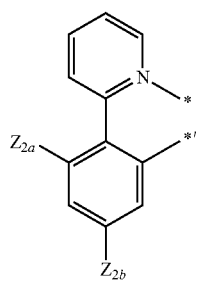
Formula 3-1(18)
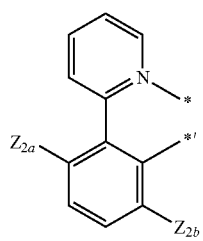
Formula 3-1(19)
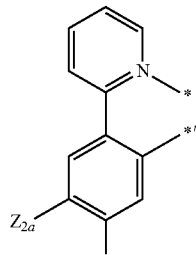
Formula 3-1(20)
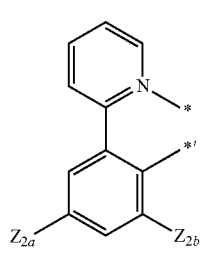
Formula 3-1(21)
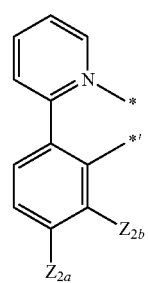
Formula 3-1(22)
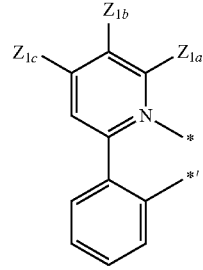
Formula 3-1(23)
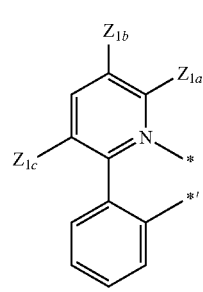
Formula 3-1(24)
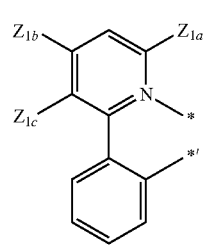
Formula 3-1(25)
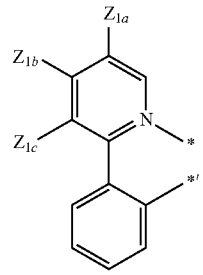
Formula 3-1(26)
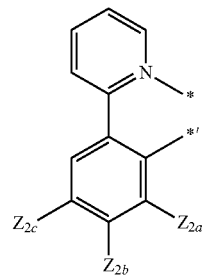

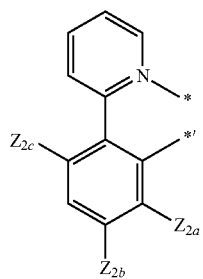 Formula 3-1(27)
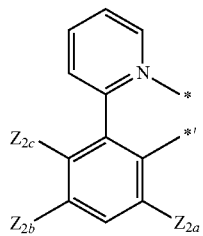 Formula 3-1(28)
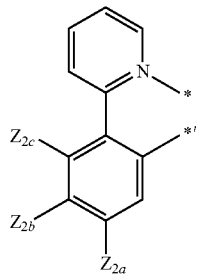 Formula 3-1(29)
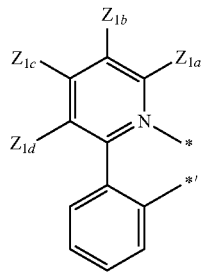 Formula 3-1(30)
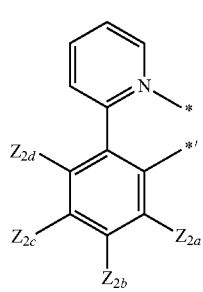 Formula 3-1(31)
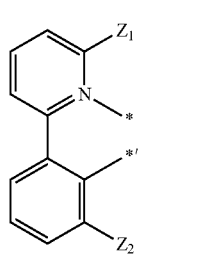 Formula 3-1(32)
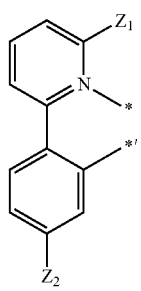 Formula 3-1(33)
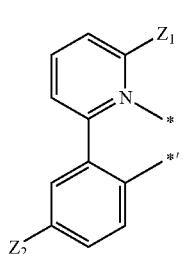 Formula 3-1(34)
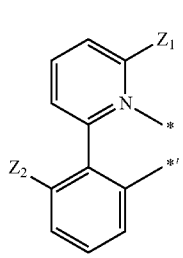 Formula 3-1(35)
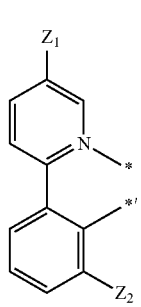 Formula 3-1(36)
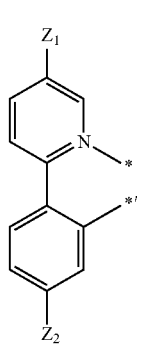 Formula 3-1(37)

Formula 3-1(38)
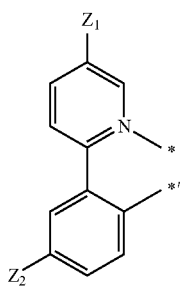
Formula 3-1(39)
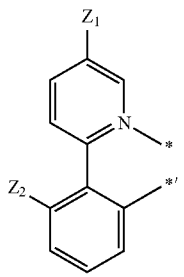
Formula 3-1(40)
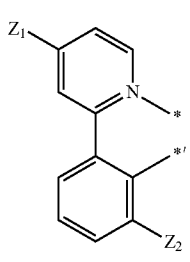
Formula 3-1(41)
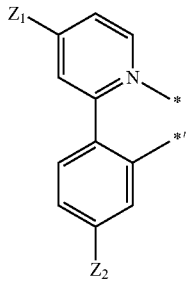
Formula 3-1(42)
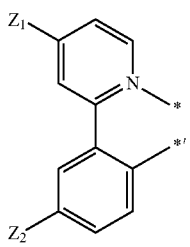
Formula 3-1(43)
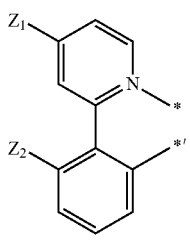
Formula 3-1(44)
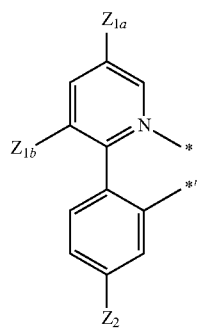
Formula 3-1(45)
Formula 3-1(46)
Formula 3-1(47)
Formula 3-1(48)
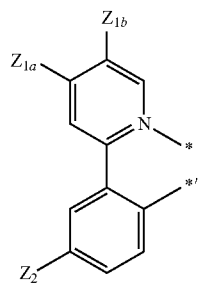

Formula 3-1(49)
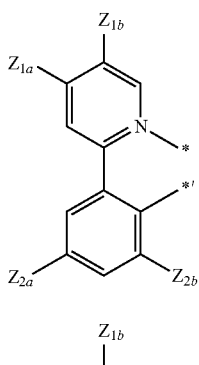
Formula 3-1(50)
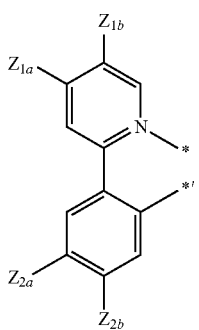
Formula 3-1(51)
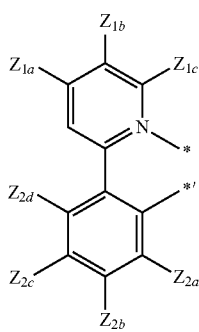
Formula 3-1(52)
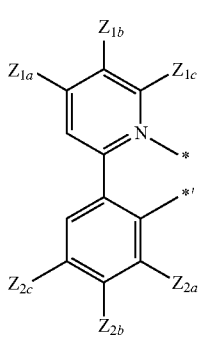
Formula 3-1(53)
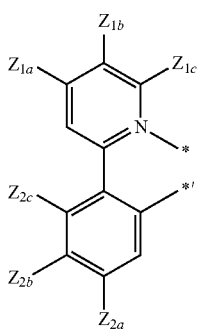
Formula 3-1(54)
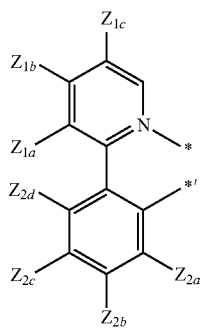
Formula 3-1(55)
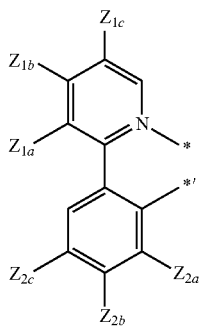
Formula 3-1(56)
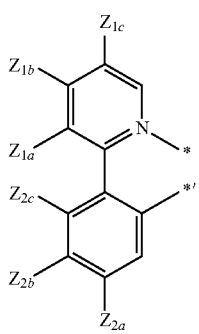
Formula 3-1(57)
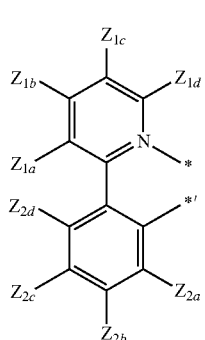
Formula 3-1(58)
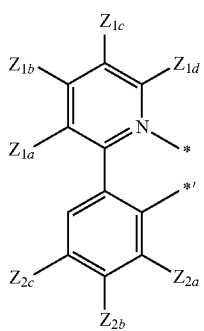

-continued
Formula 3-1(59)
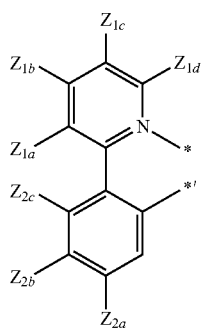
Formula 3-1(60)
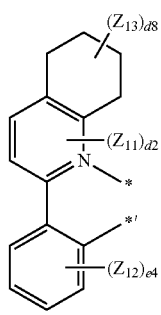
Formula 3-1(61)
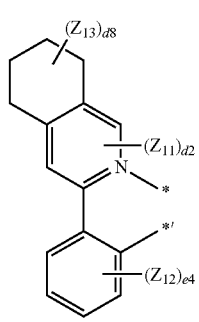
Formula 3-1(62)
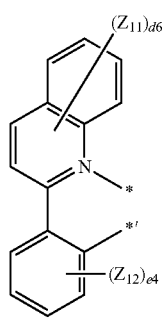
Formula 3-1(63)
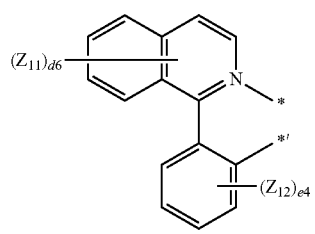
-continued
Formula 3-1(64)
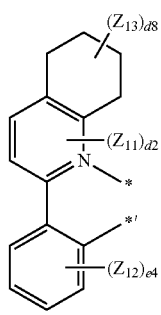
Formula 3-1(65)
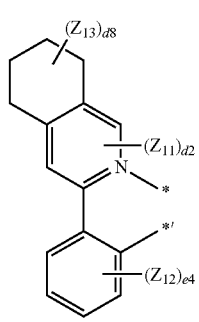
Formula 3-1(66)
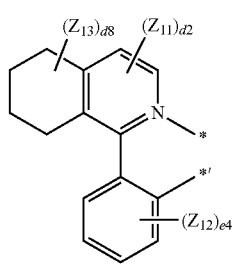
Formula 3-1(67)
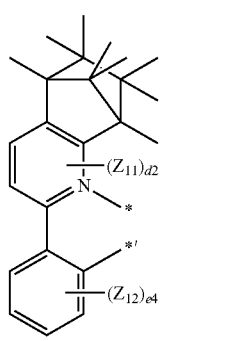
Formula 3-1(68)
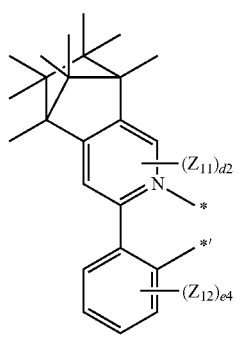

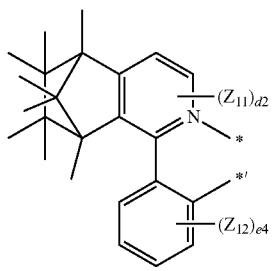
Formula 3-1(69)
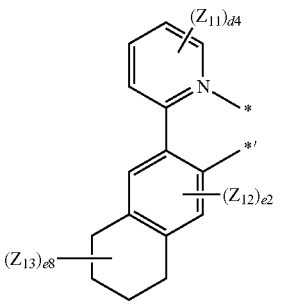
Formula 3-1(75)
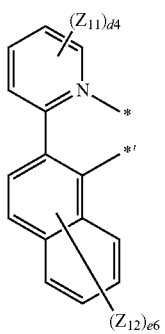
Formula 3-1(71)
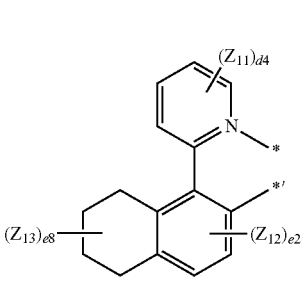
Formula 3-1(76)
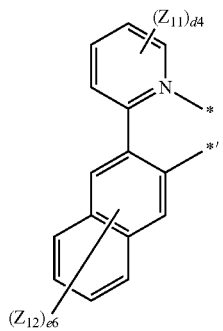
Formula 3-1(72)
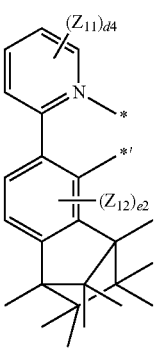
Formula 3-1(77)
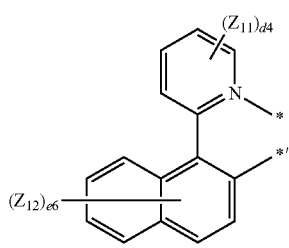
Formula 3-1(73)
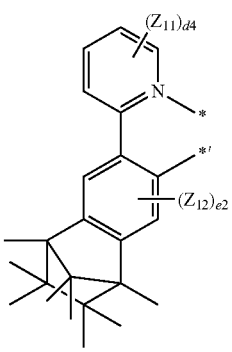
Formula 3-1(78)
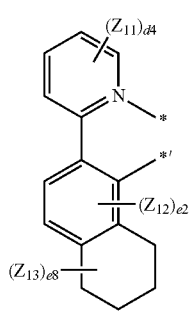
Formula 3-1(74)
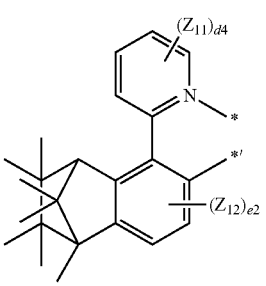
Formula 3-1(79)

Formula 3-1(81) 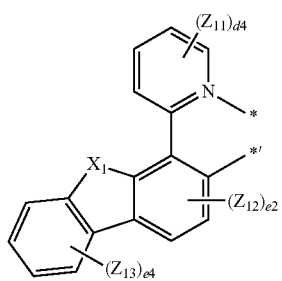
Formula 3-1(82) 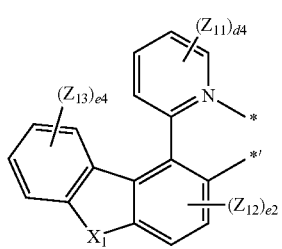
Formula 3-1(83) 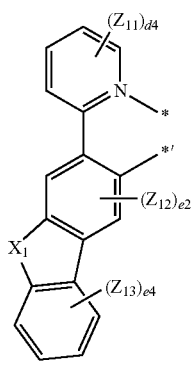
Formula 3-1(84) 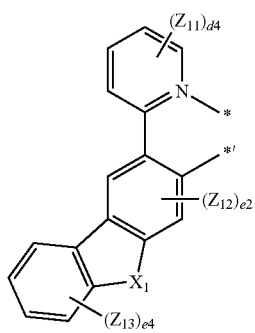
Formula 3-1(85) 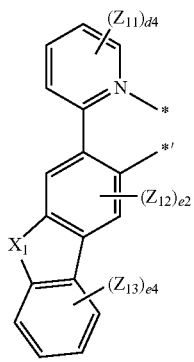
Formula 3-1(86) 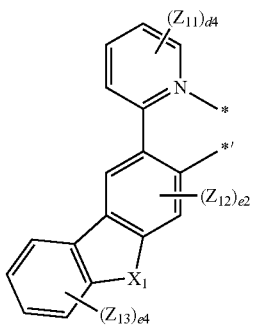
Formula 3-1(87) 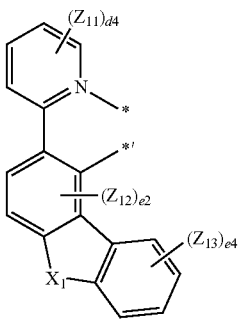
Formula 3-1(88) 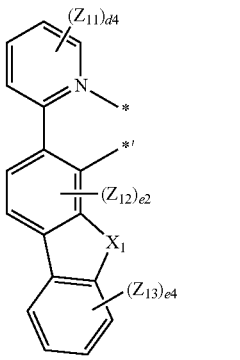
Formula 3-1(91) 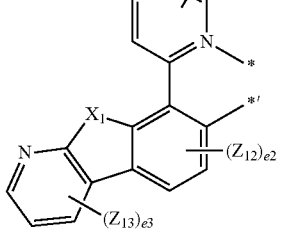
Formula 3-1(92) 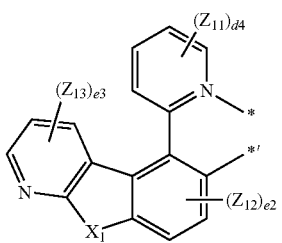

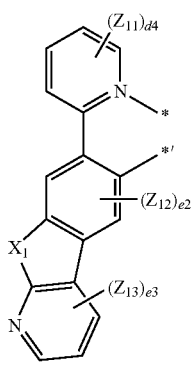
Formula 3-1(93)
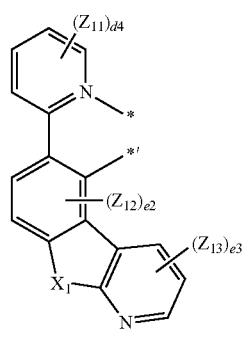
Formula 3-1(97)
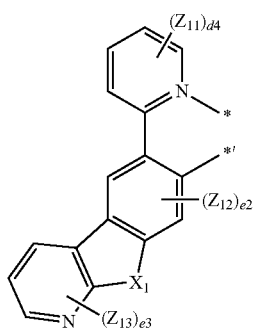
Formula 3-1(94)
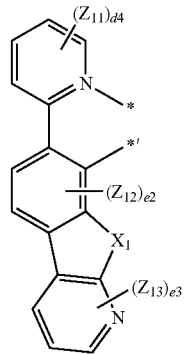
Formula 3-1(98)
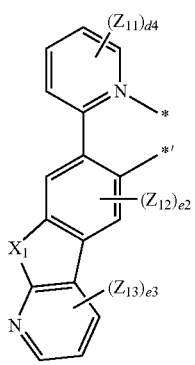
Formula 3-1(95)
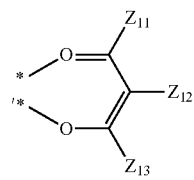
Formula 3-1(101)
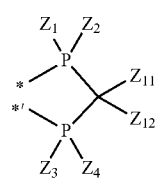
Formula 3-1(102)
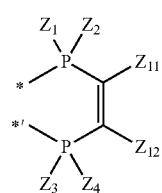
Formula 3-1(103)
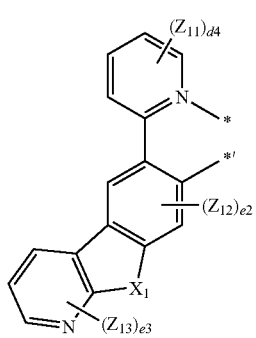
Formula 3-1(96)
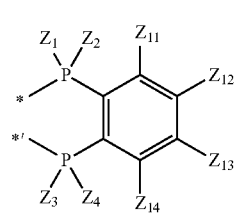
Formula 3-1(104)

-continued

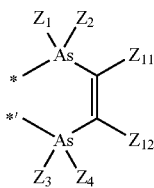

Formula 3-1(105)

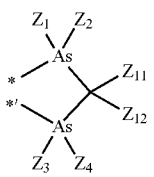

Formula 3-1(106)

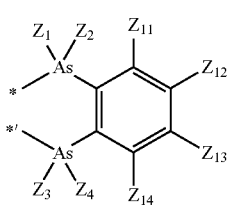

Formula 3-1(107)

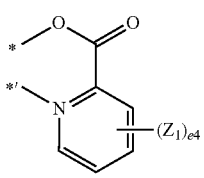

Formula 3-1(108)

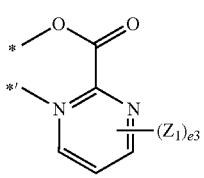

Formula 3-1(109)

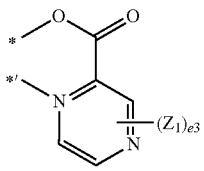

Formula 3-1(110)

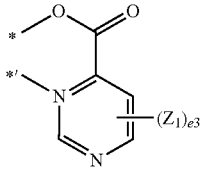

Formula 3-1(111)

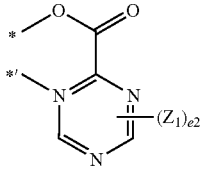

Formula 3-1(112)

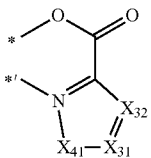

Formula 3-1(113)

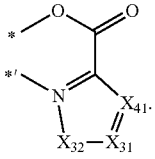

Formula 3-1(114)

In Formulae 3-1(1) to 3-1(60), 3-1(61) to 3-1(69), 3-1(71) to 3-1(79), 3-1(81) to 3-1(88), 3-1(91) to 3-1(98), and 3-1(101) to 3-1(114), $X_1$ may be O, S, $C(Z_{21})(Z_{22})$, or $N(Z_{23})$, $X_{31}$ may be N or $C(Z_{1a})$, and $X_{32}$ may be N or $C(Z_{1b})$, $X_{41}$ may be O, S, $N(Z_{1a})$, or $C(Z_{1a})(Z_{1b})$, $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, $Z_{11}$ to $Z_{14}$, and $Z_{21}$ to $Z_{23}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —B(Q$_{86}$)(Q$_{87}$) and —P(=O)(Q$_{88}$)(Q$_{83}$), wherein Q$_{86}$ to Q$_{89}$ may each independently be selected from:

—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group; and an n-propyl group, an iso-propyl group, an n-butyl group, an iso-butyl group, a sec-butyl group, a tert-butyl group, an n-pentyl group, an iso-pentyl group, a sec-pentyl group, a tert-pentyl group, a phenyl group, and a naphthyl group, each substituted with at least one selected from deuterium, a $C_1$-$C_{10}$ alkyl group, and a phenyl group, d2 and e2 may each independently be 0 or 2, e3 may be an integer of 0 to 3, d4 and e4 may each independently be an integer of 0 to 4, d6 and e6 may each independently be an integer of 0 to 6, d8 and e8 may each independently be an integer of 0 to 8, and

* and *' each indicate a binding site to M in Formula 1.

For example, $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, $Z_{11}$ to $Z_{14}$, and $Z_{21}$ to $Z_{23}$ may each independently be selected from hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, a group represented by one of Formulae 9-1 to 9-19, and a group represented by one of Formulae 10-1 to 10-30, but are not limited thereto.

In some embodiments, in Formula 81, M may be Ir, and the sum of n81 and n82 may be 3; or M may be Pt, and the sum of n81 and n82 may be 2.

In some embodiments, the organometallic compound represented by Formula 81 may be neutral, not a salt consisting of a pair of a cation and an anion.

In some embodiments, the phosphorescent dopant may include at least one of Compounds PD1 to PD78 and FIr$_6$, but is not limited thereto.

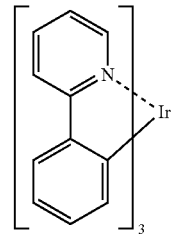

PD1

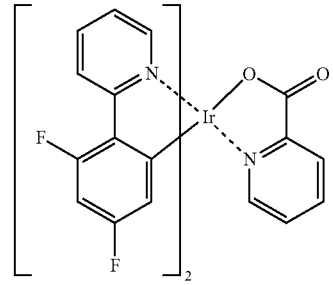

PD2

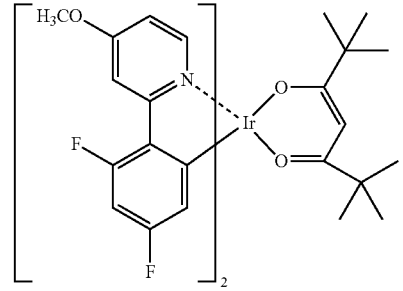

PD3

-continued
PD4
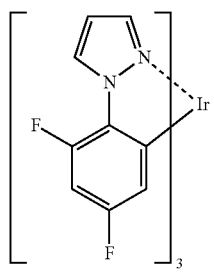
PD5
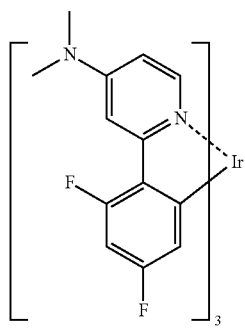
PD6
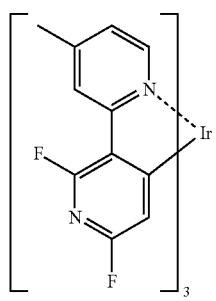
PD7
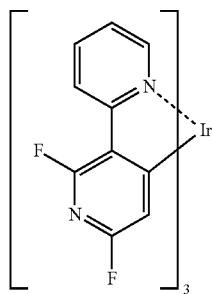
PD8
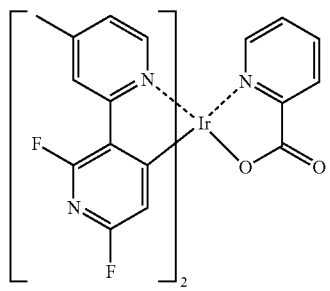
-continued
PD9
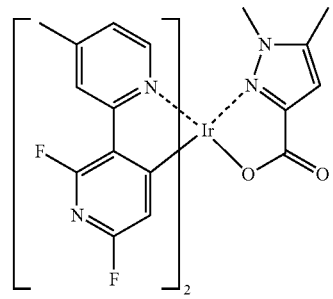
PD10
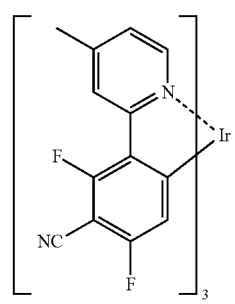
PD11
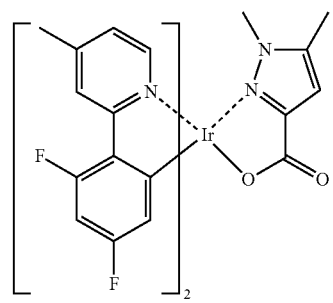
PD12
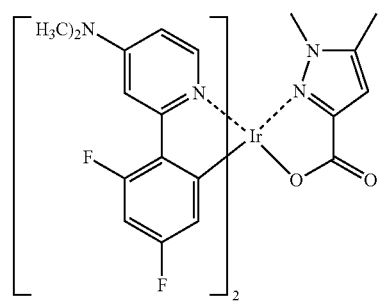
PD13
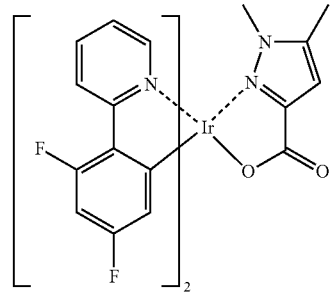

PD14
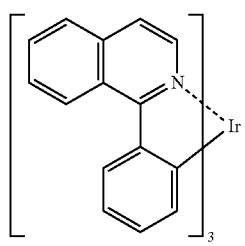
PD15
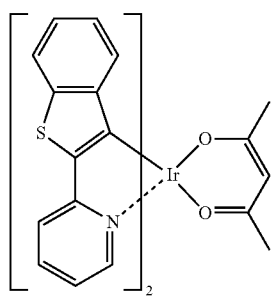
PD16
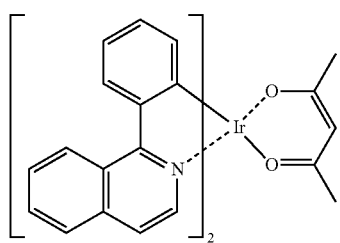
PD17
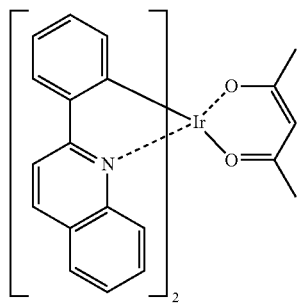
PD18
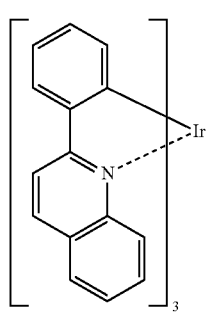
PD19
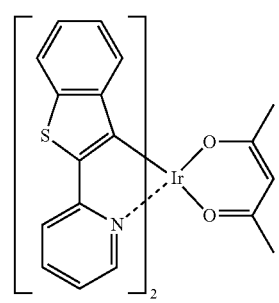
PD20
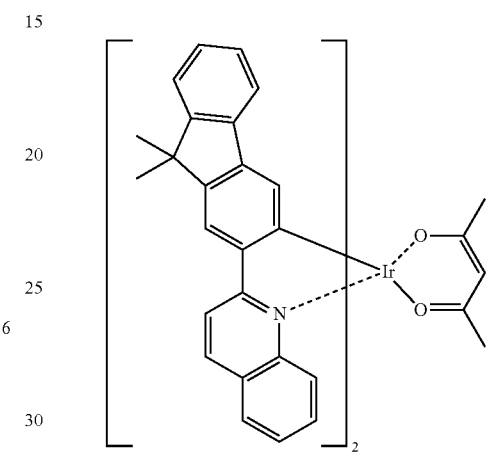
PD21
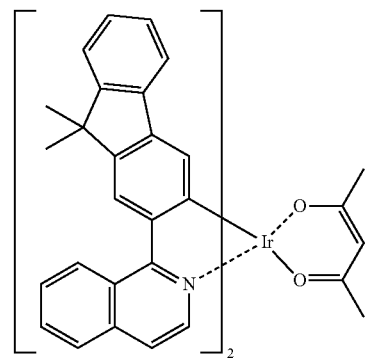
PD22
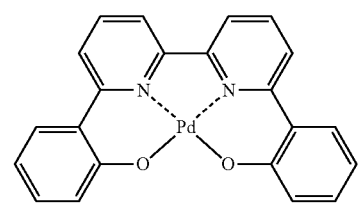
PD23
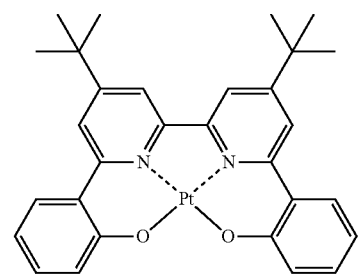

PD24 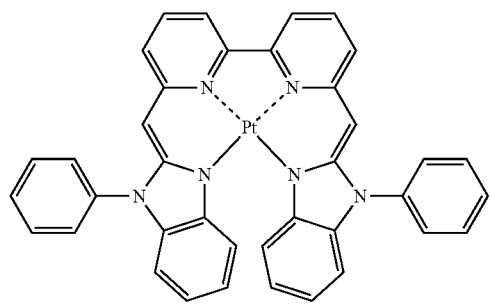
PD25 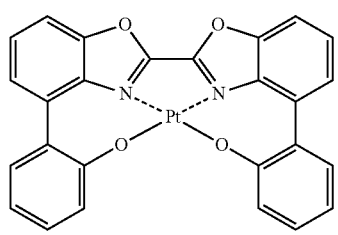
PD26 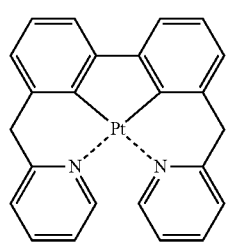
PD27 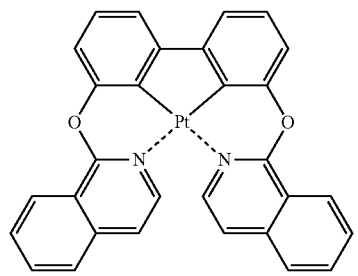
PD28 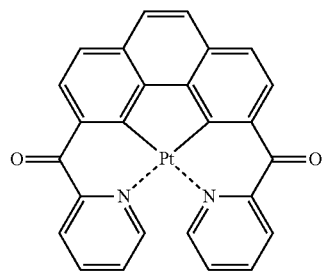
PD29 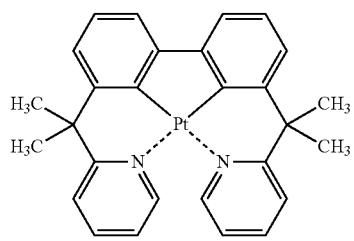
PD30 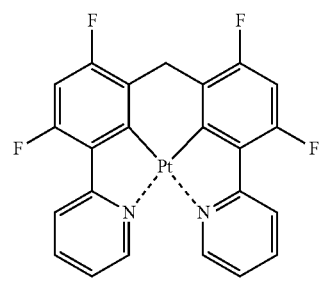
PD31 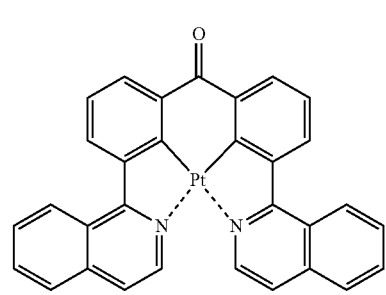
PD32 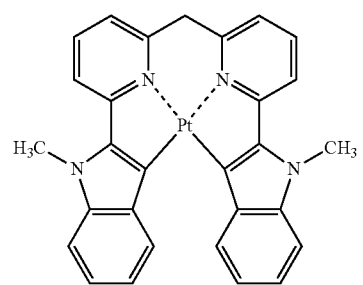
PD33 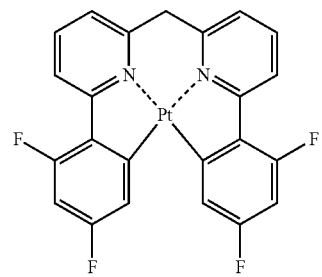
PD34 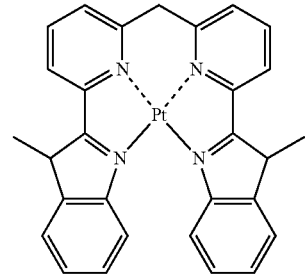

-continued
PD35 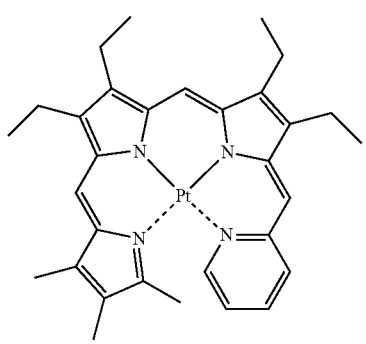
PD36 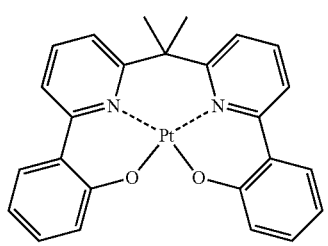
PD37 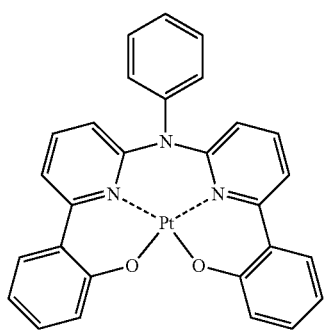
PD38 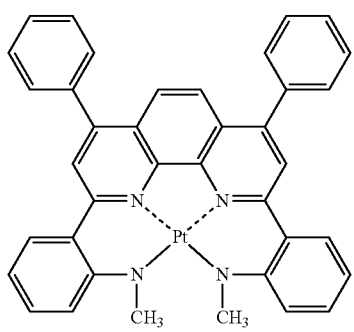
PD39 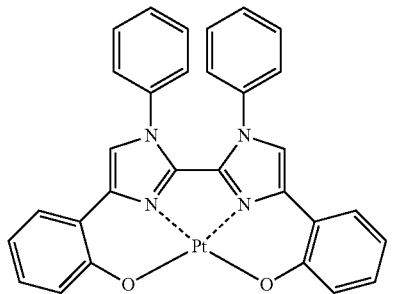
-continued
PD40 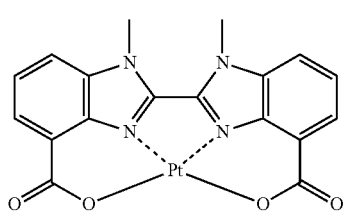
PD41 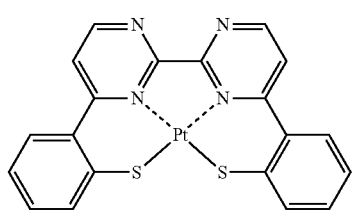
PD42 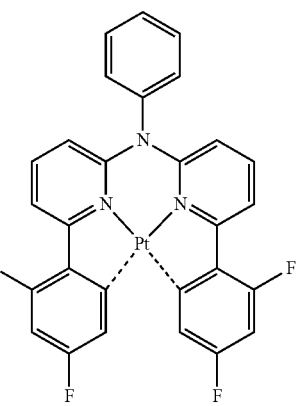
PD43 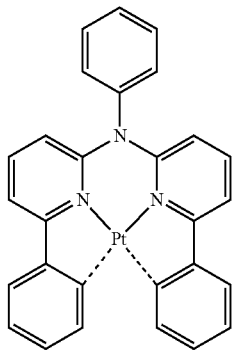
PD44 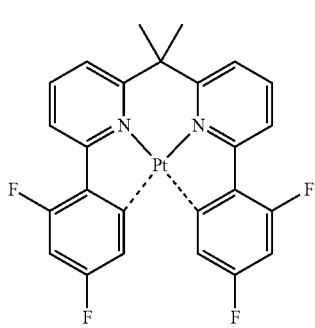

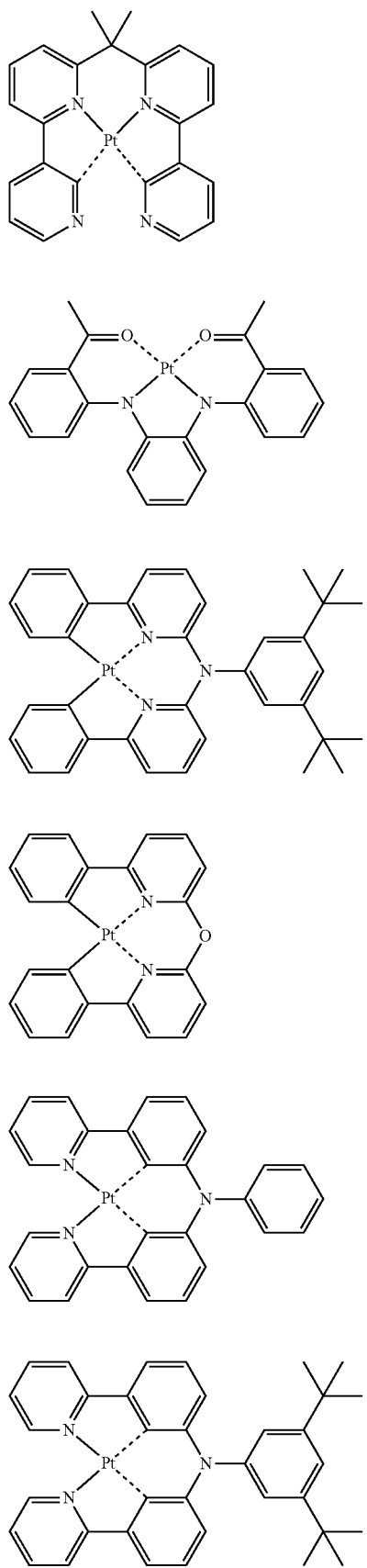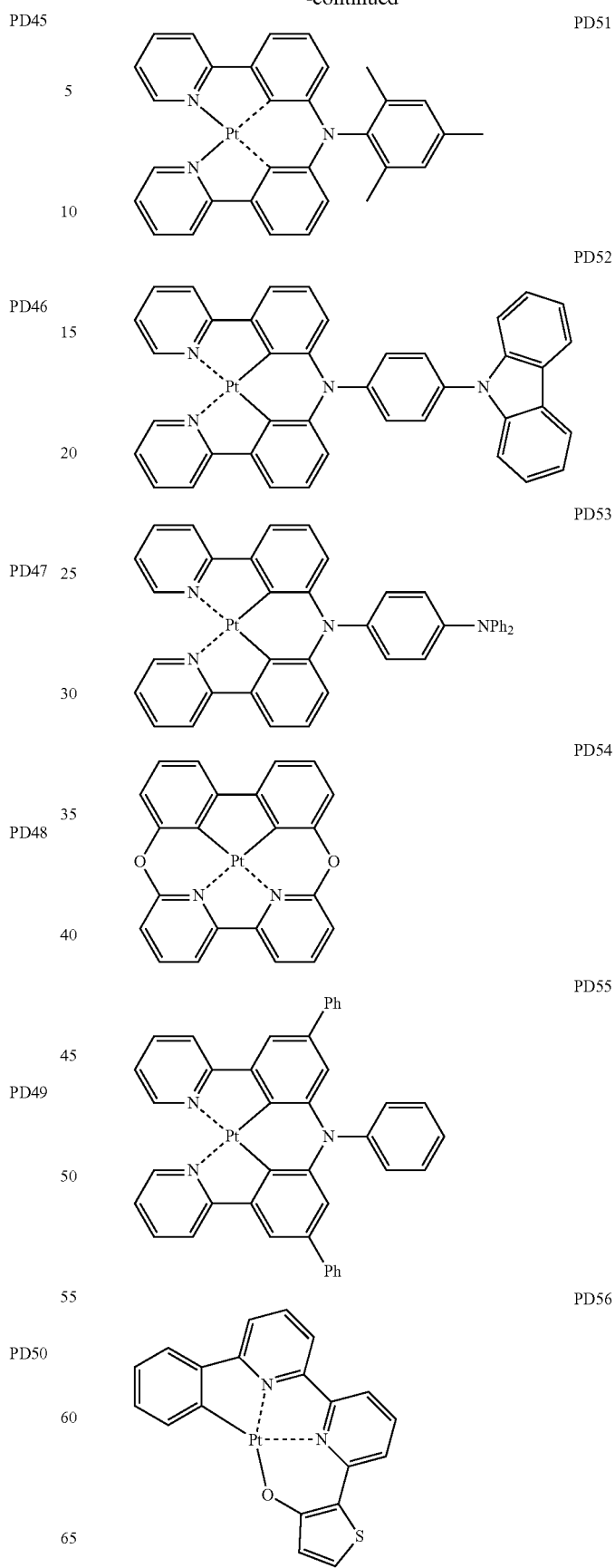

PD57
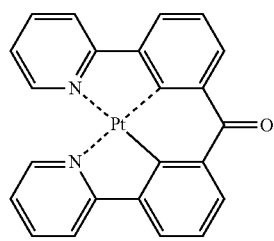
PD62
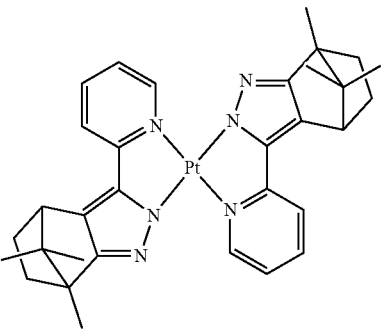
PD58
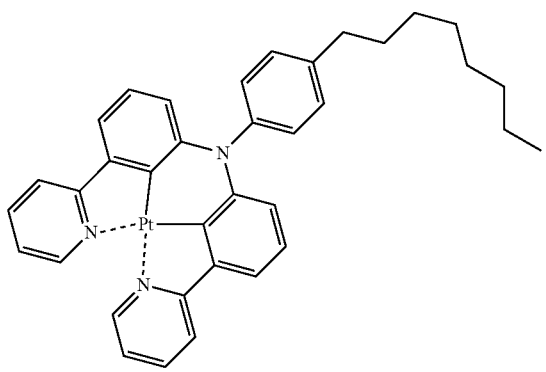
PD63
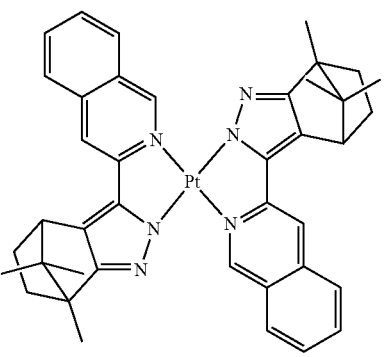
PD59
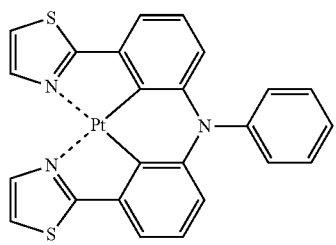
PD64
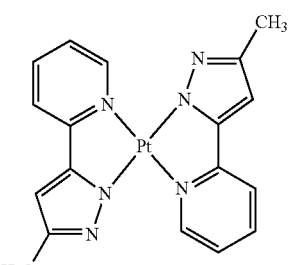
PD60
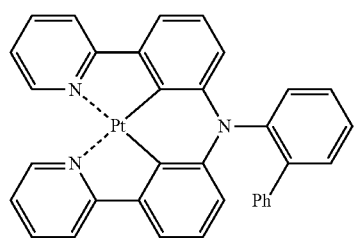
PD65
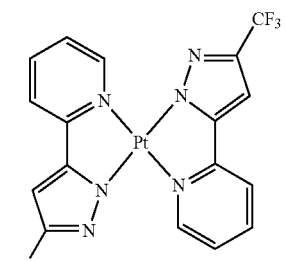
PD61
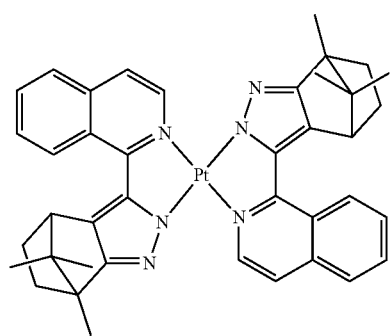
PD66
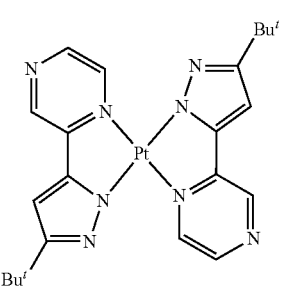

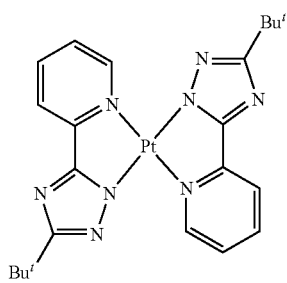
PD67
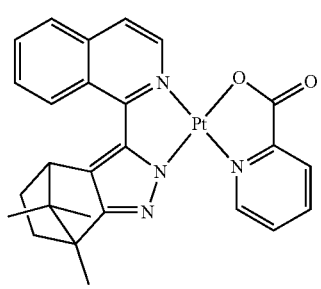
PD68
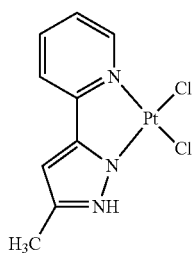
PD69
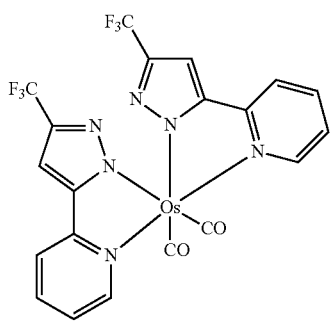
PD70
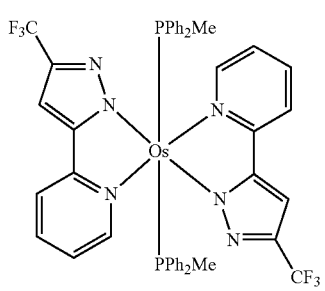
PD71
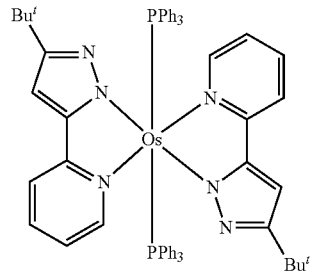
PD72
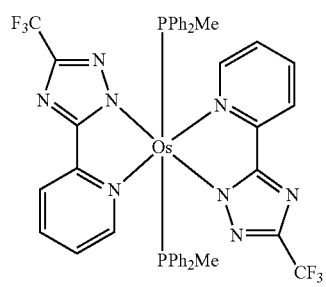
PD73
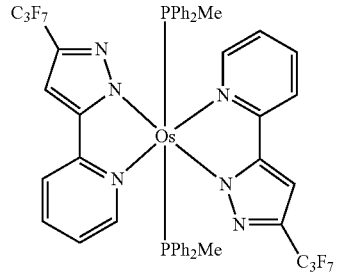
PD74
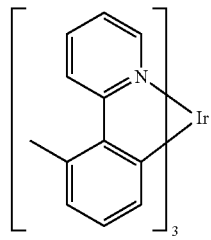
PD75
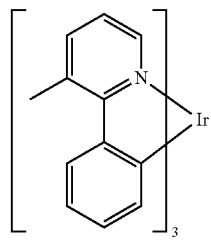
PD76
PD77

PD78

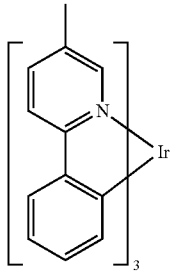

Flr6

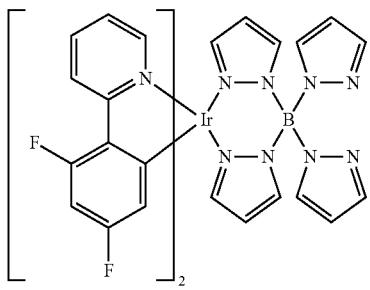

An amount of the dopant in the emission layer may be, in general, in a range of about 0.01 to about 20 parts by weight based on 100 parts by weight of the host, but is not limited thereto. While not wishing to be bound by theory, it is understood that when the amount of the dopant is within this range, extinction-free luminance may be embodied.

The organic material layer R10 may further include an electron transport region disposed between the emission layer and the first electrode E10, and may further include a hole transport region disposed between the emission layer and the second electrode E20.

The hole transport region may include at least one selected from a hole injection layer, a hole transport layer, an electron blocking layer, and a buffer layer.

The hole transport region may include only either a hole injection layer or a hole transport layer. In some embodiments, the hole transport region may have a structure of hole injection layer/hole transport layer or hole injection layer/hole transport layer/electron blocking layer, which are sequentially disposed from the second electrode E20.

A hole injection layer may be formed on the first electrode 11 by using one or more methods selected from vacuum deposition, spin coating, casting, or Langmuir-Blodgett (LB) deposition.

When a hole injection layer is formed by vacuum deposition, the deposition conditions may vary depending on a material that is used to form the hole injection layer, and the structure and thermal characteristics of the hole injection layer. For example, the deposition conditions may include a deposition temperature of about 100 to about 500° C., a vacuum pressure of about $10^{-8}$ to about $10^{-3}$ torr, and a deposition rate of about 0.01 to about 100 Angstroms per second (Å/sec). However, the deposition conditions are not limited thereto.

When the hole injection layer is formed using spin coating, coating conditions may vary depending on the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4''-tris(N-carbazolyl)triphenylamine (TCTA), polyaniline/dodecylbenzene sulfonic acid (PANI/DBSA), poly(3,4-ethylenedioxythiophene)/poly(4-styrene sulfonate) (PEDOT/PSS), polyaniline/camphor sulfonic acid (PANI/CSA), (polyaniline)/poly(4-styrene sulfonate) (PANI/PSS), a compound represented by Formula 201 below, and a compound represented by Formula 202 below:

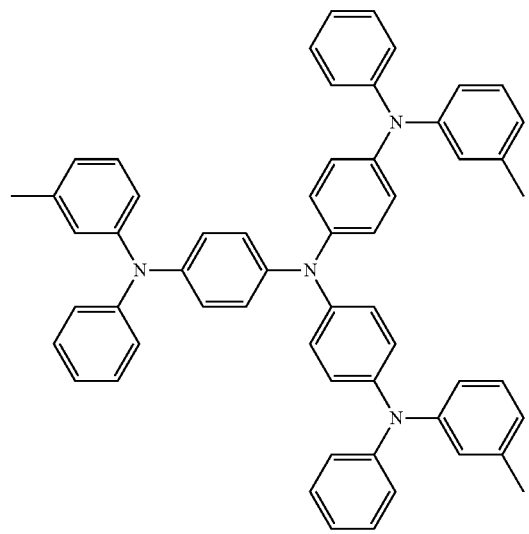

m-MTDATA

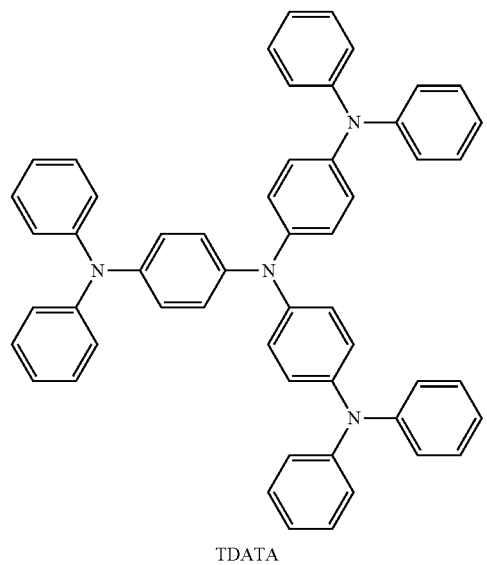

TDATA

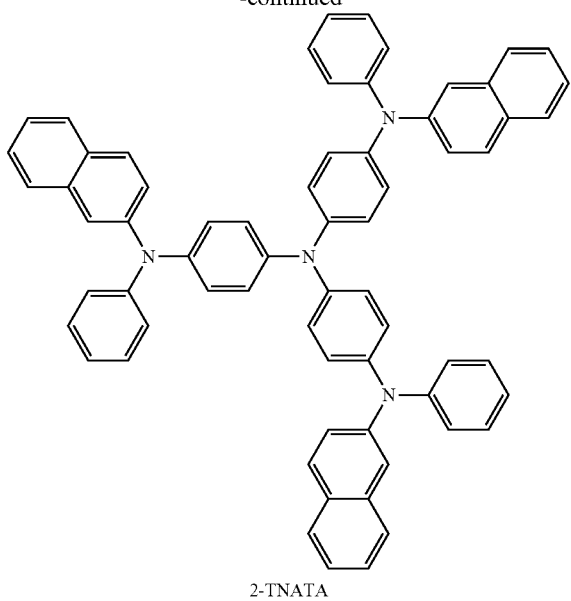
2-TNATA
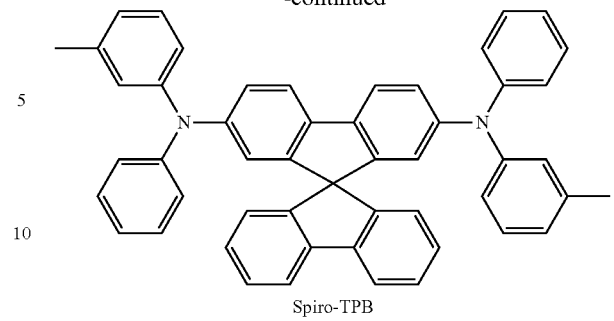
Spiro-TPB
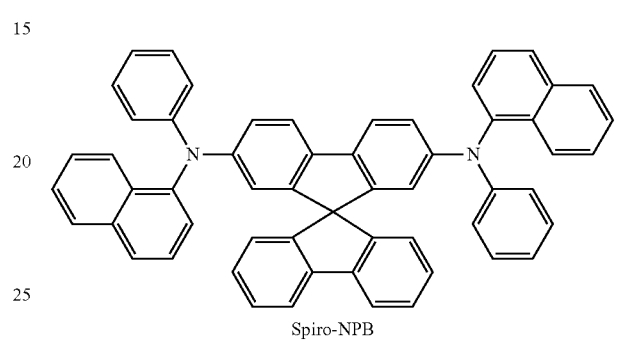
Spiro-NPB
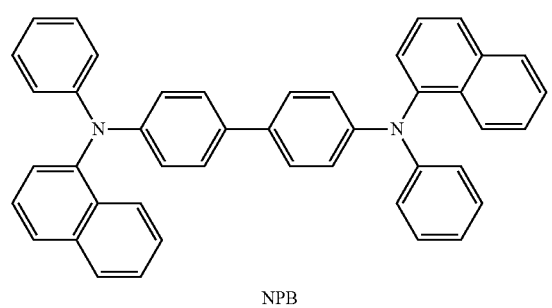
NPB
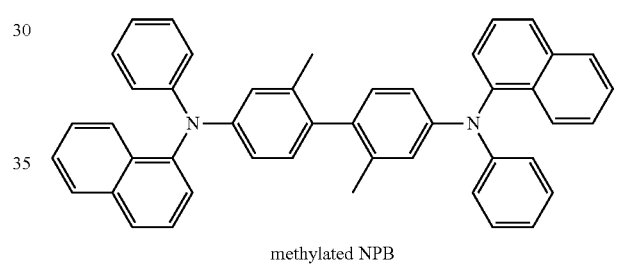
methylated NPB
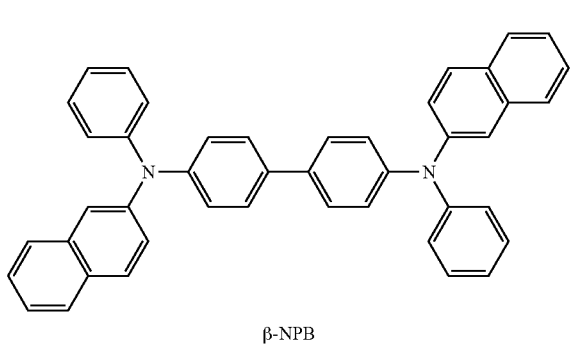
β-NPB
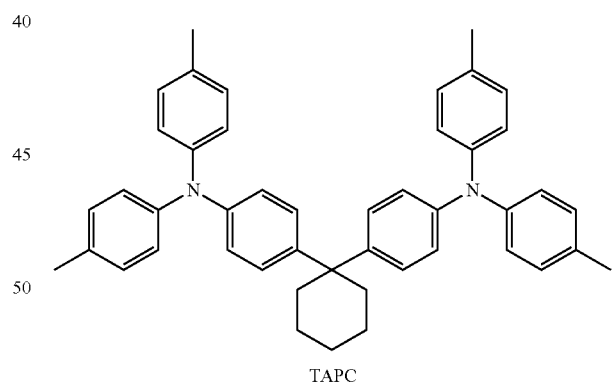
TAPC
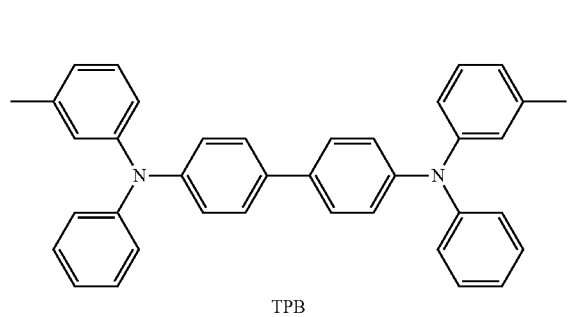
TPB
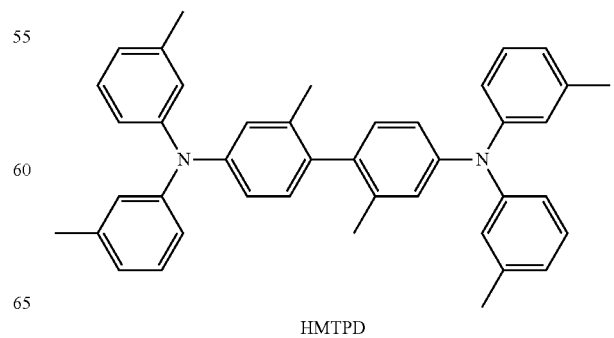
HMTPD Formula 201

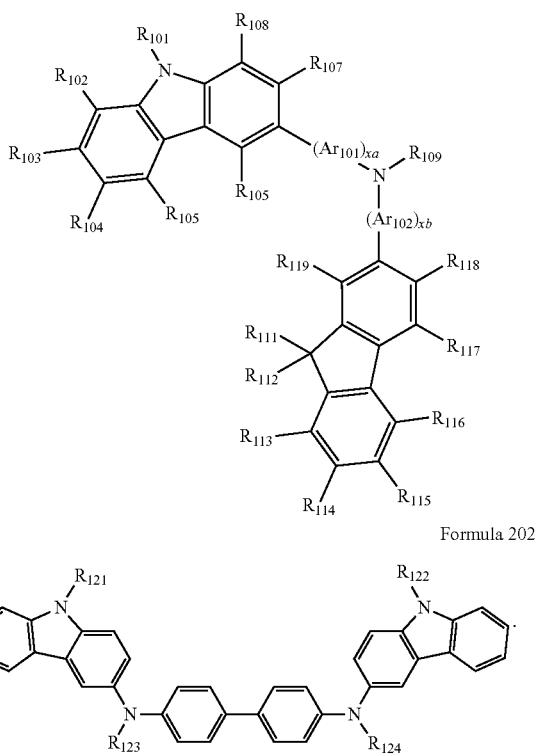

Formula 202

R101 to R108, R111 to R119, and R121 to R124 in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, etc.), and a $C_1$-$C_{10}$ alkoxy group (for example, a methoxy group, an ethoxy group, a propoxy group, a butoxy group, a pentoxy group, etc.);

a $C_1$-$C_{10}$ alkyl group and a $C_1$-$C_{10}$ alkoxy group, each substituted with one or more selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group, and a pyrenyl group, each substituted with one or more selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments are not limited thereto.

$R_{109}$ in Formula 201 may be selected from:

a phenyl group, a naphthyl group, an anthracenyl group, and a pyridinyl group; and a phenyl group, a naphthyl group, an anthracenyl group, and a pyridinyl group, each substituted with one or more selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

In some embodiments, the compound represented by Formula 201 may be represented by Formula 201A, but is not limited thereto:

Formula 201A

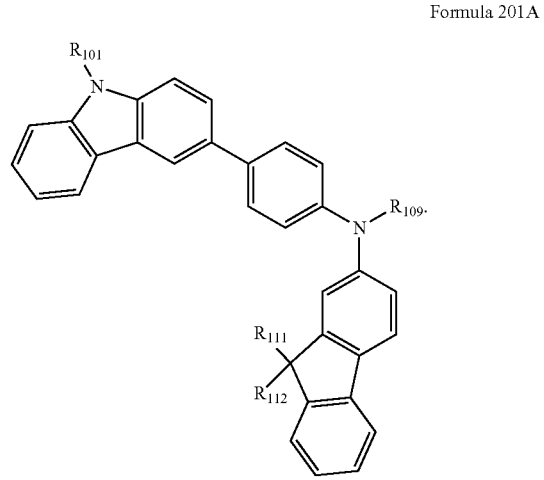

In Formula 201, $Ar_{101}$ and $Ar_{102}$ may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one substituent selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, and a monovalent non-aromatic fused heteropolycyclic group.

In Formula 201, xa and xb may each independently be an integer of 0 to 5, or 0, 1, or 2. For example, xa may be 1, and xb may be 0, but embodiments are not limited thereto.

$R_{101}$, $R_{111}$, $R_{112}$, and $R_{109}$ in Formula 201A may be understood by referring to the descriptions thereof provided above.
For example, the compound represented by Formula 201 and the compound represented by Formula 202 may each include Compounds HT1 to HT20, but are not limited thereto:
HT1
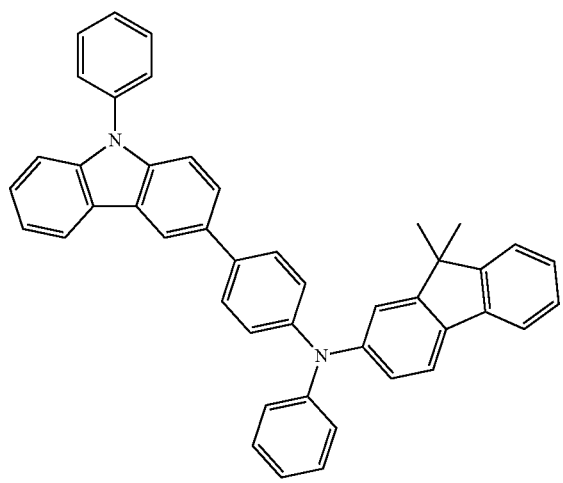
HT2
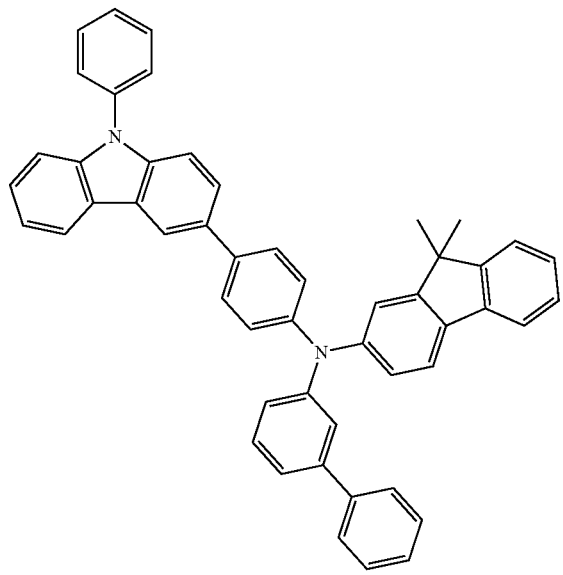
HT3
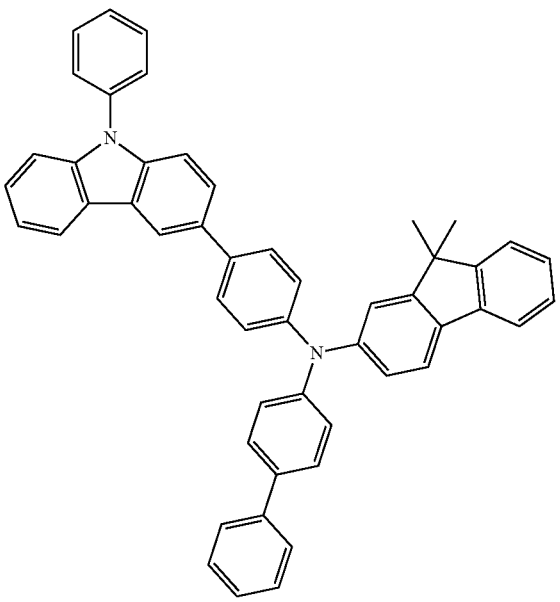
HT4
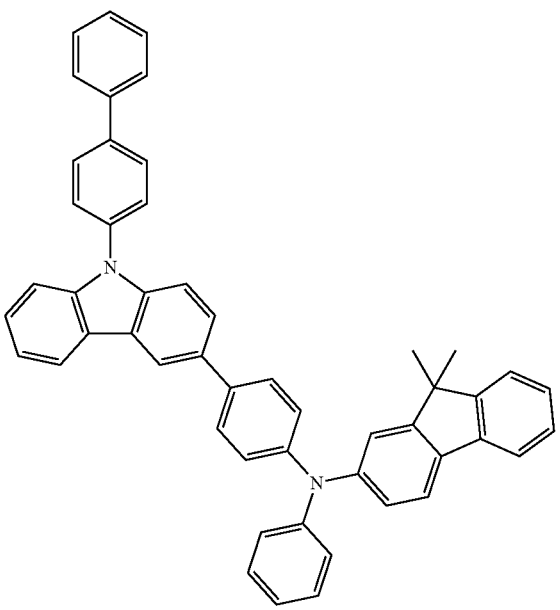

HT5
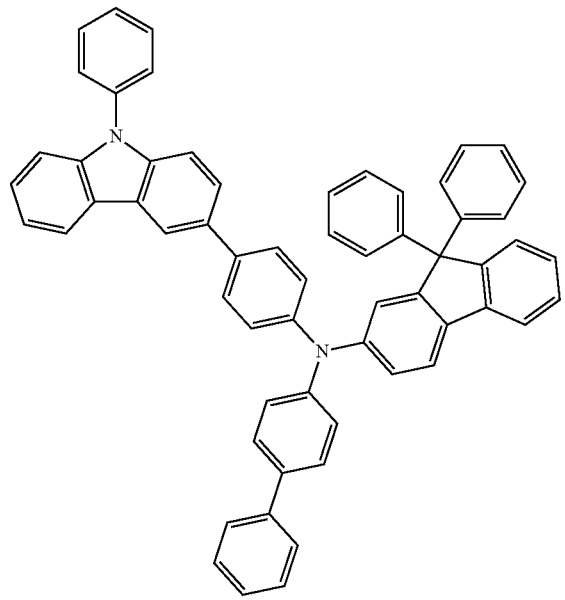
HT7
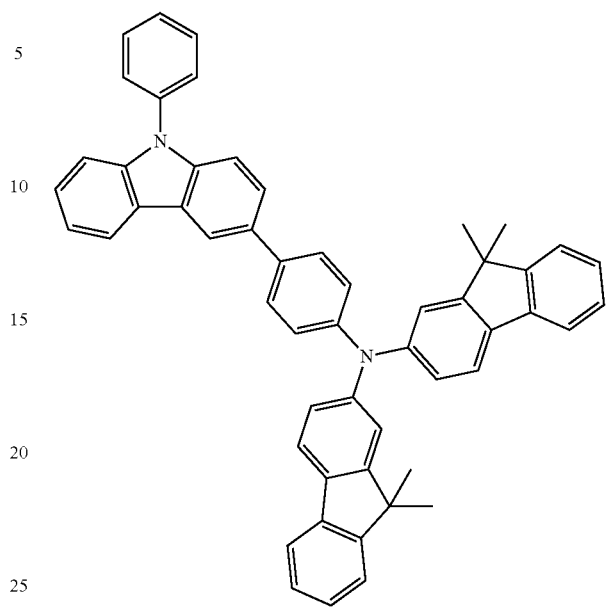
HT8
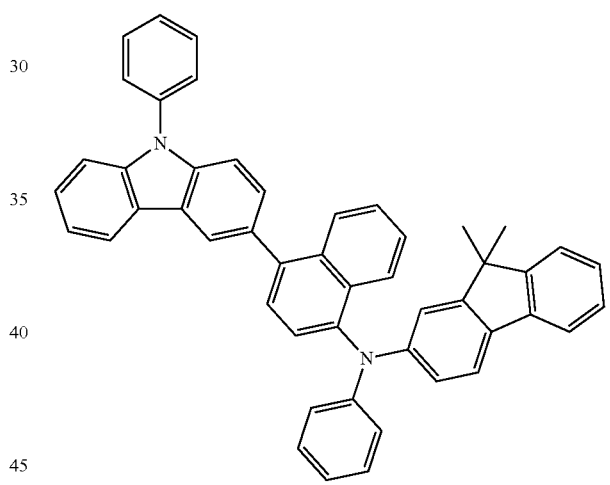
HT6
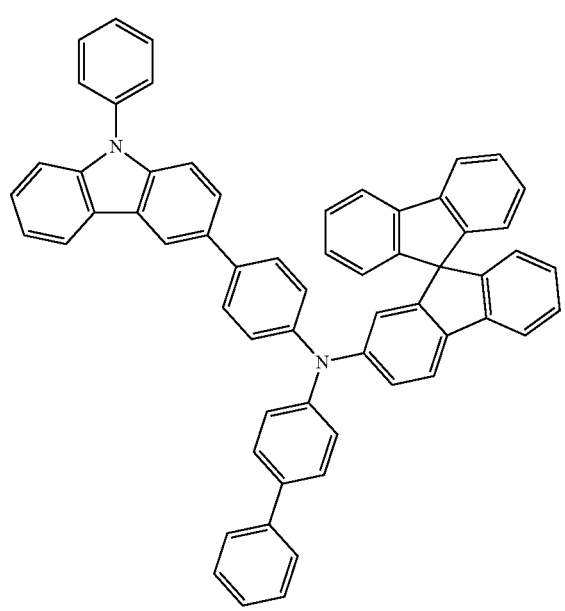
HT9
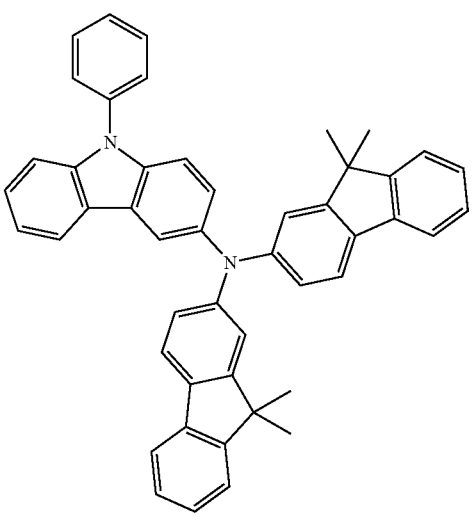

HT10
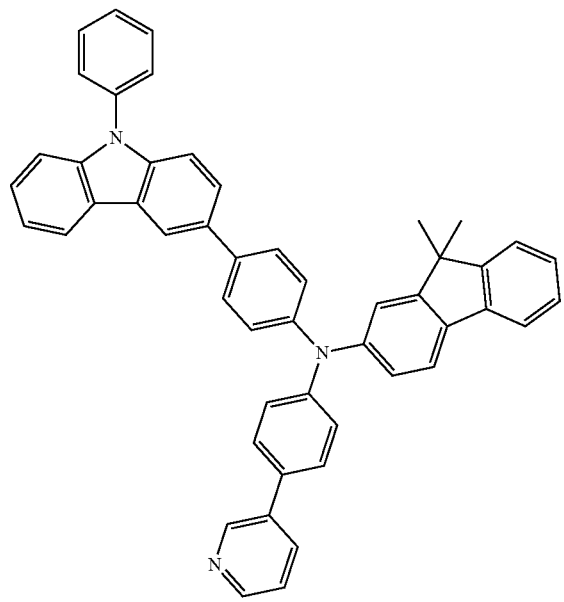
HT11
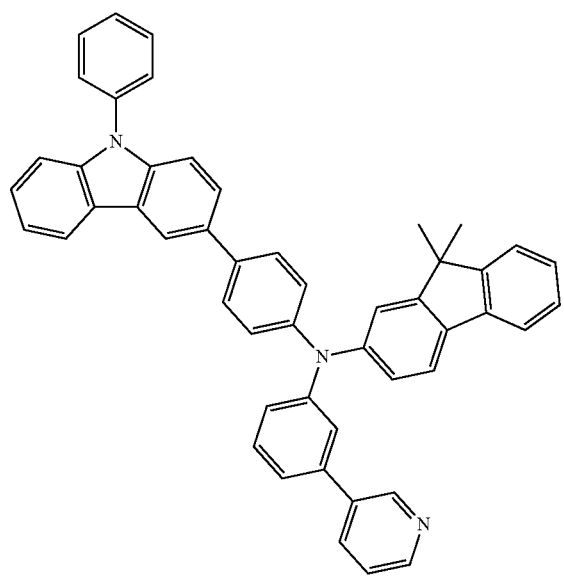
HT12
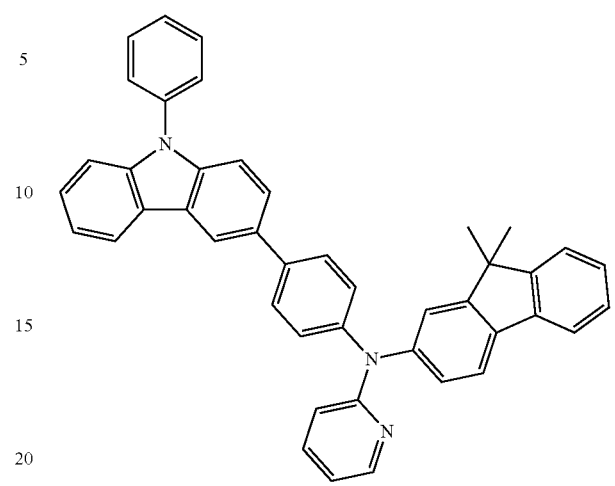
HT13
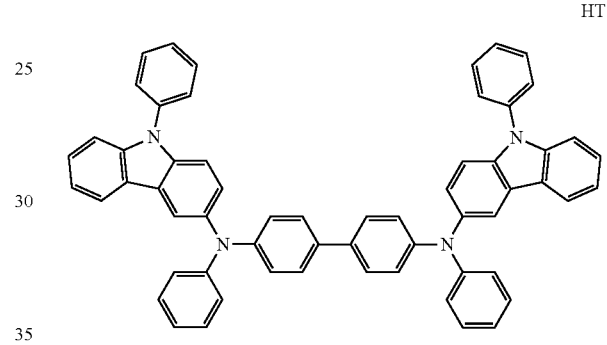
HT14
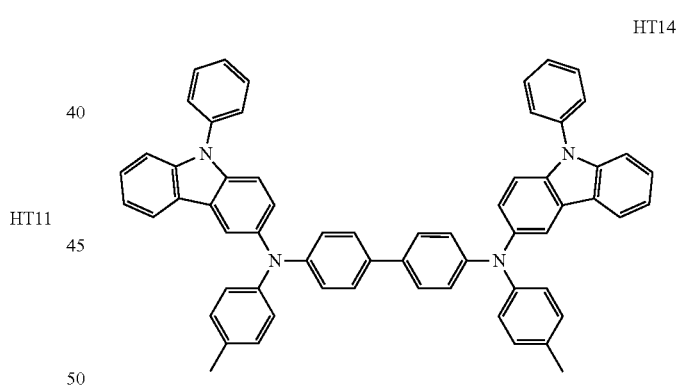
HT15
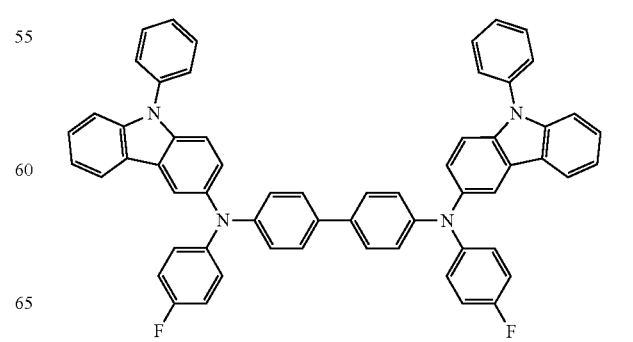

HT16

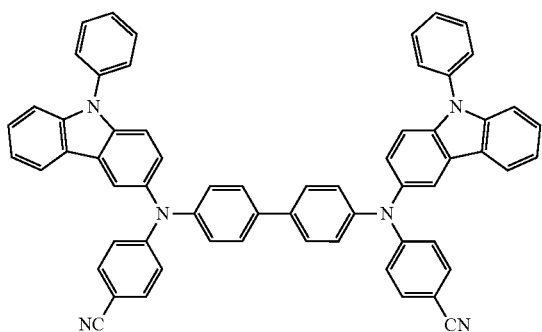

HT20

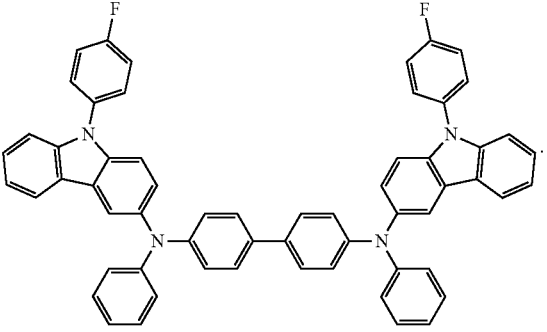

HT17

HT18

HT19

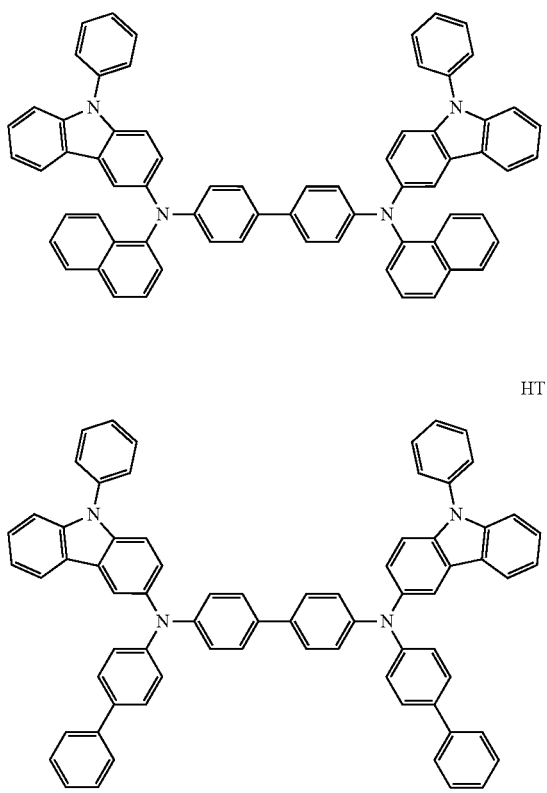

A thickness of the hole transport region may be in a range of about 100 Angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 or HP-1, but are not limited thereto.

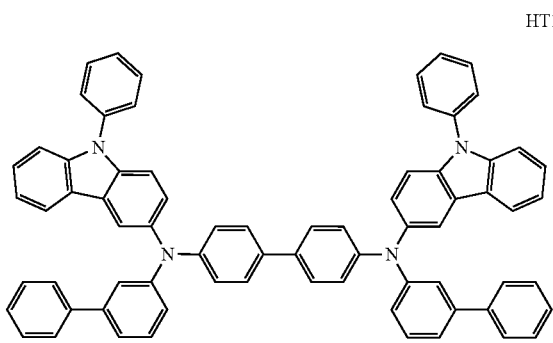

Compound HT-D1

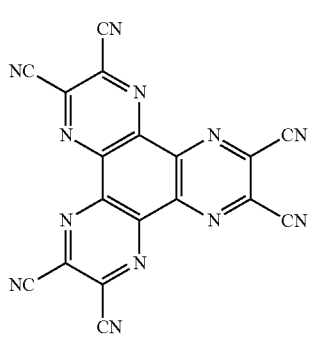

F4-TCNQ

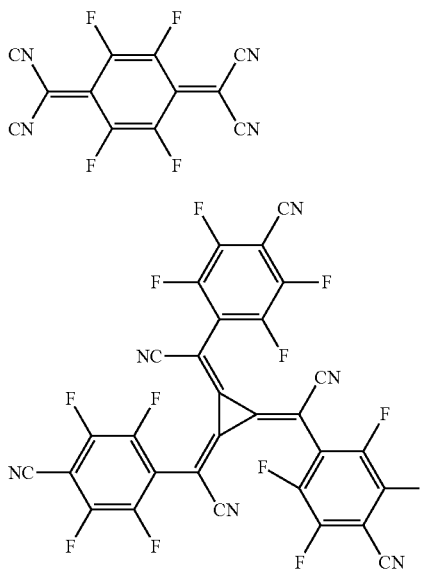

HP-1

The hole transport region may include a buffer layer.

Also, the buffer layer may compensate for an optical resonance distance depending on a wavelength of light emitted from the emission layer, and thus, efficiency of a formed organic light-emitting device may be improved.

The electron transport region may further include an electron blocking layer. The electron blocking layer may include, for example, mCP, but a material therefor is not limited thereto.

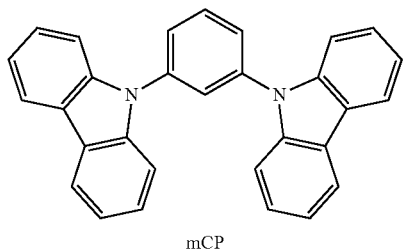 [SMILES: c1cc(-n2c3ccccc3c3ccccc32)cc(-n2c3ccccc3c3ccccc32)c1]

mCP

When the organic light-emitting device is a full-color organic light-emitting device, the emission layer may be patterned into a red emission layer, a green emission layer, and a blue emission layer. In some embodiments, due to a stack structure including a red emission layer, a green emission layer, and/or a blue emission layer, the emission layer may emit white light.

The emission layer includes a host and a dopant as described above.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

The electron transport region may include at least one selected from a hole blocking layer, an electron transport layer, and an electron injection layer.

For example, the electron transport region may have a structure of hole blocking layer/electron transport layer/ electron injection layer or a structure of electron transport layer/electron injection layer, but the structure of the electron transport region is not limited thereto. The electron transport layer may have a single-layered structure or a multi-layer structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP and Bphen, but may also include other materials.

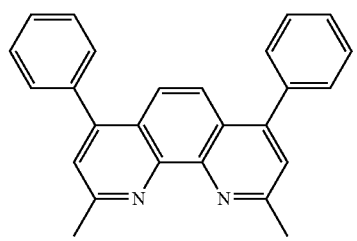

BCP

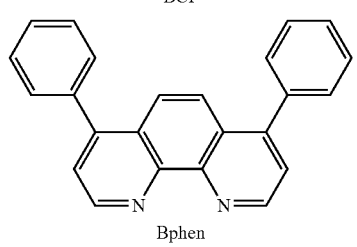

Bphen

A thickness of the hole blocking layer may be in a range of about 20 Å to about 1,000 Å, for example, about 30 Å to about 300 Å. While not wishing to be bound by theory, it is understood that when the thickness of the hole blocking layer is within these ranges, the hole blocking layer may have improved hole blocking ability without a substantial increase in driving voltage.

The electron transport layer may further include at least one compound selected from BCP, Bphen, Alq$_3$, BAlq, TAZ, and NTAZ.

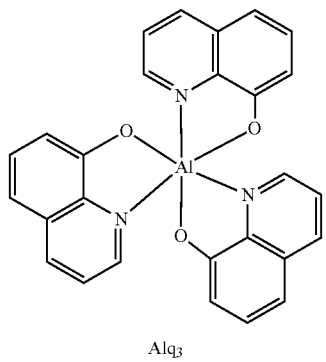

Alq$_3$

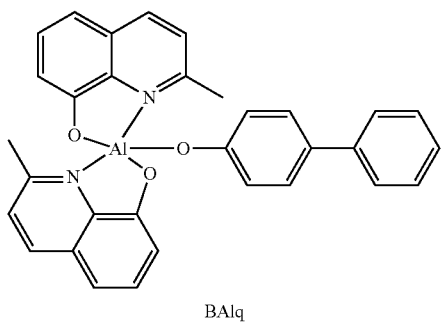

BAlq

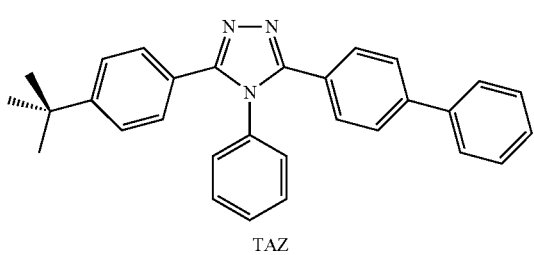

TAZ

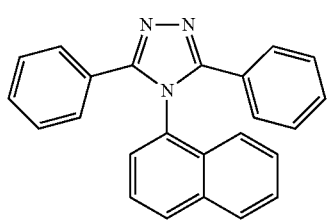

NTAZ

In some embodiments, the electron transport layer may include at least one compound selected from Compounds ET1, ET2, and ET3, but embodiments are not limited thereto:

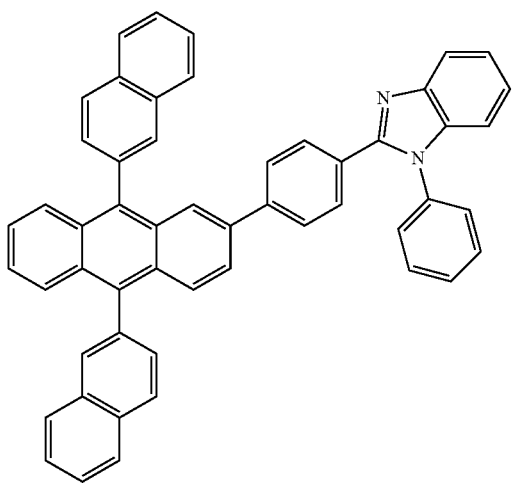

ET1

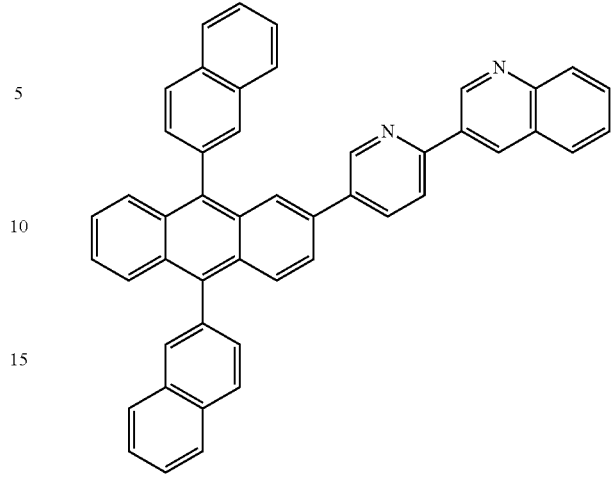

ET2

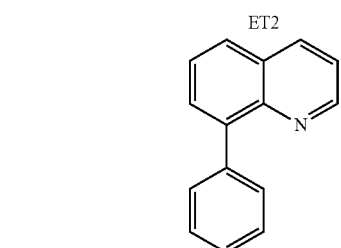

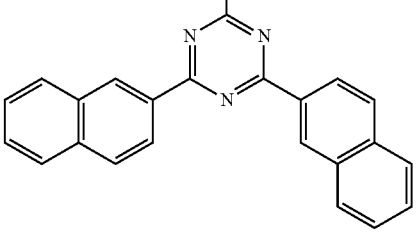

ET3

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

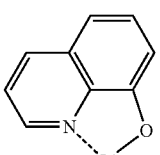

ET-D1

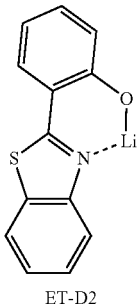

ET-D2

The electron transport region may include an electron injection layer (EIL) that promotes flow of electrons from the first electrode E10 thereinto.

The electron injection layer may include at least one selected from, LiF, NaCl, CsF, Li$_2$O, BaO, and LiQ.

A thickness of the electron injection layer may be in a range of about 1 Å to about 100 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The emission layer of the organic light-emitting device may include a host and a dopant as described above, and the magnetic field provided by the magnetic field applying unit (i.e., magnetic field applying member) may maximize spin-mixing or spin-flipping occurring between a singlet exciton and a triplet exciton generated in the emission layer, thereby increasing reverse intersystem crossing (RISC) from a triplet excited state to a singlet excited state. The emission layer includes: i) a host of which the absolute value of a difference between the singlet ($S_1$) energy and the triplet ($T_1$) energy is 0.3 eV or less, and ii) a dopant that enables effective energy transition from the host. Accordingly, a decrease in luminance efficiency may not occur after the application of a magnetic field.

For a comparative organic light-emitting device manufactured in the conditions as shown in Table 1, assuming that a relative value of its luminescent efficiency (at 0.5 milliamperes per square centimeter, mA/cm$^2$) of the comparative organic light-emitting device before applying of a magnetic field (that is, B=0) is set to "1", when a magnetic field is applied (B=no more than 6,000 Gauss) to the comparative organic light-emitting device, a relative value of its luminescent efficiency (at 0.5 mA/cm$^2$) may be "greater than 0.99 and less than 1." This result may be due to high $\Delta E_{ST}$ (the absolute value of the difference between the singlet energy and the triplet energy) of Compound B (host) used in the emission layer of the comparative organic light-emitting device R. While not wishing to be bound by theory, it is understood that when $\Delta E_{ST}$ is high, even when a magnetic field is applied, Compound B may not substantially undergo the improvement in RISC efficiency.

TABLE 1

| Cathode electrode | Al is deposited on an electron injection layer below to form a cathode electrode having a thickness of 1,000 Å. |
|---|---|
| Electron injection layer | LiF is deposited on an electron transport layer below to form an electron injection layer having a thickness of 5 Å. |
| Electron transport layer | 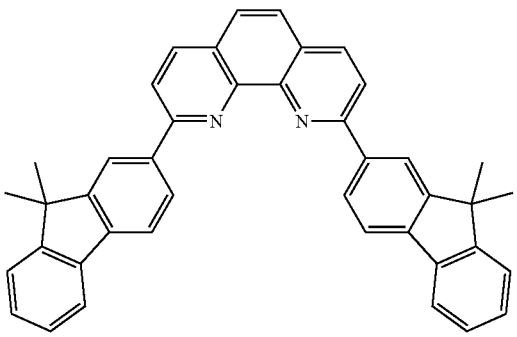<br>The compound illustrated above is deposited on an emission layer below to form an electron transport layer having a thickness of 200 Å.<br>Compound A |
| Emission layer | 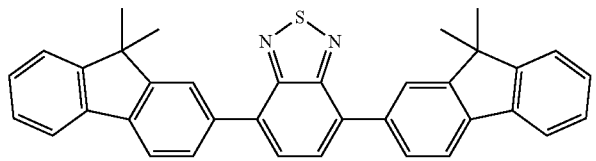 [SMILES: CC1(C)c2ccccc2-c2ccc(-c3ccc(-c4ccc5c(c4)C(C)(C)c4ccccc4-5)c4nsnc34)cc21] |

TABLE 1-continued

Compound B

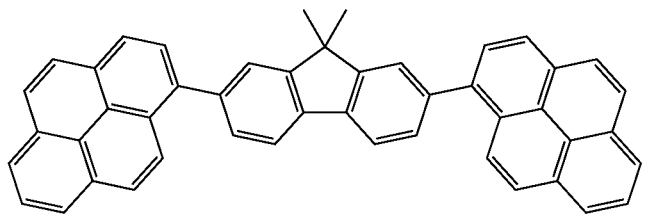 [SMILES: CC1(C)c2cc(-c3ccc4ccc5cccc6ccc3c4c56)ccc2-c2ccc(-c3ccc4ccc5cccc6ccc3c4c56)cc21]

Compound A (dopant) and Compound B (host) are co-deposited on a hole transport layer below at deposition rates of 0.1 Å/sec and 1 Å/sec, respectively, to form an emission layer having a thickness of 1,600 Å.

Hole transport layer

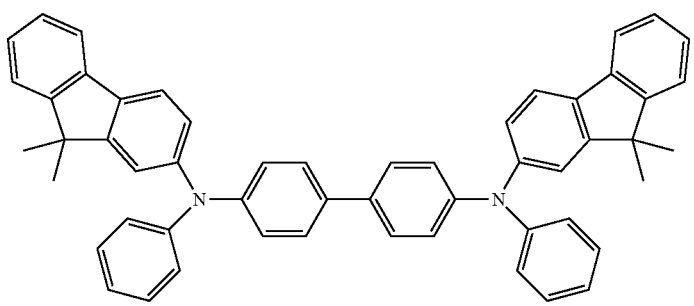 [SMILES: CC1(C)c2ccccc2-c2ccc(N(c3ccccc3)c3ccc(-c4ccc(N(c5ccccc5)c5ccc6c(c5)C(C)(C)c5ccccc5-6)cc4)cc3)cc21]

A mixture of the compound illustrated above and chloroform is spin-coated on an anode electrode below at a rate of 500 rpm for 10 seconds and then, at a coating rate of 1,000 rpm for 40 seconds, to form a hole transport layer.

Anode electrode  ITO film (120 nm)

However, an organic light-emitting device according to an embodiment may include: i) a host having 0.3 eV or less of an absolute value of a difference between the singlet ($S_1$) energy and the triplet ($T_1$) energy and ii) a dopant that enables effective energy transition from the host, and when a magnetic field is applied to the organic light-emitting device, the efficiency of RISC from a triplet excited state to a singlet excited state in the emission layer is high and thus, singlet harvesting may efficiently occur.

The singlet energy and the triplet energy (evaluated by using Density Functional Theory method employing Gaussian program that is structurally optimized at a level of B3LYP/6-31G(d,p)), and $\Delta E_{ST}$ of Compound A, Compound B, exciplex formed from MeO and 3TPYMB, and DBP are shown in Table 2 below.

TABLE 2

|  | Singlet ($S_1$) energy (eV) | Triplet ($T_1$) energy (eV) | $\Delta E_{ST}$ ($|S_1 - T_1|$) (eV) |
|---|---|---|---|
| Compound A | 2.526 | 1.741 | 0.786 |

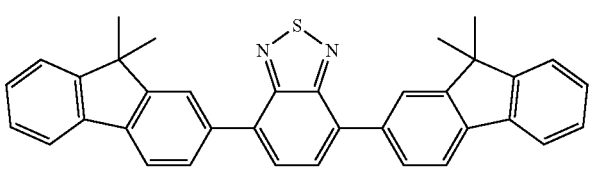 [SMILES: CC1(C)c2ccccc2-c2ccc(-c3ccc(-c4ccc5c(c4)C(C)(C)c4ccccc4-5)c4nsnc34)cc21]

TABLE 2-continued
| | Singlet ($S_1$) energy (eV) | Triplet ($T_1$) energy (eV) | $\Delta E_{ST}$ ($|S_1 - T_1|$) (eV) |
| --- | --- | --- | --- |
| Compound B | 3.123 | 2.028 | 1.095 |
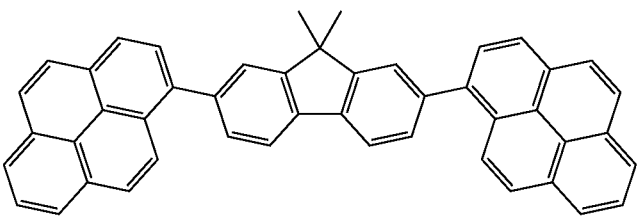 [SMILES: CC1(C)c2cc(-c3ccc4ccc5cccc6ccc3c4c56)ccc2-c2ccc(-c3ccc4ccc5cccc6ccc3c4c56)cc21]
| | | | |
| --- | --- | --- | --- |
| Exciplex formed from MeO-TPD and 3TPYMB | 2.330 | 2.330 | ~0.0 |
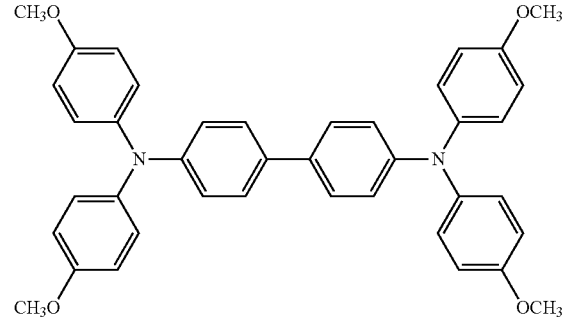
MeO-TPD
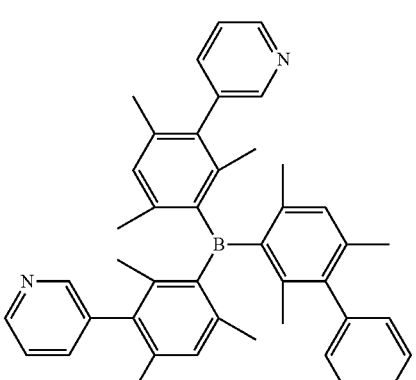
3TPYMB
| | | | |
| --- | --- | --- | --- |
| DBP (Compound FD(10)) | 2.161 | 1.223 | 0.938 |
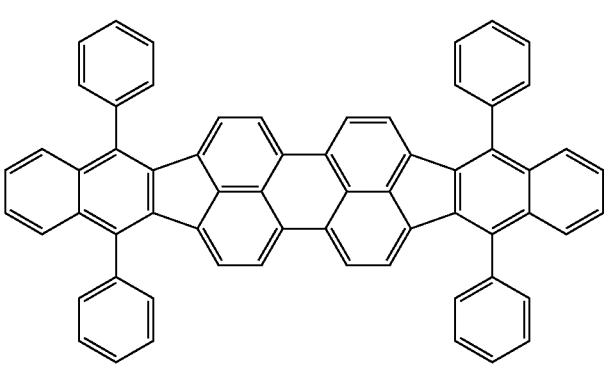 [SMILES: c1ccc(-c2c3c(c(-c4ccccc4)c4ccccc24)-c2ccc4c5ccc6c7c(ccc(c8ccc-3c2c84)c75)-c2c-6c(-c3ccccc3)c3ccccc3c2-c2ccccc2)cc1]

The magnetic field applying unit may be an external magnetic field applying member which may apply a magnetic field from the outside of the organic light-emitting device. For example, the magnetic field applying unit may be an attachable magnet or the like, which may be attached to the organic light-emitting device. However, the magnetic field applying unit is not limited thereto. The magnetic field applying unit may further include an apparatus for controlling intensity of magnetic field.

In some embodiments, the magnetic field applying unit may apply a magnetic field in a range of −2,000 Gauss to 2,000 Gauss to the organic light-emitting device, but is not limited thereto.

A $C_1$-$C_{60}$ alkyl group as used herein refers to a linear or branched aliphatic saturated hydrocarbon monovalent group having 1 to 60 carbon atoms. Detailed examples thereof are a methyl group, an ethyl group, a propyl group, an iso-butyl group, a sec-butyl group, a tert-butyl group, a pentyl group, an iso-amyl group, and a hexyl group. A $C_1$-$C_{60}$ alkylene group as used herein refers to a divalent group having the same structure as the $C_1$-$C_{60}$ alkyl group.

A $C_1$-$C_{60}$ alkoxy group as used herein refers to a monovalent group represented by —$OA_{101}$ (wherein $A_{101}$ is the $C_1$-$C_{60}$ alkyl group). Detailed examples thereof are a methoxy group, an ethoxy group, and an iso-propyloxy (iso-propoxy) group.

A $C_2$-$C_{60}$ alkenyl group as used herein has a structure including at least one carbon-carbon double bond in the middle or at the terminal of the $C_2$-$C_{60}$ alkyl group. Detailed examples thereof are an ethenyl group, a propenyl group, and a butenyl group. A $C_2$-$C_{60}$ alkenylene group as used herein refers to a divalent group having the same structure as the $C_2$-$C_{60}$ alkenyl group.

A $C_2$-$C_{60}$ alkynyl group as used herein has a structure including at least one carbon-carbon triple bond in the middle or at the terminal of the $C_2$-$C_{60}$ alkyl group. Detailed examples thereof are an ethynyl group and a propynyl group. A $C_2$-$C_{60}$ alkynylene group as used herein refers to a divalent group having the same structure as the $C_2$-$C_{60}$ alkynyl group.

A $C_5$-$C_{60}$ carbocyclic group as used herein refers to a monovalent, divalent, or higher valency group containing only carbon atoms in the ring(s) thereof, which may be saturated, unsaturated, or aromatic, having 5 to 60 carbon atoms. Detailed examples of the $C_6$-$C_{60}$ carbocyclic group are a cyclopentyl group, a cyclohexenyl group, a decalinyl group, a phenyl group, a naphthyl group, an anthracenyl group, a phenanthrenyl group, a pyrenyl group, and a chrysenyl group. When the $C_6$-$C_{60}$ carbocyclic group includes two or more rings, the rings may be condensed to each other or linked via a bond.

A $C_1$-$C_{60}$ heterocarbocyclic group as used herein refers to a monovalent, divalent or higher valency group having one or more rings, at least one carbon atom and at least one heteroatom selected from N, O, P, Si, and S as a ring-forming atom in the ring(s) thereof, which may be saturated, unsaturated, or aromatic, having 5 to 60 carbon atoms. Detailed examples of the $C_6$-$C_{60}$ carbocyclic group are a cyclopentyl group, a decalinyl group, a phenyl group, a naphthyl group, a pyridinyl group, a pyrimidinyl group, a pyrazinyl group, a pyridazinyl group, a triazinyl group, a quinolinyl group, and an isoquinolinyl group. When the $C_6$-$C_{60}$ heterocarbocyclic group includes two or more rings, the rings may be condensed to each other.

A $C_3$-$C_{10}$ cycloalkyl group as used herein refers to a monovalent saturated hydrocarbon monocyclic group having 3 to 10 carbon atoms. Detailed examples thereof are a cyclopropyl group, a cyclobutyl group, a cyclopentyl group, a cyclohexyl group, and a cycloheptyl group. A $C_3$-$C_{10}$ cycloalkylene group as used herein refers to a divalent group having the same structure as the $C_3$-$C_{10}$ cycloalkyl group.

A $C_2$-$C_{10}$ heterocycloalkyl group as used herein refers to a monovalent monocyclic group having at least one heteroatom selected from N, O, P, Si, and S as a ring-forming atom and 2 to 10 carbon atoms. Detailed examples thereof are a tetrahydrofuranyl group and a tetrahydrothiophenyl group. A $C_2$-$C_{10}$ heterocycloalkylene group as used herein refers to a divalent group having the same structure as the $C_2$-$C_{10}$ heterocycloalkyl group.

A $C_3$-$C_{10}$ cycloalkenyl group as used herein refers to a monovalent monocyclic group that has 3 to 10 carbon atoms and at least one carbon-carbon double bond in the ring thereof, and which is not aromatic. Detailed examples thereof are a cyclopentenyl group, a cyclohexenyl group, and a cycloheptenyl group. A $C_3$-$C_{10}$ cycloalkenylene group as used herein refers to a divalent group having the same structure as the $C_3$-$C_{10}$ cycloalkenyl group.

A $C_2$-$C_{10}$ heterocycloalkenyl group as used herein refers to a monovalent monocyclic group that has at least one heteroatom selected from N, O, P, Si, and S as a ring-forming atom, 2 to 10 carbon atoms, and at least one double bond in its ring. Detailed examples of the $C_1$-$C_{10}$ heterocycloalkenyl group are a 2,3-dihydrofuranyl group and a 2,3-dihydrothiophenyl group. A $C_2$-$C_{10}$ heterocycloalkenylene group as used herein refers to a divalent group having the same structure as the $C_2$-$C_{10}$ heterocycloalkenyl group.

A $C_6$-$C_{60}$ aryl group as used herein refers to a monovalent group having a carbocyclic aromatic system having 6 to 60 carbon atoms, and a $C_6$-$C_{60}$ arylene group as used herein refers to a divalent group having a carbocyclic aromatic system having 6 to 60 carbon atoms. Detailed examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

A $C_1$-$C_{60}$ heteroaryl group as used herein refers to a monovalent group having an aromatic system that includes at least one heteroatom selected from N, O, P, Si, and S as a ring-forming atom and has 1 to 60 carbon atoms. A $C_1$-$C_{60}$ heteroarylene group as used herein refers to a divalent group having a carbocyclic aromatic system that includes at least one heteroatom selected from N, O, P, Si, and S as a ring-forming atom and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl group and the $C_2$-$C_{60}$ heteroarylene group each include two or more rings, the rings may be fused to each other.

A $C_6$-$C_{60}$ aryloxy group as used herein refers to —$OA_{102}$ (wherein $A_{102}$ is the $C_6$-$C_{60}$ aryl group), and a $C_6$-$C_{60}$ arylthio group as used herein refers to —$SA_{103}$ (wherein $A_{103}$ is the $C_6$-$C_{60}$ aryl group).

A monovalent non-aromatic condensed polycyclic group as used herein refers to a monovalent group that has two or more rings condensed to each other, includes only carbon atoms as a ring forming atom (for example, having 8 to 60 carbon atoms), and which is non-aromatic in the entire molecular structure. A detailed example of the monovalent non-aromatic condensed polycyclic group is a fluorenyl group. A divalent non-aromatic condensed polycyclic group as used herein refers to a divalent group having the same structure as the monovalent non-aromatic condensed polycyclic group.

A monovalent non-aromatic condensed heteropolycyclic group as used herein refers to a monovalent group that has two or more rings condensed to each other, includes a heteroatom selected from N, O, P, Si, and S, other than carbon atoms (for example, having 2 to 60 carbon atoms), as a ring forming atom, and which is non-aromatic in the entire molecular structure. An example of the monovalent non-aromatic fused heteropolycyclic group is a carbazolyl group. A divalent non-aromatic fused heteropolycyclic group as used herein refers to a divalent group having the same structure as the monovalent non-aromatic fused heteropolycyclic group.

As used herein, at least one of substituents of the substituted $C_3$-$C_{10}$ cycloalkylene group, substituted $C_2$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic fused polycyclic group, substituted divalent non-aromatic fused heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_2$-$C_{10}$ heterocycloalkyl group, substituted $C_3$-$C_{10}$ cycloalkenyl group, substituted $C_2$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —N($Q_{11}$)($Q_{12}$), —Si($Q_{13}$)($Q_{14}$)($Q_{15}$), and —B($Q_{16}$)($Q_{17}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), and —B($Q_{26}$)($Q_{27}$); and —N($Q_{31}$)($Q_{32}$), —Si($Q_{33}$)($Q_{34}$)($Q_{35}$), or —B($Q_{36}$)($Q_{37}$), wherein $Q_1$ to $Q_7$, $Q_{11}$ to $Q_{17}$, $Q_{21}$ to $Q_{27}$, and $Q_{31}$ to $Q_{37}$ are each independently hydrogen, a $C_1$-$C_{60}$ alkyl group, a $C_2$-$C_{60}$ alkenyl group, a $C_2$-$C_{60}$alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{30}$ alkyl" refers to a $C_1$-$C_{30}$ alkyl group substituted with $C_6$-$C_{30}$ aryl group, the total number of carbon atoms in the resulting aryl substituted alkyl group is $C_7$-$C_{60}$.

Figure 2:
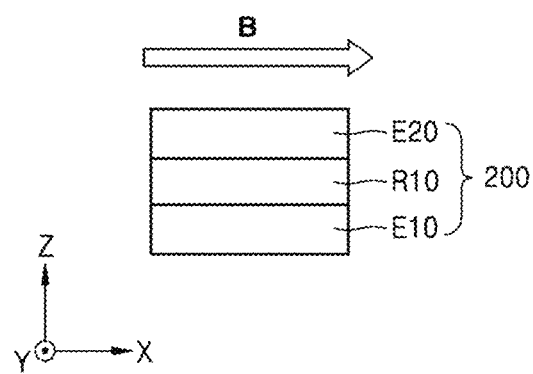
FIG. 2 is a cross-sectional view of an organic light-emitting element of FIG. 1.

FIG. 2 is a cross-sectional view of the organic light-emitting element 200 of FIG. 1. As described with reference to FIG. 1, the organic light-emitting element 200 of FIG. 2 may include the first electrode E10, the second electrode E20, and the organic material layer R10 disposed between the first electrode E10 and the second electrode E20. Light-emission colors and characteristics of the organic light-emitting element 200 may be changed depending on a type of a light-emitting material included in the organic material layer R10. Although not illustrated, the organic light-emitting element 200 may further include a hole transport layer (HTL) disposed between the organic material layer R10 and the second electrode E20.

Figure 3A:
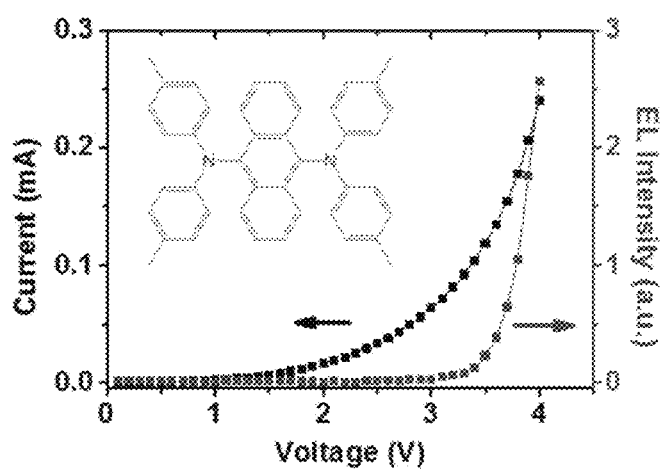
FIG. 3A is a graph of current (milliamperes, mA) and electroluminescence intensity (arbitrary units, a.u.) versus voltage (volts, V) showing a result of evaluation of the organic light-emitting element of FIG. 2, according to an embodiment.
Figure 3B:
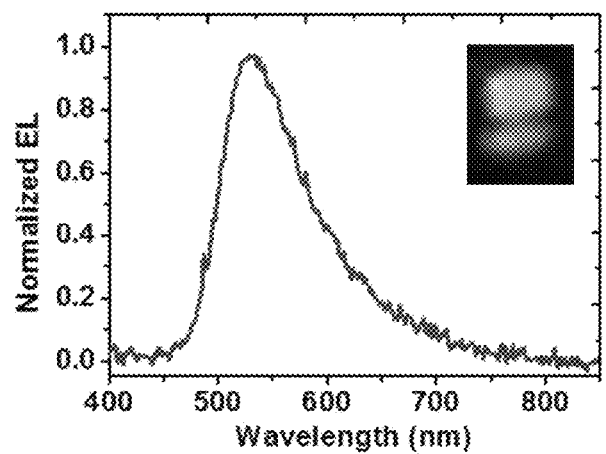
FIG. 3B is a graph of normalized electroluminescence versus wavelength (nanometers, nm) showing a result of evaluation of the organic light-emitting element of FIG. 2, according to an embodiment.
Figure 3C:
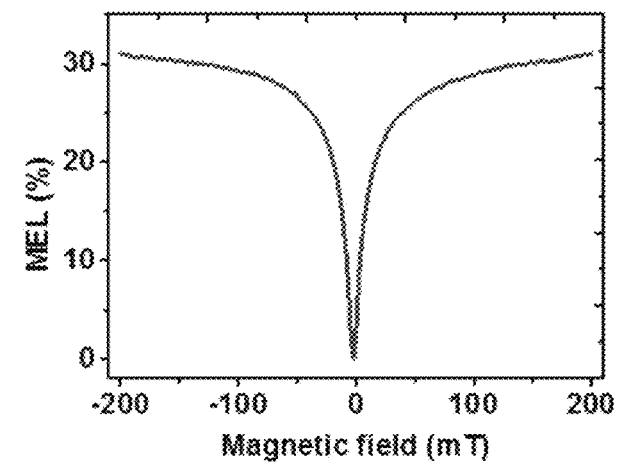
FIG. 3C is a graph of magneto-electroluminescence (MEL) (%, percent) versus magnetic field (milliteslas, mT) showing a result of evaluation of the organic light-emitting element of FIG. 2, according to an embodiment.

FIGS. 3A to 3C are graphs showing a result of evaluating various characteristics of the organic light-emitting element 200 of FIG. 2, according to an embodiment. FIGS. 3A to 3C illustrate an embodiment where the organic light-emitting element 200 of FIG. 2 is a green-OLED that emits green light.

The graph of FIG. 3A shows a change in a current as a function of a voltage and a change in electroluminescence (EL) intensity as a function of a voltage. That is, the graph of FIG. 3A shows a change (i.e., I-V characteristics) in a current between the first electrode E10 and the second electrode E20 as a function of a voltage applied therebetween, and a change (i.e., EL-V characteristics) in EL intensity as a function of the voltage. A chemical structure inserted into the graph of FIG. 3A is a molecular structure of TTPA that is a green fluorescent material (dopant). TTPA is 9,10-bis[N,N-di-(p-tolyl)-amino]anthracene. TTPA may be a material (dopant) doped into the organic material layer R10. The organic material layer R10 may include a host and a dopant. The host may include MeO-TPD as a donor and 3TPYMB as an acceptor. MeO-TPD is N,N,N,N-tetrakis(4-methoxyphenyl)benzidine and 3TPYMB is tris-[3-(3-pyridyl)mesityl]borane. TTPA may be doped into the host. Therefore, the green-OLED is a green-XOLED.

Referring to the graph of FIG. 3A, it can be seen that the green-OLED shows an I-V response similar to that of a diode. Also, it can be seen that EL emission characteristics appear at a voltage of about 3 volts (V) or higher.

The graph of FIG. 3B shows an EL spectrum of the green-OLED when the organic light-emitting element 200 of FIG. 2 is the green-OLED. A photograph inserted into the graph of FIG. 3B is an image of EL emission, that is, light emitted from the green-OLED.

Referring to the graph of FIG. 3B, it can be seen that the EL spectrum has a broad band of about 500 nanometers (nm) to about 650 nm. These characteristics may result from TTPA. As compared to the embodiment where an XOLED using an undoped host, i.e., pristine MeO-TPD/3TPYMB, the embodiment where the TTPA is included as a dopant may realize much stronger (brighter) EL characteristics.

The graph of FIG. 3C shows a result of measuring magneto-electroluminescence (MEL) characteristics of the organic light-emitting element 200 of FIG. 2 as a function of a magnetic field B applied thereto. The MEL characteristics were measured while changing the magnetic field B from −200 milliteslas (mT) to +200 mT in a state in which a constant bias was applied between the first electrode E10 and the second electrode E20. These results are from an embodiment where the organic light-emitting element 200 is the green-OLED. Since the MEL characteristics are measured while the magnetic field B is directly applied to the organic light-emitting element 200, MEL may be referred to as "intrinsic MEL" of the organic light-emitting element 200.

Referring to the graph of FIG. 3C, it can be seen that EL intensity increases up to about 30% when the magnetic field B is about 200 mT in a state in which the bias voltage is constantly maintained. Also, it can be seen that the MEL characteristic graph has a full width at half maximum (FWHM) of about 25 mT. This may be caused by a spin-mixing mechanism between a singlet exciton and a triplet exciton. In the present embodiment, the maximum MEL value may be much greater than that of an OLED based on a pristine π-conjugated polymer. The MEL value (%) in the graph of FIG. 3C may be expressed as MEL(B), and MEL(B) may be defined by $[\{EL(B)-EL(B=0)\}/EL(B=0)] \times 100$.

Figure 4A:
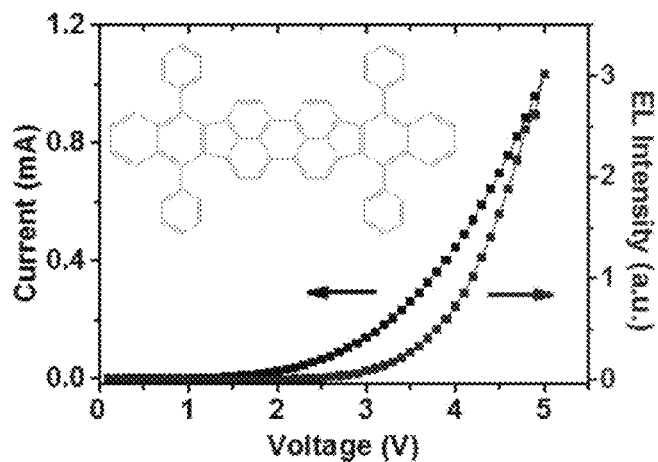
FIG. 4A is a graph of current (milliamperes, mA) and electroluminescence intensity (arbitrary units, a.u.) versus voltage (volts, V) showing a result of evaluation of the organic light-emitting element of FIG. 2, according to an embodiment.
Figure 4B:
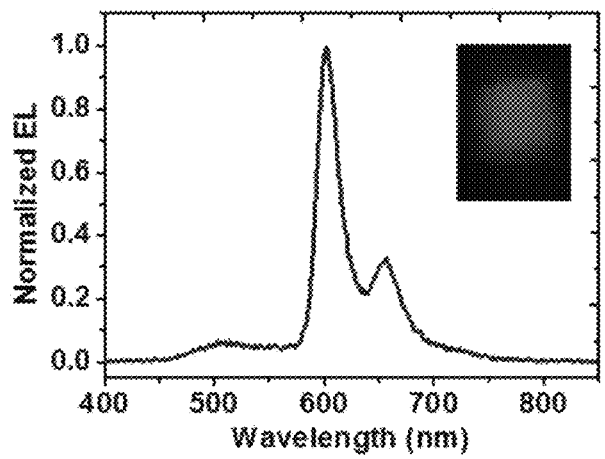
FIG. 4B is a graph of normalized electroluminescence versus wavelength (nanometers, nm) showing a result of evaluation of the organic light-emitting element of FIG. 2, according to an embodiment.
Figure 4C:
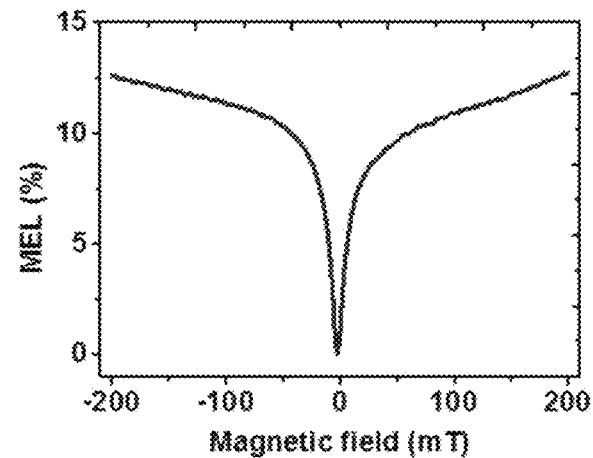
FIG. 4C is a graph of magneto-electroluminescence (MEL) (%, percent) versus magnetic field (milliteslas, mT) showing a result of evaluation of the organic light-emitting element of FIG. 2, according to another embodiment.

FIGS. 4A to 4C are graphs showing a result of evaluating various characteristics of the organic light-emitting element 200 of FIG. 2, according to another embodiment. FIGS. 4A to 4C illustrate an embodiment, where the organic light-emitting element 200 of FIG. 2 is a red-OLED that emits red light.

The graph of FIG. 4A shows a change in a current as a function of a voltage and a change in EL intensity as a function of a voltage. A chemical structure inserted into the graph of FIG. 4A is a molecular structure of DBP that is a red fluorescent material (dopant). DBP is tetraphenyl-dibenzoperiflanthene. DBP may be doped into a host. The host may include MeO-TPD and 3TPYMB. This is identical to the host used in the green-OLED of FIGS. 3A to 3C. Therefore, the red-OLED is a red-XOLED.

Referring to the graph of FIG. 4A, it can be seen that an I-V curve is not greatly changed and an EL-V curve is relatively considerably changed, as compared to the graph of FIG. 3A. A turn-on voltage for EL emission is reduced to about 2.5 V.

The graph of FIG. 4B shows an EL spectrum of the red-OLED when the organic light-emitting element 200 of FIG. 2 is the red-OLED. A photograph inserted into the graph of FIG. 4B is an image of EL emission, that is, light emitted from the red-OLED.

Referring to the graph of FIG. 4B, the EL emission spectrum appeared in a narrow region around about 600, and a small peak occurred even at about 660 nm. From these results and the results of FIG. 3B, it can be seen that a wavelength (color) of emitted light may be readily changed by changing a type of a dopant doped into the same host.

The graph of FIG. 4C shows a result of measuring MEL characteristics of the organic light-emitting element 200 of FIG. 2 as a function of a magnetic field B applied thereto when the organic light-emitting element 200 of FIG. 2 is the red-OLED. The MEL is an "intrinsic" MEL of the organic light-emitting element 200.

Referring to the graph of FIG. 4C, it can be seen that EL intensity increases up to about 12.5% when the magnetic field B is about 200 mT in a state in which a bias voltage is constantly maintained. Also, it can be seen that the MEL characteristic graph has an FWHM of about 20 mT.

According to the present embodiment, as described with reference to FIGS. 3 and 4, relatively great "intrinsic" MEL characteristics may be obtained from the organic light-emitting element 200. In particular, when the organic material layer R10 includes a delayed fluorescence material (for example, a TADF material), excellent EL emission characteristics may be obtained and a great "intrinsic" MEL effect may be obtained.

Figure 5:
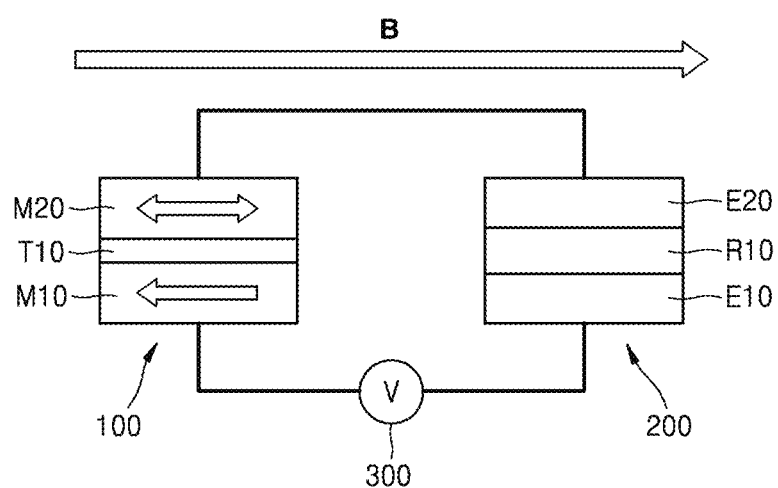
FIG. 5 is a cross-sectional view illustrating an embodiment where a magnetic field is applied to an organic light-emitting device, according to an embodiment.

FIG. 5 is a cross-sectional view illustrating an embodiment, where a magnetic field B is applied to an organic light-emitting device, according to an embodiment.

Referring to FIG. 5, the organic light-emitting device may include a magnetoresistive element 100 and an organic light-emitting element 200 connected to each other. The organic light-emitting device may further include a power source 300 connected between the magnetoresistive element 100 and the organic light-emitting element 200. The magnetic field B may be applied to the magnetoresistive element 100 and the organic light-emitting element 200 by using a magnetic field applying unit (not illustrated). The magnetic field applying unit may include, for example, two poles of an electromagnet. The organic light-emitting device may be disposed between the two poles of the electromagnet and the magnetic field B may be applied by using the poles of the electromagnet. However, a detailed structure of the magnetic field applying unit is not limited to that described above and may be changed in various ways.

Figure 6A:
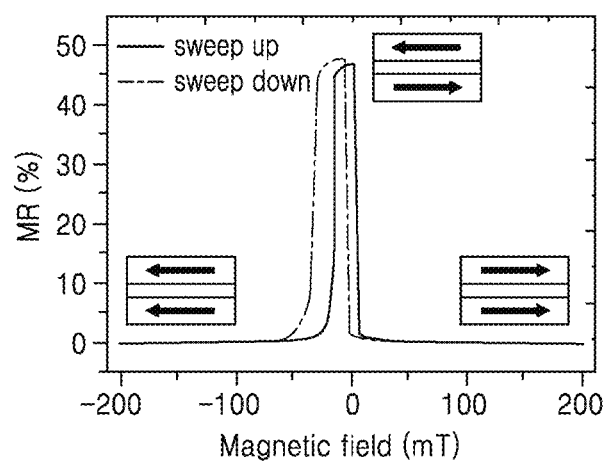
FIG. 6A is a graph of magnetoresistance (MR) (%, percent) versus magnetic field (milliteslas, mT) showing a change in magnetoresistance (MR) of a magnetoresistive element of FIG. 5 as a function of a magnetic field.

FIG. 6A is a graph showing a change in magnetoresistance (MR) of the magnetoresistive element 100 of FIG. 5, as a function of the magnetic field B. The change in MR was measured while changing the magnetic field B in a state in which a bias of 0.1 V was applied between both terminals (ends) of the magnetoresistive element 100. The change in MR was measured at room temperature (about 25° C.).

Referring to FIG. 6A, when the magnetization direction of the first magnetic field M10 is parallel to the magnetization direction of the second magnetic layer M20, the MR of the magnetoresistive element 100 may be low. When the magnetization direction of the first magnetic field M10 is anti-parallel to the magnetization direction of the second magnetic layer M20, the MR of the magnetoresistive element 100 may be high. When the magnetization directions of the first and second magnetic layers M10 and M20 become anti-parallel due to the magnetic field B, a resistance of the magnetoresistive element 100 may rapidly increase up to about 50%. A hysteretic behavior of a MR change may appear as a result of a sweep direction of the magnetic field B.

As the resistance of the magnetoresistive element 100 is changed by the magnetic field B, the current flowing through the organic light-emitting element 200 of FIG. 5 may be changed. That is, the current of the organic light-emitting element 200 may be changed by not the magnetic field B applied to the organic light-emitting element 200 itself but the magnetic field B applied to the magnetoresistive element 100. As a result, EL intensity and characteristics of the organic light-emitting element 200 may be changed. This may be referred to as "extrinsic" MEL. According to the present embodiment, a great MR change effect may be obtained at room temperature. Consequently, a high "extrinsic" MEL effect may be obtained.

As illustrated in FIG. 5, when the magnetic field B is applied to both the magnetoresistive element 100 and the organic light-emitting element 200, both the intrinsic MEL caused by the magnetic field B applied to the organic light-emitting element 200 and the extrinsic MEL caused by the magnetic field B applied to the magnetoresistive element 100 may appear. A mixture of the intrinsic MEL (i.e., $MEL_{in}$) and the extrinsic MEL (i.e., $MEL_{ex}$) may appear. The mixed MEL may be referred to as total MEL. In other words, an interaction result of the intrinsic MEL (i.e., $MEL_{in}$) and the extrinsic MEL (i.e., $MEL_{ex}$) may appear as total MEL characteristics.

Figure 6B:
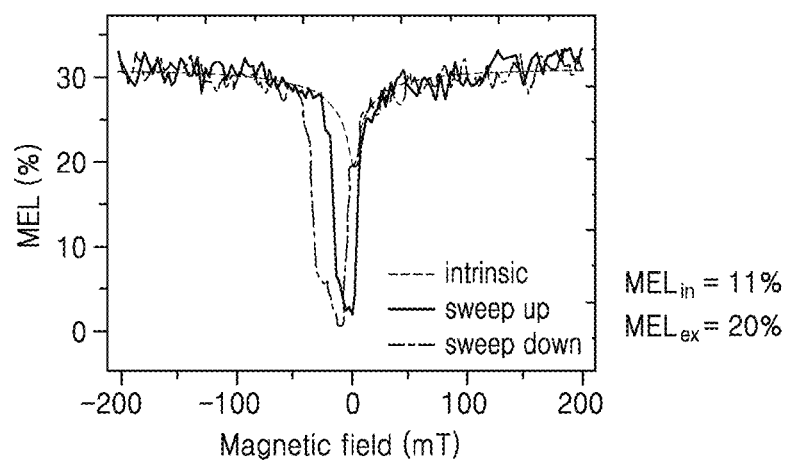
FIG. 6B is a graph of magnetoresistance (MR) (%, percent) versus magnetic field (milliteslas, mT) showing a result of measuring magneto-electroluminescence (MEL) characteristics when a magnetic field is applied to the organic light-emitting device of FIG. 5.

FIG. 6B is a graph showing a result of measuring MEL characteristics when the magnetic field B to the organic light-emitting device of FIG. 5 is applied. The MEL characteristics were measured as the magnetic field B in a state in which a voltage higher than a turn-on voltage was constantly applied to the organic light-emitting device was changed. Two graphs (sweep up and sweep down) in FIG. 6B show a total MEL response as a function of a sweep direction of the magnetic field B. Also, a graph showing an intrinsic MEL response ($MEL_{in}$ response) is included in FIG. 6B. A difference between a total MEL value and an intrinsic MEL ($MEL_{in}$) value corresponds to an external MEL ($MEL_{ex}$) value.

As illustrated in FIG. 6B, when the magnetic field B is 200 mT, the MEL (total MEL) may be increased up to about 30%, and when the magnetic field B is about 0 mT, the MEL (total MEL) may be reduced to about 0%. This may be associated with a change in the resistance of the magnetoresistive element 100 described with reference to FIG. 6A. Also, the intrinsic MEL characteristics of the organic light-emitting element 200 may also influence the total MEL characteristics. The total MEL response may show hysteretic behavior characteristics due to the influence of the extrinsic MEL (i.e., $MEL_{ex}$). The intrinsic MEL (i.e., $MEL_{in}$) response may show non-hysteretic behavior characteristics. A value obtained by subtracting the intrinsic MEL (i.e., $MEL_{in}$) value from the total MEL value may correspond to the extrinsic MEL (i.e., $MEL_{ex}$) value. Therefore, a ratio of the intrinsic MEL ($MEL_{in}$) to the extrinsic MEL ($MEL_{ex}$) may be known from the obtained value.

The result of FIG. 6B is an embodiment, where a thickness of the organic material layer R10 is about 50 nm. The total MEL characteristics of the organic light-emitting device may be changed depending on the thickness of the organic material layer R10. The ratio of the intrinsic MEL ($MEL_{in}$) to the external MEL ($MEL_{ex}$) may be changed depending on the thickness of the organic material layer R10, and the degree of the hysteretic behavior also may be changed. A change in the total MEL characteristics of the organic light-emitting device depending on the thickness of the organic material layer R10 will be described with reference to FIGS. 6C and 6D.

Figure 6C:
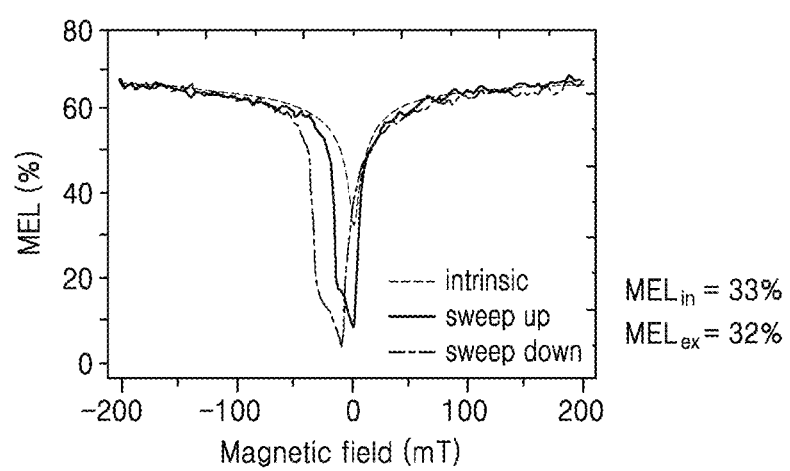
FIG. 6C is a graph of magneto-electroluminescence (MEL) (%, percent) versus magnetic field (milliteslas, mT) showing MEL characteristics of the organic light-emitting device of FIG. 5 when a thickness of an organic material layer is about 100 nanometers (nm)
Figure 6D:
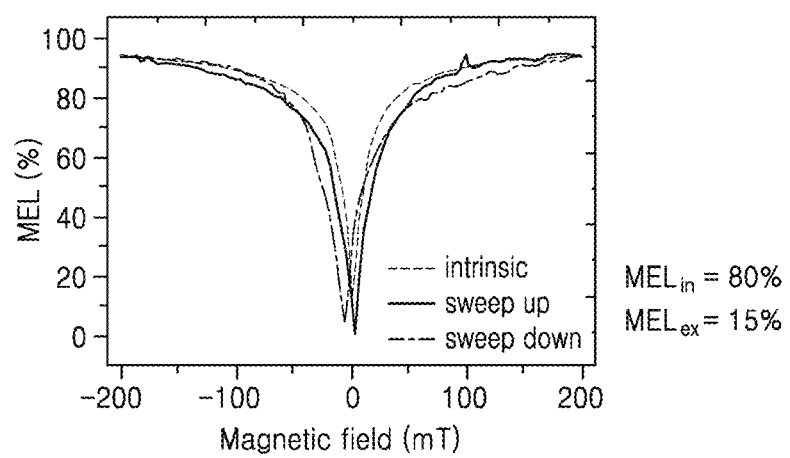
FIG. 6D is a graph of magneto-electroluminescence (MEL) (%, percent) versus magnetic field (milliteslas, mT) showing MEL characteristics of the organic light-emitting device of FIG. 5 when a thickness of an organic material layer is about 150 nanometers (nm)

FIG. 6C shows MEL characteristics of the organic light-emitting device (the device of FIG. 5) when the thickness of the organic material layer R10 is about 100 nm. FIG. 6D shows MEL characteristics of the organic light-emitting device (the device of FIG. 5) when the thickness of the organic material layer R10 is about 150 nm. The remaining structure except for the thickness of the organic material layer R10 in the organic light-emitting devices of FIGS. 6C and 6D are substantially identical to the structure of the organic light-emitting device of FIG. 6B.

It can be seen from comparison of FIGS. 6B to 6D that, as the thickness of the organic material layer R10 increases (FIG. 6B→FIG. 6C→FIG. 6D), a maximum value ($MEL_{max}$) of the MEL increases. That is, $MEL_{max}$ in FIG. 6B is about 30%, $MEL_{max}$ in FIG. 6C is about 65%, and $MEL_{max}$ in FIG. 6D is about 95%. Also, it can be seen that, as the thickness of the organic material layer R10 increases (FIG. 6B→FIG. 6C→FIG. 6D), a proportion of the intrinsic MEL ($MEL_{in}$) increases. Also, it can be seen that, as the thickness of the organic material layer R10 is changed, hysteretic behavior characteristics of the total MEL response also is changed. It can be seen from the results of FIGS. 6B to 6D that a ratio of $MEL_{in}$ to $MEL_{ex}$ in the organic light-emitting device (e.g., HS-OLED) can be tuned depending on the thickness of the organic material layer R10 and the overall MEL performance also can be tuned.

The method of tuning (controlling) the MEL characteristics by changing the thickness of the organic material layer R10 in the organic light-emitting device has been described with reference to FIGS. 6B to 6D, but the MEL characteristics of the organic light-emitting device may be tuned by using other methods. For example, the MEL characteristics may be tuned (controlled) by changing an electrical signal (signals) applied to one organic light-emitting device. This is to tune (control) the MEL characteristics in-situ by changing an electrical signal (signals), without changing a physical structure (e.g., a thickness of a layer, etc.) of the organic light-emitting device. Therefore, characteristics of the organic light-emitting device, whose configuration and structure are defined, may be tuned (controlled). This will be described in more detail with reference to FIGS. 7 to 12.

Figure 7:
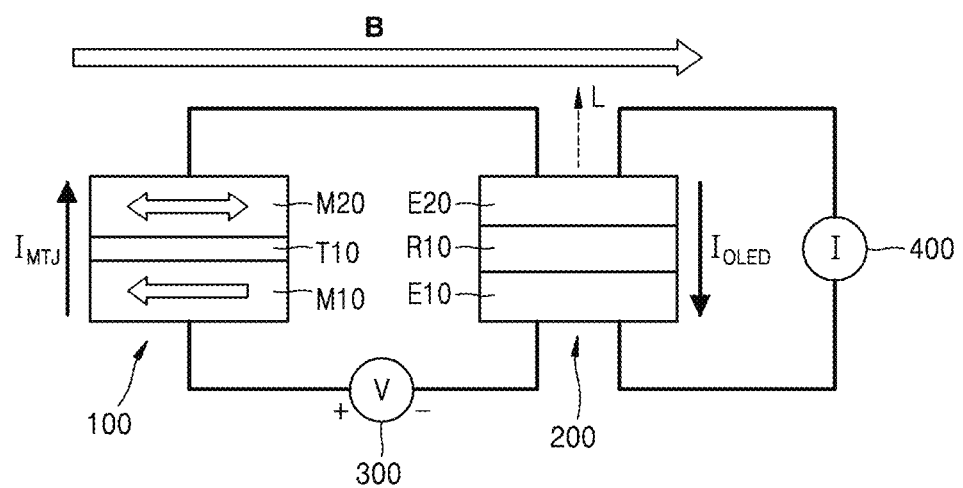
FIG. 7 is a schematic cross-sectional view of an organic light-emitting device according to an embodiment.

FIG. 7 is a schematic cross-sectional view of an organic light-emitting device according to an embodiment.

Referring to FIG. 7, the organic light-emitting device may include a magnetoresistive element 100, an organic light-emitting element 200, a power source 300, and a current source 400, as described above with reference to FIG. 1. The magnetoresistive element 100 may include a first magnetic layer M10, a second magnetic layer M20, and a separation layer T10 disposed between the first magnetic layer M10 and the second magnetic layer M20. The organic light-emitting element 200 may include a first electrode E10, a second electrode E20, and an organic material layer R10 disposed between the first electrode E10 and the second electrode E20. The power source 300 may be connected between the magnetoresistive element 100 and the organic light-emitting element 200, and the current source 400 may be connected between both terminals of the organic light-emitting element 200. Also, the organic light-emitting device may further include a magnetic field applying unit (not illustrated) configured to apply a magnetic field B to at least the magnetoresistive element 100 from among the magnetoresistive element 100 and the organic light-emitting element 200. The magnetic field B may be applied to both the magnetoresistive element 100 and the organic light-emitting element 200. Light L is emitted from the organic light-emitting element 200.

In the present embodiment, a direction of a current $I_{MTJ}$ passing through the magnetoresistive element 100 and a direction of a current $I_{OLED}$ passing through the organic light-emitting element 200 may have an in-phase relationship. The direction and intensity of the current $I_{MTJ}$ passing through the magnetoresistive element 100 may be determined by the power source 300, and the direction and intensity of the current $I_{OLED}$ passing through the organic light-emitting element 200 may be determined by the power source 300 and the current source 400. That the direction of $I_{MTJ}$ and the direction of $I_{OLED}$ have the in-phase relationship may mean that the direction of $I_{MTJ}$ and the direction of $I_{OLED}$ are the same direction with respect to the organic light-emitting element 200. In other words, it may mean that, when assuming that a flow of $I_{MTJ}$ extends to the organic light-emitting element 200, the direction thereof is the same as the direction of $I_{OLED}$.

Figure 8:
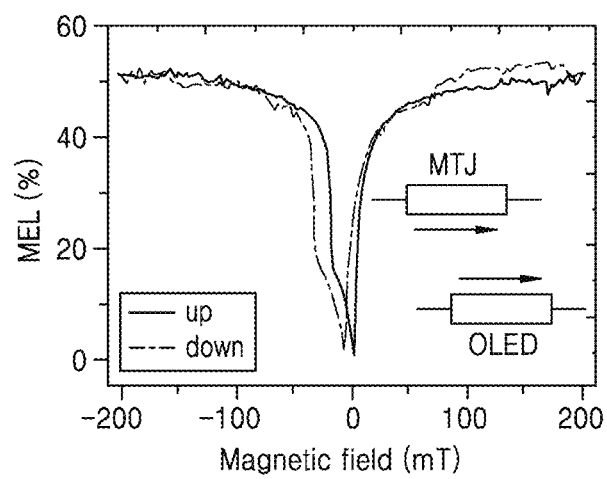
FIG. 8 is a graph of magneto-electroluminescence (MEL) (%, percent) versus magnetic field (milliteslas, mT) showing a result of measuring MEL characteristics as a function of a magnetic field applied to the organic light-emitting device of FIG. 7.

FIG. 8 is a graph showing a result of measuring MEL characteristics as a function of the magnetic field B applied to the organic light-emitting device of FIG. 7. That is, FIG. 8 shows MEL characteristics as a function of the magnetic field B when the current $I_{MTJ}$ passing through the magnetoresistive element (MTJ) 100 and the current $I_{OLED}$ passing through the organic light-emitting element (OLED) 200 have an in-phase relationship.

Figure 9:
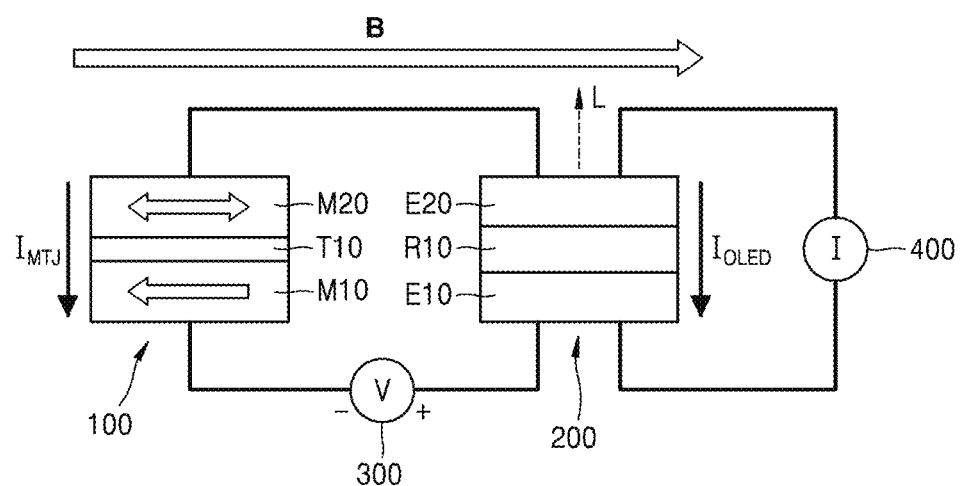
FIG. 9 is a schematic cross-sectional view of an organic light-emitting device according to another embodiment.

FIG. 9 is a schematic cross-sectional view of an organic light-emitting device according to another embodiment.

Referring to FIG. 9, the organic light-emitting device may have the same structure as that of FIG. 7. However, the direction of the current $I_{MTJ}$ passing through the magnetoresistive element 100 and the direction of the current $I_{OLED}$ passing through the organic light-emitting element 200 may have an anti-phase relationship. That is, when assuming that a flow of $I_{MTJ}$ extends to the organic light-emitting element 200, a direction thereof may be opposite to the direction of $I_{OLED}$.

Figure 10:
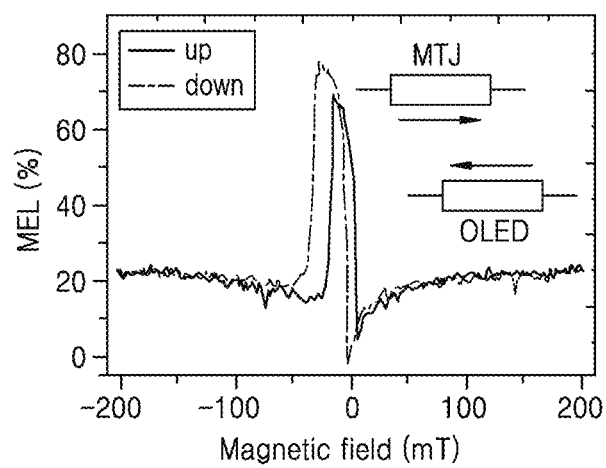
FIG. 10 is a graph of magneto-electroluminescence (MEL) (%, percent) versus magnetic field (milliteslas, mT) showing a result of measuring MEL characteristics as a function of a magnetic field applied to the organic light-emitting device of FIG. 9.

FIG. 10 is a graph showing a result of measuring MEL characteristics as a function of a magnetic field B applied to the organic light-emitting device of FIG. 9. That is, FIG. 10 shows MEL characteristics as a function of the magnetic field B when the direction of the current $I_{MTJ}$ passing through the magnetoresistive element (MTJ) 100 and the direction of the current $I_{OLED}$ passing through the organic light-emitting element (OLED) 200 have an anti-phase relationship.

Referring to FIG. 10, it can be seen that a graph having an aspect quite different from the graph of FIG. 8 appears. That is, MEL characteristics of the organic light-emitting device in an embodiment (FIGS. 7 and 8) where the current $I_{MTJ}$ passing through the magnetoresistive element (MTJ) 100 and the current $I_{OLED}$ passing through the organic light-emitting element (OLED) 200 has an in-phase relationship may be greatly different from MEL characteristics of the organic light-emitting device in an embodiment (FIGS. 9 and 10) where the current $I_{MTJ}$ passing through the magnetoresistive element (MTJ) 100 and the current $I_{OLED}$ passing through the organic light-emitting element (OLED) 200 has an anti-phase relationship, because both amplitudes and polarities of $MEL_{ex}$ in the two embodiments become different. $MEL_{in}$ responses may be substantially identical to each other in the two embodiments. Therefore, different MEL characteristics may be realized from one organic light-emitting device by changing current configurations by using the power source 300 and the additional current source 400.

Figure 11:
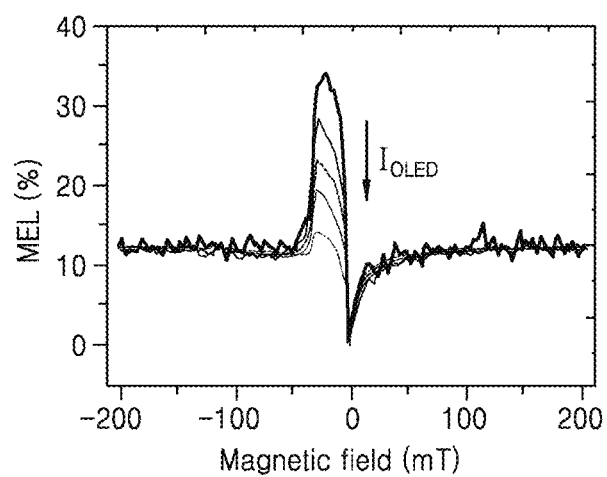
FIG. 11 is a graph of magneto-electroluminescence (MEL) (%, percent) versus magnetic field (milliteslas, mT) showing a result of measuring a change in MEL characteristics of the organic light-emitting device of FIG. 9, as intensity of a current passing through an organic light-emitting element therein is increased.

FIG. 11 is a graph showing a result of measuring a change in MEL characteristics of the organic light-emitting device of FIG. 9 as intensity of the current $I_{OLED}$ passing through the organic light-emitting element 200 therein is increased;

Referring to FIG. 11, it can be seen that, as the intensity of the current $I_{OLED}$ passing through the organic light-emitting element 200 is changed, MEL characteristics are changed. As $I_{OLED}$ gradually increases, an MEL value may decrease. This may be because, as $I_{OLED}$ increases, $MEL_{ex}$ caused by $I_{MTJ}$ decreases.

Figure 12:
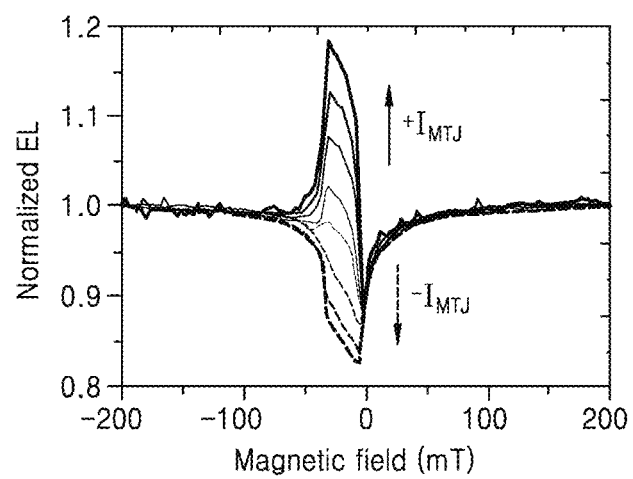
FIG. 12 is a graph is a graph of normalized electroluminescence versus magnetic field (milliteslas, mT) showing a result of measuring a change in electroluminescence (EL) characteristics of an organic light-emitting device according to an embodiment, as a direction and intensity of a current passing through a magnetoresistive element therein is changed.

FIG. 12 is a graph showing a result of measuring a change in EL characteristics of the organic light-emitting device according to an embodiment, as the direction and intensity of the current $I_{MTJ}$ passing through the magnetoresistive element 100 therein is changed. In this embodiment, the intensity of the current $I_{OLED}$ passing through the organic light-emitting element 200 was constantly maintained.

Referring to FIG. 12, it can be seen that, as the direction and intensity of the current $I_{MTJ}$ passing through the magnetoresistive element 100 are changed, EL characteristics are changed. The contribution degree of $MEL_{ex}$ may be adjusted by changing $I_{MTJ}$. The overall MEL characteristics may be readily tuned (controlled) by a bias applied to the organic light-emitting device.

According to embodiments, light-emission characteristics of the organic light-emitting device may be tuned by adjusting the direction and intensity of the current $I_{MTJ}$ passing through the magnetoresistive element 100 and the direction and intensity of the current $I_{OLED}$ passing through the organic light-emitting element 200. Also, light-emission characteristics of the organic light-emitting device may be tuned by using both intrinsic MEL generated in the organic light-emitting element 200 by the magnetic field B applied to the organic light-emitting element 200 and extrinsic MEL generated in the organic light-emitting element 200 by the magnetic field B applied to the magnetoresistive element 100. Therefore, according to embodiments, if necessary, characteristics of the organic light-emitting device may be tuned in a wide range, which may be usefully applied to the fields of various display devices.

Figure 13:
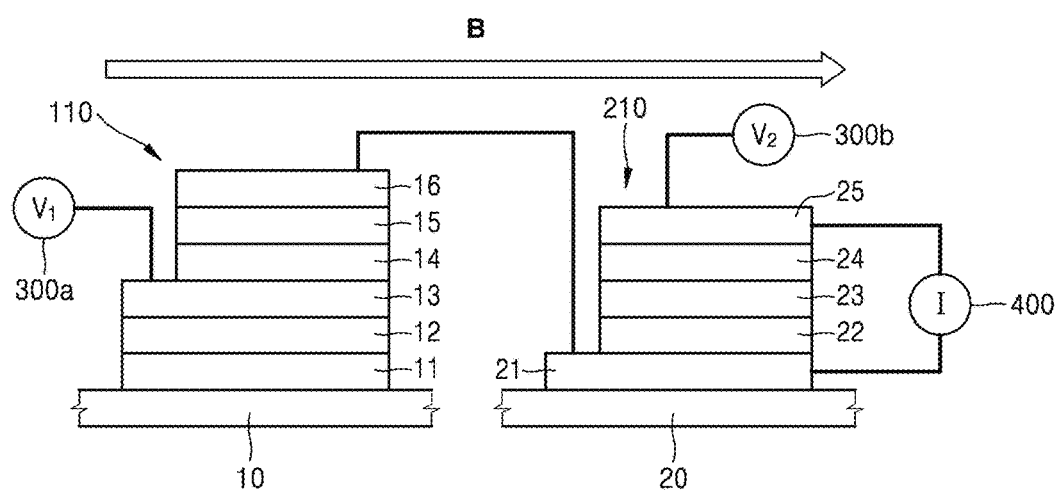
FIG. 13 is a cross-sectional view of an organic light-emitting device according to an experimental example.

FIG. 13 is a cross-sectional view of an organic light-emitting device according to an experimental example.

Referring to FIG. 13, a magnetoresistive element 110 may be formed on a first substrate 10. The first substrate 10 may be, for example, a silicon substrate. The magnetoresistive element 110 may include an antiferromagnetic layer 11, an intermediate magnetic layer 12, a first ferromagnetic layer 13, a tunnel barrier layer 14, a second ferromagnetic layer 15, and an electrode layer 16, which are sequentially stacked in this stated order. Each of the antiferromagnetic layer 11, the intermediate magnetic layer 12, the first ferromagnetic layer 13, the tunnel barrier layer 14, the second ferromagnetic layer 15, and the electrode layer 16 may include IrMn, CoFeB, CoFe, MgO, CoFeB, and Ta/Pt. Thus, the magnetoresistive element 110 may have a structure of IrMn/CoFeB/CoFe/MgO/CoFeB/Ta/Pt. The first ferromagnetic layer 13 may be a pinned layer and the second ferromagnetic layer 15 may be a free layer. The antiferromagnetic layer 11 and the intermediate magnetic layer 12 may be a layer (pinning layer) for pinning the magnetization of the first ferromagnetic layer 13.

An organic light-emitting element 210 may be formed on a second substrate 20. The second substrate 20 may be, for example, a transparent substrate such as a glass substrate.

The organic light-emitting element 210 may include an anode 21, a hole transport layer 22, an organic light-emission layer 23, a first cathode layer 24, and a second cathode layer 25, which are sequentially stacked in this stated order. Each of the anode 21, the hole transport layer 22, the organic light-emission layer 23, the first cathode layer 24, and the second cathode layer 25 may include ITO, PEDOT:PSS, an exciplex material, Ca, and Al. Thus, the magnetoresistive element 210 may have a structure of ITO/PEDOT:PSS/exciplex/Ca/Al. In PEDOT:PSS, PEDOT is poly(3,4-ethylene dioxythiophene) and PSS is poly(styrene sulfonate). The first cathode layer 24 and the second cathode layer 25 may constitute one cathode, and the cathode may correspond to the first electrode E10 of FIG. 1. The anode 21 may correspond to the second electrode E20 of FIG. 1.

After the anode 21 may be formed on the second substrate 20, a cleaning process may be performed on the anode 21. Then, the hole transport layer 22 may be formed on the anode 21 by spin coating. In this embodiment, the spin coating may be performed at a speed of about 3,000 rpm. A thickness of the hole transport layer 22 may be about 30 nm. Then, an annealing process may be performed on the hole transport layer 22. The annealing process may be performed at a temperature of about 140° C. for about 20 minutes. Then, the organic light-emission layer 23 may be formed on the hole transport layer 22 in an inert gas atmosphere such as nitrogen gas. The organic light-emission layer 23 may be formed by spin-coating a mixed solution including an organic material on the hole transport layer 22. In this embodiment, the spin coating may be performed at a speed of about 1,000 rpm. The mixed solution may include a hole transport compound (donor), an electron transport compound (acceptor), and a dopant. For example, the hole transport compound may be MeO-TPD and the electron transport compound may be 3TPYMB. In this embodiment, a weight ratio (MeO-TPD:3TPYMB) of MeO-TPD to 3TPYMB may be about 1:4. Also, the dopant may be, for example, TTPA, DBP, or the like. In this embodiment, an amount of the dopant may be about 1 percent by weight (wt %), but this is merely an example. The amount of the dopant may be changed. Then, the first cathode layer 24 and the second cathode layer 25 may be respectively formed on the organic light-emission layer 23 at a thickness of 20 nm and 100 nm. The first cathode layer 24 and the second cathode layer 25 may be formed by using thermal evaporation.

The organic light-emitting device may further include power sources 300a and 300b configured to apply electrical energy between the magnetoresistive element 110 and the organic light-emitting element 210. The power sources 300a and 300b may include a first voltage applying unit 300a connected to the first ferromagnetic layer 13 of the magnetoresistive element 110 and a second voltage applying unit 300b connected to the second cathode layer 25 of the organic light-emitting element 210. Although the first voltage applying unit 300a and the second voltage applying unit 300b are separately illustrated, these may constitute one power source (e.g., 300 of FIG. 1). The magnetoresistive element 110 and the organic light-emitting element 210 may be wire-bonded to each other and may be electrically connected to the power sources 300a and 300b. The organic light-emitting device may further include a current source 400 connected to the anode 21 and the cathode 25 of the organic light-emitting element 210. The current source 400 may correspond to the current source 400 of FIG. 1. Although not illustrated, a magnetic field applying unit may be used to apply a magnetic field to at least the magnetoresistive element 110 from among the magnetoresistive element 110 and the organic light-emitting element 210.

The configuration of the organic light-emitting device of FIG. 13 may be applied to the organic light-emitting devices described with reference to FIGS. 1, 5, 7, and 9. However, the detailed configuration of the organic light-emitting device described with reference to FIG. 13 is merely an example and may be modified in various ways.

The embodiment where one organic light-emitting element 200 is connected to one magnetoresistive element 100 has been described with reference to FIGS. 1, 5, 7, and 9. According to another embodiment, a plurality of organic light-emitting elements 200 may be connected to one magnetoresistive element 100. For example, two organic light-emitting elements 200 may be connected to one magnetoresistive element 100. One example thereof is illustrated in FIG. 14.

Figure 14:
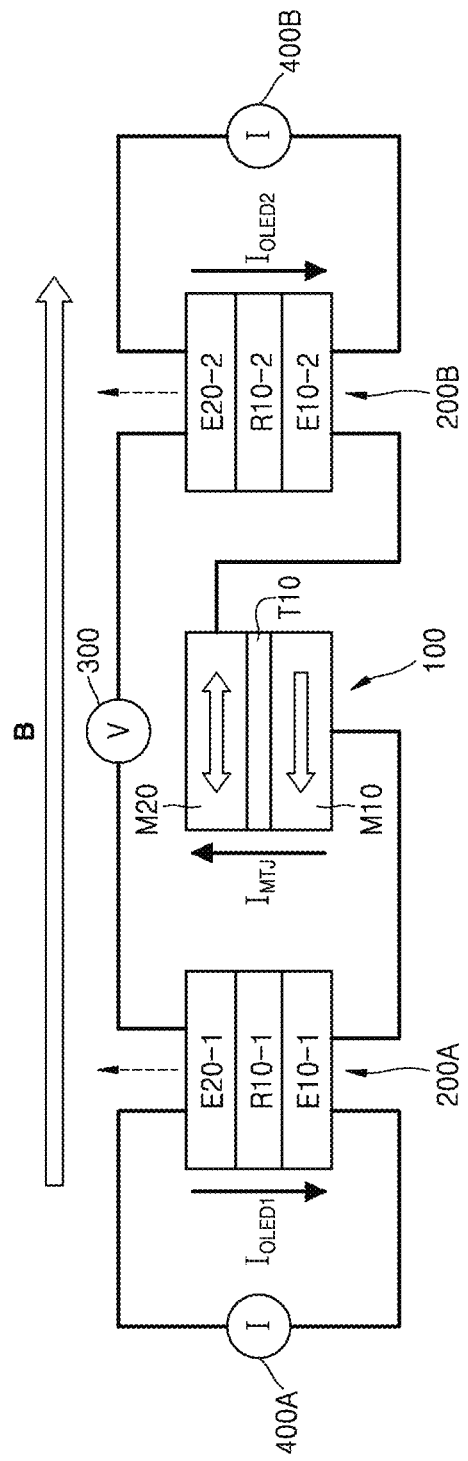
FIG. 14 is a schematic cross-sectional view of an organic light-emitting device according to another embodiment.

FIG. 14 is a schematic cross-sectional view of an organic light-emitting device according to another embodiment.

Referring to FIG. 14, two organic light-emitting elements 200A and 200B may be electrically connected to a magnetoresistive element 100. The two organic light-emitting elements 200A and 200B may be a first organic light-emitting element 200A and a second organic light-emitting element 200B. In terms of an electrical circuit, the first organic light-emitting element 200A and the second organic light-emitting element 200B may be regarded as being connected in parallel to the magnetoresistive element 100. Alternatively, the first organic light-emitting element 200A, the magnetoresistive element 100, and the second organic light-emitting element 200B may be regarded as being connected in series in this stated order.

The magnetoresistive element 100 may include a first magnetic layer M10, a second magnetic layer M20, and a separation layer T10 disposed between the first magnetic layer M10 and the second magnetic layer M20. The first organic light-emitting element 200A may include a first electrode E10-1, a second electrode E20-1, and an organic material layer R10-1 disposed between the first electrode E10-1 and the second electrode E20-1. The second organic light-emitting element 200B may include a first electrode E10-2, a second electrode E20-2, and an organic material layer R10-2 disposed between the first electrode E10-2 and the second electrode E20-2. The organic material layer R10-1 of the first organic light-emitting element 200A may be referred to as a first organic material layer R10-1, and the organic material layer R10-2 of the second organic light-emitting element 200B may be referred to as a second organic material layer R10-2. The first organic material layer R10-1 and the second organic material layer R10-2 may include different materials. In this regard, the first organic light-emitting element 200A and the second organic light-emitting element 200B may have different characteristics (light-emission characteristics). The structure of the magnetoresistive element 100 may correspond to the magnetoresistive element 100 described with reference to FIG. 1, and the structures of the first and second organic light-emitting elements 200A and 200B may correspond to the organic light-emitting element 200 described with reference to FIG. 1.

The organic light-emitting device may further include a power source 300 configured to apply electrical energy between the magnetoresistive element 100 and the first and second organic light-emitting elements 200A and 200B. The organic light-emitting device may further include a first current source 400A configured to apply a current between both terminals of the first organic light-emitting element 200A. Similarly, the organic light-emitting device may further include a second current source 400B configured to apply a current between both terminals of the second organic light-emitting element 200B. Also, the organic light-emitting device may further include a magnetic field applying unit (not illustrated) configured to apply a magnetic field B to the magnetoresistive element 100, and optionally, to the first and second organic light-emitting elements 200A and 200B. For example, the magnetic field B may be applied to the magnetoresistive element 100 and the first and second organic light-emitting elements 200A and 200B by using the magnetic field applying unit.

A direction of a current $I_{OLED1}$ passing through one of the first organic light-emitting element 200A and the second organic light-emitting element 200B, for example, the first organic light-emitting element 200A, and a direction of a current $I_{MTJ}$ passing through the magnetoresistive element 200 may have an in-phase relationship. A current $I_{OLED2}$ passing through the other, for example, the second organic light-emitting element 200B and a direction of a current $I_{MTJ}$ passing through the magnetoresistive element 200 may have an anti-phase relationship. The direction and intensity of the current $I_{MTJ}$ passing through the magnetoresistive element 200 may be determined by the power source 300. The direction and intensity of the current $I_{OLED1}$ passing through the first organic light-emitting element 200A may be determined by the power source 300 and the first current source 400A, and the direction and intensity of the current $I_{OLED2}$ passing through the second organic light-emitting element 200B may be determined by the power source 300 and the second current source 400B.

For convenience, the magnetoresistive element 100 is illustrated in FIG. 14 as being disposed between the two organic light-emitting elements 200A and 200B; however, but the two organic light-emitting elements 200A and 200B may be adjacent to each other in an actual device. Therefore, light produced by the first organic light-emitting element 200A and light produced by the second organic light-emitting element 200B may be mixed and emitted. In other words, mixed light of the light produced by the first organic light-emitting element 200A and the light produced by the second organic light-emitting element 200B may be emitted from the organic light-emitting device.

The organic light-emitting device in which two organic light-emitting elements 200A and 200B are connected to one magnetoresistive element, as illustrated in FIG. 14, may be referred to as a "binary" HS-OLED. Also, the organic light-emitting device may be a "binary" HS-XOLED. A light-emission color of the organic light-emitting device according to these embodiments may be changed depending on intensity of the magnetic field B applied to the organic light-emitting device. This will be described with reference to FIGS. 15, 16A, and 16B.

Figure 15:
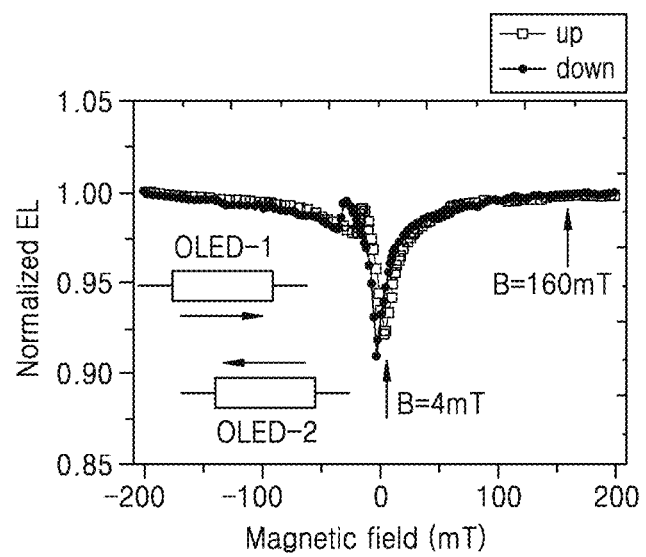
FIG. 15 is a graph of normalized electroluminescence versus magnetic field (milliteslas, mT) showing a result of measuring EL characteristics as a function of a magnetic field applied to the organic light-emitting device of FIG. 14.

FIG. 15 is a graph showing a result of measuring EL characteristics as a function of the magnetic field B applied to the organic light-emitting device of FIG. 14. FIG. 15 includes a result of an embodiment (sweep up) of increasing the magnetic field B in a direction from a negative (−) value to a positive (+) value and a result of an embodiment (sweep down) of decreasing the magnetic field B in a direction from a positive (+) value to a negative (−) value. FIG. 15 shows a result of an embodiment where a TTPA additive for green-EL is applied to the first organic material layer R10-1 and a DBP additive for red-EL is applied to the second organic material layer R10-2 in FIG. 14. In FIG. 14, in other words, the first organic material layer R10-1 may correspond to the organic material layer used for obtaining the result of FIG. 3. The second organic material layer R10-2 may correspond to the organic material layer used for obtaining the result of FIG. 4.

Figure 16A:
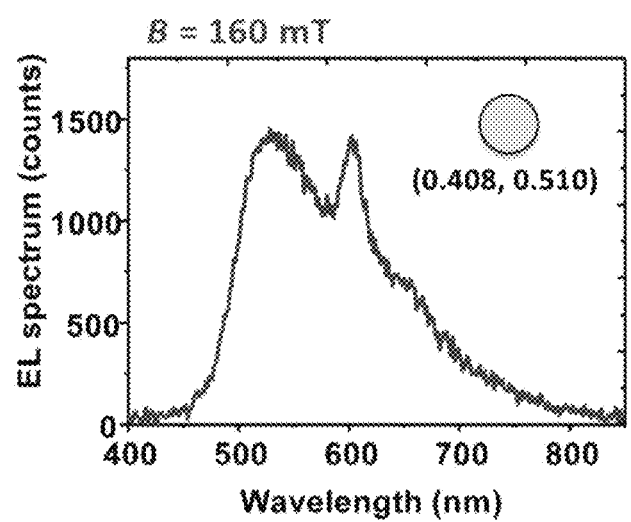
FIG. 16A is a graph of electroluminescence spectrum (counts) versus wavelength (nanometers, nm) showing an EL spectrum of the organic light-emitting device of FIG. 15 when a magnetic field is 160 milliteslas (mT)

FIG. 16A is a graph showing an EL spectrum of the organic light-emitting device of FIG. 15 when the magnetic field B is 160 mT. In this embodiment, the magnetization values of the two magnetic layers M10 and M20 of the magnetoresistive element 100 in FIG. 14 may have a parallel relationship.

Figure 16B:
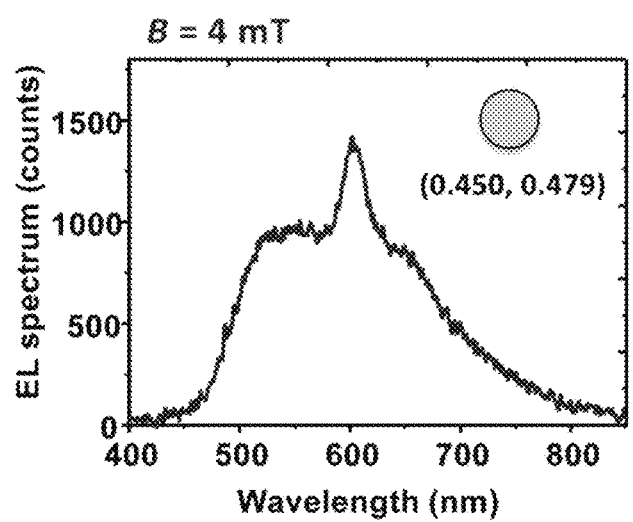
FIG. 16B is a graph of electroluminescence spectrum (counts) versus wavelength (nanometers, nm) showing an EL spectrum of the organic light-emitting device of FIG. 15 when a magnetic field is 4 milliteslas (mT)

FIG. 16B is a graph showing an EL spectrum of the organic light-emitting device of FIG. 15 when the magnetic field B is 4 mT. In this embodiment, the magnetization values of the two magnetic layers M10 and M20 of the magnetoresistive element 100 in FIG. 14 may have an anti-parallel relationship.

Referring to FIG. 16A, when the magnetic field B is 160 mT, a light-emission color close to a green color may appear. That is, green-EL emission by the first organic light-emitting element 200A may be stronger than red-EL emission by the second organic light-emitting element 200B. Consequently, an "olive-like" EL color close to green may appear. In this embodiment, CIE coordinates may be (0.408, 0.510).

Referring to FIG. 16B, when the magnetic field B is 4 mT, a light-emission color close to red may appear. That is, red-EL emission by the second organic light-emitting element 200B may be stronger than green-EL emission by the first organic light-emitting element 200A. Consequently, an "orange" EL color close to red may appear. In this embodiment, CIE coordinates may be (0.450, 0.479). The total EL intensity in FIG. 16B may have a level similar to that in FIG. 16A.

As described with reference to FIGS. 16A and 16B, a light-emission color (visible color) of the organic light-emitting device may be changed depending on the magnetic field B applied to the organic light-emitting device. This principle and idea may be usefully applied to the fields of various display devices. In FIGS. 15, 16A, and 16B, an embodiment where green-EL and red-EL are respectively applied to the first and second organic light-emitting elements 200A and 200B has been described, but a combination of colors may be changed in various ways. For example, a combination of two colors selected from red, green, blue, and so on may be used.

Figure 17:
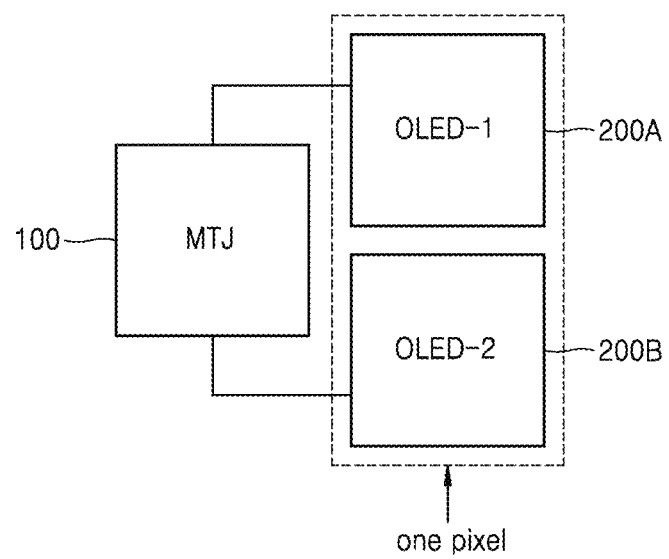
FIG. 17 is a plan view of a planar structure of the organic light-emitting device of FIG. 14, according to an embodiment.

FIG. 17 is a plan view of a planar structure of the organic light-emitting device of FIG. 14.

Referring to FIG. 17, the first organic light-emitting element 200A and the second organic light-emitting element 200B may be connected to the magnetoresistive element 100. The first and second organic light-emitting elements 200A and 200B may be adjacent to each other. The first and second organic light-emitting elements 200A and 200B may constitute one pixel. Light produced by the first organic light-emitting element 200A and light produced by the second organic light-emitting element 200B are mixed and emitted. The magnetoresistive element 100 and the first and second organic light-emitting elements 200A and 200B may be regarded as constituting one unit device portion. A plurality of unit device portions corresponding to the unit device portion may constitute an array structure.

Figure 18:
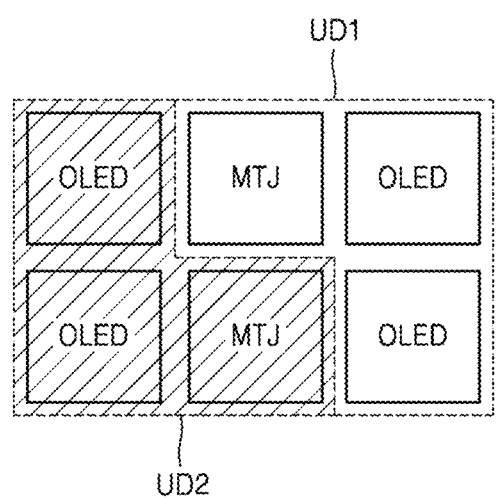
FIG. 18 is a plan view of a planar structure of an organic light-emitting device, according to another embodiment.

FIG. 18 is a plan view of a planar structure of an organic light-emitting device, according to another embodiment.

Referring to FIG. 18, two unit device portions UD1 and UD2 may be adjacent to each other. The first unit device portion UD1 may include one magnetoresistive element (MTJ) and two organic light-emitting elements (OLED). Similarly, the second unit device portion UD2 may include one magnetoresistive element (MTJ) and two organic light-emitting elements (OLED). The magnetoresistive element (MTJ) of the first unit device portion UD1 and the magnetoresistive element (MTJ) of the second unit device portion UD2 may be adjacent to each other, and two organic light-emitting elements (OLED) may be disposed on either side thereof. The unit device portions UD1 and UD2 may be repetitively disposed on a two-dimensional plane.

Figure 19:
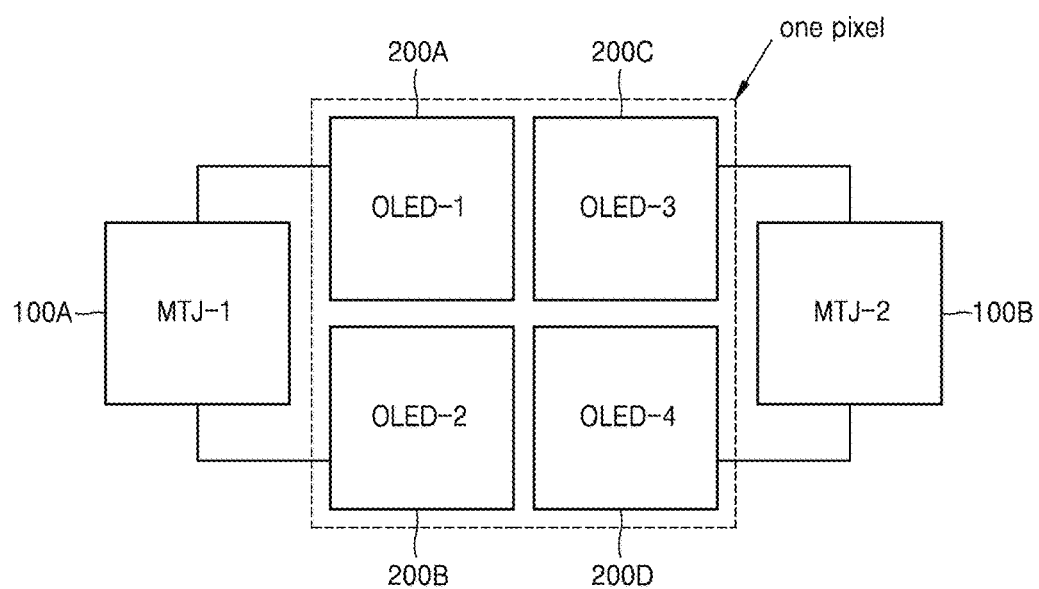
FIG. 19 is a plan view of a planar structure of an organic light-emitting device, according to another embodiment.

FIG. 19 is a plan view of a planar structure of an organic light-emitting device, according to another embodiment.

Referring to FIG. 19, the organic light-emitting device according to the present embodiment may include a first magnetoresistive element 100A and first and second organic light-emitting elements 200A and 200B connected to the first magnetoresistive element 100A. Also, the organic light-emitting device may include a second magnetoresistive element 100B and third and fourth organic light-emitting elements 200C and 200D connected to the second magnetoresistive element 100B. The first to fourth organic light-emitting elements 200A to 200D may be adjacent to one another. For example, the first to fourth organic light-emitting elements 200A to 200D may be disposed to form a rectangle (square) as a whole. In this embodiment, the first to fourth organic light-emitting elements 200A to 200D to constitute one pixel region. The first and second magnetoresistive elements 100A and 100B may be disposed around the pixel region. Although not illustrated, a plurality of unit device portions illustrated in FIG. 19 may be arranged.

Figure 20:
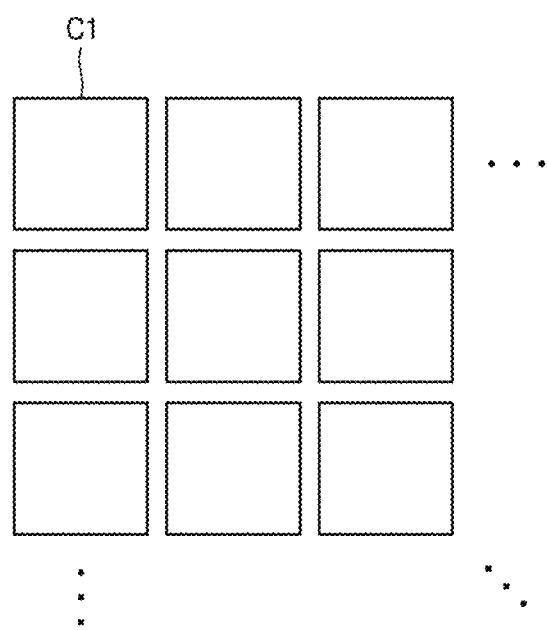
FIG. 20 is a planar view of an organic light-emitting device having an array structure, according to another embodiment.

FIG. 20 is a planar view of an organic light-emitting device having an array structure, according to another embodiment.

Referring to FIG. 20, a plurality of unit cells C1 may be disposed to have an array structure. Each of the unit cells C1 may include one magnetoresistive element and one organic light-emitting element connected to the magnetoresistive element, or may include one magnetoresistive element and a plurality of organic light-emitting elements (for example, two organic light-emitting elements) connected to the magnetoresistive element. Therefore, each of the unit cells C1 may correspond to any one of the devices of FIGS. 1, 7, 9, 13, 14, and 17, or may correspond to the unit device portion UD1 or UD2 of FIG. 18. Also, each of the unit cells C1 may correspond to the unit device portion of FIG. 19.

Various planar structures of the organic light-emitting device are illustrated in and described with reference to FIGS. 17 to 20, but are merely an example. The structure of the organic light-emitting device may be modified in various ways. Also, in some embodiments, the magnetoresistive element and the organic light-emitting element may be provided at different levels (heights) and may be disposed to be spaced apart from each other in a vertical direction. Also, when one unit device portion includes a plurality of organic light-emitting elements, the plurality of organic light-emitting elements (for example, first and second organic light-emitting elements) may be stacked in a vertical direction. In this embodiment, a size (width) of the unit device portion may be reduced, and light produced by the plurality of organic light-emitting elements (for example, first and second organic light-emitting elements) may be well mixed. Also, in some embodiments, three or more organic light-emitting elements may be connected to one magnetoresistive element. In addition, the structure of the organic light-emitting device may be modified in various ways.

According to various embodiments described above, light-emission characteristics of the organic light-emitting device may be tuned by adjusting the direction and intensity of the current $I_{MTJ}$ passing through the magnetoresistive element and the direction and intensity of the current $I_{OLED}$ passing through the organic light-emitting element. Also, light-emission characteristics of the organic light-emitting device may be tuned by using both intrinsic MEL generated in the organic light-emitting element by the magnetic field applied to the organic light-emitting element and extrinsic MEL generated in the organic light-emitting element by the magnetic field applied to the magnetoresistive element.

By a structural change, such as a change in a thickness of an organic material layer included in the organic light-emitting element, a ratio of $MEL_{in}$ to $MEL_{ex}$ in the organic light-emitting device (for example, HS-OLED) may be adjusted, and the overall MEL performance of the organic light-emitting device may be tuned (controlled).

MEL characteristics of the organic light-emitting device may be tuned by changing current configurations applied to the organic light-emitting device (for example, HS-OLED) by using a power source (e.g., a voltage source) and an additional current source.

Also, in regard to the organic light-emitting device (e.g., binary HS-OLED) in which a plurality of organic light-emitting elements (for example, two organic light-emitting elements) are connected to one magnetoresistive element, a light-emission color (visible color) may be adjusted by changing the magnetic field applied to the organic light-emitting device.

Therefore, according to the embodiments, if necessary, characteristics of the organic light-emitting device may be tuned (controlled) in a wide range and excellent MEL characteristics may be realized. These may be usefully applied to the fields of various light-emitting devices and display devices. The principles and ideas according to the embodiments may be usefully applied to implement multi-functional devices/apparatuses associated with the fields of optoelectronics and spintronics.

Although a lot of specific matters have been described above, these are not intended to limit the scope of the present disclosure and should be construed as examples of specific embodiments. For example, it will be understood by those of ordinary skill in the art that that various modifications may be made to the configurations of the organic light-emitting devices described with reference to FIGS. 1, 5, 7, 9, 13, 14, and 17 to 20. For example, the organic material layer of the organic light-emitting element may include organic materials other than the exciplex material. That is, various organic materials of the general OLED may be applied to the organic light-emitting elements according to the embodiments. Also, in the embodiment of FIG. 14, at least one of the first current source 400A and the second current source 400B may not be used. That is, characteristics of the organic light-emitting device may be controlled by using the power source 300 and the magnetic field B, without using at least one of the first and second current sources 400A and 400B. Also, according to various embodiments, the magnetic field may not be applied to the organic light-emitting element. That is, characteristics of the organic light-emitting device may be controlled by selectively applying the magnetic field only to the magnetoresistive element without applying the magnetic field to the organic light-emitting element. The magnetic field applied to the magnetoresistive element and the magnetic field applied to the organic light-emitting element may be separately controlled. Also, it will be understood by those of ordinary skill in the art that the methods of operating the organic light-emitting device, which have been described with reference to FIGS. 7, 9, and 14, may be modified in various ways. Therefore, the technical scope of the present disclosure should be determined by the appended claims rather than by the foregoing description.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. An organic light-emitting device comprising:
   a magnetoresistive element comprising a first magnetic layer, a second magnetic layer, and a separation layer disposed between the first magnetic layer and the second magnetic layer;
   an organic light-emitting element electrically connected to the magnetoresistive element, wherein the organic light-emitting element comprises a first electrode, a second electrode, and an organic light-emission layer disposed between the first electrode and the second electrode;
   a magnetic field applying unit configured to apply a magnetic field to the magnetoresistive element, and optionally, to the organic light-emitting element;
   a power source configured to supply a current between the magnetoresistive element and the organic light-emitting element; and
   a current source configured to apply a current between the first electrode and the second electrode of the organic light-emitting element,
   wherein light-emission characteristics of the organic light-emitting device are changed depending on a direction and intensity of a current passing through the magnetoresistive element due to the power source and a direction and intensity of a current passing through the organic light-emitting element due to the power source and the current source.

2. The organic light-emitting device of claim 1, wherein the magnetoresistive element is a magnetic tunneling junction element.

3. The organic light-emitting device of claim 1, wherein the organic light-emitting element is an exciplex-based organic light emitting diode element.

4. The organic light-emitting device of claim 1, wherein the organic light-emission layer comprises a delayed fluorescence material.

5. The organic light-emitting device of claim 1, wherein the organic light-emission layer comprises a host and a dopant, and
   an absolute value of a difference between a singlet ($S_1$) energy of the host and a triplet ($T_1$) energy of the host is about 0.3 electron volts or less.

6. The organic light-emitting device of claim 5, wherein the host comprises a hole transport compound and an electron transport compound.

7. The organic light-emitting device of claim 5, wherein the dopant is a fluorescent dopant, and
   the singlet ($S_1$) energy of the dopant is lower than the singlet ($S_1$) energy of the host.

8. The organic light-emitting device of claim 1, wherein the direction of the current passing through the magnetoresistive element and the direction of the current passing through the organic light-emitting element have an in-phase relationship.

9. The organic light-emitting device of claim 1, wherein the direction of the current passing through the magnetoresistive element and the direction of the current passing through the organic light-emitting element have an anti-phase relationship.

10. The organic light-emitting device of claim 1, wherein the organic light-emitting device is configured to present light-emission characteristics by using both intrinsic magneto-electroluminescence generated in the organic light-emitting element by a magnetic field applied to the organic light-emitting element and extrinsic magneto-electroluminescence generated in the organic light-emitting element by a magnetic field applied to the magnetoresistive element.

11. An organic light-emitting device comprising:
    a magnetoresistive element;
    a first organic light-emitting element electrically connected to the magnetoresistive element, wherein the first organic light-emitting element comprises a first organic light-emission layer;
    a second organic light-emitting element electrically connected to the magnetoresistive element, wherein the second organic light-emitting element comprises a second organic light-emission layer;
    a magnetic field applying unit configured to apply a magnetic field to the magnetoresistive element, and optionally, to the first and second organic light-emitting elements; and
    a power source configured to supply a current between the magnetoresistive element and the first and second organic light-emitting elements.

12. The organic light-emitting device of claim 11, further comprising at least one selected from a first current source configured to apply a current between both terminals of the first organic light-emitting element and a second current source configured to apply a current between both terminals of the second organic light-emitting element.

13. The organic light-emitting device of claim 12, wherein
    a direction of a current passing through one of the first and second organic light-emitting elements and a direction of a current passing through the magnetoresistive element have an in-phase relationship, and
    a direction of a current passing through the other of the first and second organic light-emitting elements and the direction of the current passing through the magnetoresistive element have an anti-phase relationship.

14. The organic light-emitting device of claim 11, wherein the organic light-emitting device is configured to change a light-emission color depending on intensity of the magnetic field applied to the organic light-emitting device by the magnetic field applying unit.

15. The organic light-emitting device of claim 11, wherein at least one selected from the first and second organic light-emitting elements is an exciplex-based OLED element.

16. The organic light-emitting device of claim 11, wherein
    at least one selected from the first and second organic light-emission layers comprises a host and a dopant, and
    an absolute value of a difference between a singlet ($S_1$) energy of the host and a triplet ($T_1$) energy of the host is about 0.3 electron volts or less.

17. The organic light-emitting device of claim 16, wherein the host comprises a hole transport compound and an electron transport compound.

18. The organic light-emitting device of claim 16, wherein the dopant is a fluorescent dopant, and
the singlet ($S_1$) energy of the dopant is lower than the singlet ($S_1$) energy of the host.

19. The organic light-emitting device of claim 16, wherein the first organic light-emission layer comprises a first dopant,
the second organic light-emission layer comprises a second dopant, which is different from the first dopant, and
the first organic light-emission layer and the second organic light-emission layer have different light-emission characteristics.

20. The organic light-emitting device of claim 11, wherein the magnetoresistive element is a magnetic tunneling junction element.

21. The organic light-emitting device of claim 11, wherein the magnetoresistive element and the first and second organic light-emitting elements constitute one unit device portion, and
a plurality of unit device portions corresponding to the unit device portion form an array.

22. An organic light-emitting device comprising:
a magnetoresistive element;
a first light-emitting element and a second organic light-emitting element, each of which is connected to the magnetoresistive element;
a magnetic field applying unit configured to apply a magnetic field to the magnetoresistive element, and optionally, to the first and second organic light-emitting elements;
a power source configured to apply electrical energy between the magnetoresistive element and the first and second organic light-emitting elements;
a first current source configured to apply a current to the first organic light-emitting element; and
a second current source configured to apply a current to the second organic light-emitting element,
wherein a light-emission color of the organic light-emitting device is changed depending on intensity of the magnetic field generated by the magnetic field applying unit.

* * * * *